(12) United States Patent
Kubo et al.

(10) Patent No.: US 7,007,506 B2
(45) Date of Patent: Mar. 7, 2006

(54) REFRIGERATION SYSTEM UTILIZING INCOMPLETE EVAPORATION OF REFRIGERANT IN EVAPORATOR

(75) Inventors: Hideo Kubo, Kawasaki (JP); Hisashi Kawashima, Kawasaki (JP); Jie Wei, Kawasaki (JP); Junichi Ishimine, Kawasaki (JP); Masahiro Suzuki, Kawasaki (JP); Yoshiaki Udagawa, Kawasaki (JP); Masahiro Mochizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/837,651

(22) Filed: May 4, 2004

(65) Prior Publication Data

US 2004/0200229 A1    Oct. 14, 2004

Related U.S. Application Data

(62) Division of application No. 09/749,622, filed on Dec. 28, 2000, now Pat. No. 6,748,755.

(30) Foreign Application Priority Data

Mar. 9, 2000    (JP) ............................... 2000-65790

(51) Int. Cl.
*F25B 39/02* (2006.01)
(52) U.S. Cl. ...................... 62/515; 62/259.2; 165/80.4; 165/80.5; 165/170
(58) Field of Classification Search ............... 62/259.2, 62/515, 516, 517, 518; 165/80.4, 80.5, 168, 165/170
See application file for complete search history.

(56) References Cited

U.S. PATENT DOCUMENTS

| | | | |
|---|---|---|---|
| 3,524,497 A * | 8/1970 | Chu et al. .................. | 165/80.4 |
| 4,170,998 A | 10/1979 | Sauder ........................ | 62/198 |
| 4,706,464 A | 11/1987 | Kreutmair .................... | 62/101 |
| 4,758,926 A | 7/1988 | Herrell et al. .............. | 361/385 |
| 4,843,831 A | 7/1989 | Yamada ....................... | 62/155 |
| 4,928,207 A | 5/1990 | Chrysler et al. ............ | 361/385 |
| 4,953,361 A | 9/1990 | Knoche et al. ................ | 62/79 |
| 5,021,924 A * | 6/1991 | Kieda et al. ................ | 361/699 |
| 5,177,667 A * | 1/1993 | Graham et al. ............. | 361/715 |
| 5,394,299 A * | 2/1995 | Chu et al. .................... | 361/705 |
| 5,604,978 A * | 2/1997 | Sherif et al. .................. | 29/840 |

(Continued)

FOREIGN PATENT DOCUMENTS

DE    4309240 A1 *    9/1994

(Continued)

*Primary Examiner*—Mohammad M. Ali
(74) *Attorney, Agent, or Firm*—Westerman, Hattori, Daniels & Adrian, LLP

(57) ABSTRACT

A refrigeration system allows the refrigerant to circulate through a closed circulation channel. A dry evaporator is incorporated in the circulation channel. The dry evaporator is designed to keep a quality smaller than 1.0 in evaporating the refrigerant. The quantity of heat transfer per unit area, namely, a heat transfer coefficient depends on the quality. The heat transfer coefficient remarkably drops when the quality of the refrigerant exceeds a predetermined threshold level before the quality actually reaches 1.0. The quality of the refrigerant kept below the predetermined threshold level during vaporization of the refrigerant in the dry evaporator allows a reliable establishment of a higher performance of cooling. On the other hand, if a refrigerant completely evaporates in a dry evaporator in a conventional manner, the heat transfer coefficient of the refrigerant remarkably drops after the quality of the refrigerant exceeds the predetermined threshold level. Accordingly, the conventional dry evaporator is forced to absorb heat at a lower heat transfer coefficient, as compared with the present dry evaporator.

8 Claims, 46 Drawing Sheets

U.S. PATENT DOCUMENTS

| | | | |
|---|---|---|---|
| 5,671,607 A | 9/1997 | Clemens et al. | 62/498 |
| 5,692,389 A | 12/1997 | Lord et al. | 62/222 |
| 5,774,334 A * | 6/1998 | Kawamura et al. | 361/699 |
| 5,877,476 A | 3/1999 | Yabuki et al. | 219/497 |
| 5,921,098 A | 7/1999 | Schmidt et al. | 62/202 |
| 6,038,875 A | 3/2000 | Haselden | 62/218 |
| 6,050,098 A | 4/2000 | Meyer et al. | 62/213 |
| 6,105,373 A * | 8/2000 | Watanabe et al. | 62/3.7 |
| 6,122,926 A * | 9/2000 | Kang et al. | 62/259.2 |
| 6,144,013 A * | 11/2000 | Chu et al. | 219/209 |
| 6,292,365 B1 * | 9/2001 | Ashiwake et al. | 361/700 |
| 6,849,241 B1 * | 2/2005 | Dauelsberg et al. | 423/328.2 |

FOREIGN PATENT DOCUMENTS

| | | |
|---|---|---|
| JP | 62-204341 | 12/1987 |
| JP | 3-3352 | 1/1991 |
| JP | 3-30458 | 2/1991 |
| JP | 3-41754 | 2/1991 |
| JP | 3-211797 | 9/1991 |
| JP | 4-320399 | 11/1992 |
| JP | 4-335970 A * | 11/1992 |
| JP | 5-26539 | 2/1993 |
| JP | 5-157404 | 6/1993 |
| JP | 5-164493 | 6/1993 |
| JP | 6-2980 | 1/1994 |
| JP | 6-4573 | 1/1994 |
| JP | 6-11201 | 1/1994 |
| JP | 6-16306 | 1/1994 |
| JP | 6-34992 | 2/1994 |
| JP | 6-18865 | 3/1994 |
| JP | 6-18868 | 3/1994 |
| JP | 6-119083 | 4/1994 |
| JP | 6-159821 | 6/1994 |
| JP | 6-202515 | 7/1994 |
| JP | 6-80756 | 10/1994 |
| JP | 6-327898 | 11/1994 |
| JP | 7-86471 | 3/1995 |
| JP | 7-201368 | 8/1995 |
| JP | 8-75276 | 3/1996 |
| JP | 2550770 | 8/1996 |
| JP | 2569284 | 10/1996 |
| JP | 9-58417 | 3/1997 |
| JP | 9-104998 | 4/1997 |
| JP | 9-280670 | 10/1997 |
| JP | 10-132423 | 5/1998 |
| JP | 10-153362 | 6/1998 |
| JP | 2822655 | 9/1998 |
| JP | 11-31768 | 2/1999 |
| JP | 11-101588 | 4/1999 |
| JP | 11-109880 | 4/1999 |
| JP | 2000156583 A * | 6/2000 |

* cited by examiner

REFRIGERATION SYSTEM UTILIZING INCOMPLETE EVAPORATION OF REFRIGERANT IN EVAPORATOR

This application is a divisional application of prior application Ser. No. 09/749,622, filed Dec. 28, 2000 now U.S. Pat. No. 6,748,755. This application is based upon and claims priority of Japanese Patent Application No. 2000-065790, filed on Mar. 9, 2000, the contents being incorporated herein by reference.

BACKGROUND OF THE INVENTION

1. Field of the Invention

The present invention relates to a refrigeration system of a closed cycle, including: a circulation channel through which a refrigerant circulates; and a dry evaporator incorporated in the circulation channel so as to contact a target heating object.

2. Description of the Prior Art

A refrigeration system of a closed cycle is well known to include a so-called dry evaporator. The refrigeration system is often employed in an interior air conditioner, for example. The evaporation of a refrigerant can be promoted within the dry evaporator under a low pressure, so that atmosphere around the dry evaporator can be cooled down. The refrigerant completely evaporates within the dry evaporator in such an interior air conditioner. The quality of the refrigerant is forced to reach 1.0 within the dry evaporator. Only the refrigerant of gas state is intended to be discharged from the dry evaporator.

A cooling system is in general incorporated in a large-sized computer such as a supercomputer and a main frame. The cooling system is designed to cool a semiconductor device module such as a multichip module (MCM). Acceleration of operating clocks and a higher density of electronic elements are predicted to induce the increased quantity of heat in the semiconductor device module. A higher performance of cooling is expected in the cooling system. It is believed that it becomes difficult for a conventional refrigeration system to reliably restrain an increase in the temperature of the semiconductor device module.

The performance of cooling in the dry evaporator may be considered based on the quantity of heat transfer per unit area, namely, a heat transfer coefficient. A higher heat transfer coefficient serves to reliably prevent the semiconductor device module from an excessive increase in the temperature, even when the semiconductor device module suffers from an extreme generation of heat. Heretofore, no specific proposal has been made to increase the quantity of heat transfer per unit area in the technical field of a refrigeration system of a closed cycle.

SUMMARY OF THE INVENTION

It is accordingly an object of the present invention to provide a refrigeration system capable of achieving a higher performance of cooling as compared with a prior art refrigeration system.

According to a first aspect of the present invention, there is provided a refrigeration system comprising: a circulation channel through which a refrigerant circulates; and a dry evaporator incorporated in the circulation channel and designed to keep a quality smaller than 1.0 in evaporating the refrigerant.

In general, the quantity of heat transfer per unit area, namely, a heat transfer coefficient depends on the quality. The heat transfer coefficient remarkably drops when the quality of the refrigerant exceeds a predetermined threshold level before the quality actually reaches 1.0. If the quality of the refrigerant is kept below the predetermined threshold level during vaporization of the refrigerant in the dry evaporator, the dry evaporator is allowed to reliably establish a higher performance of cooling. On the other hand, if a refrigerant completely evaporates in a dry evaporator in a conventional manner, the heat transfer coefficient of the refrigerant remarkably drops after the quality of the refrigerant exceeds the predetermined threshold level. Accordingly, the conventional dry evaporator is forced to absorb heat at a lower heat transfer coefficient, as compared with the dry evaporator of the first aspect. It should be noted that the threshold quality of a refrigerant employed can be set, at a level below 1.0, in an appropriate manner based on the kind of a refrigerant and the capability of cooling required in the dry evaporator.

According to a second aspect of the present invention, there is provided a refrigeration system comprising: a circulation channel through which a refrigerant circulates; a dry evaporator incorporated in the circulation channel and contacting a target heating object; and a subsidiary evaporator incorporated in the circulation channel downstream of the dry evaporator.

It is not necessary to completely evaporate the refrigerant in the dry evaporator of this type of the refrigeration system. The subsidiary evaporator may be employed to accomplish the complete vaporization of the refrigerant, so that the quality of 1.0 is established in the refrigerant discharged out of the subsidiary evaporator. If such a dry refrigerant is supplied to a compressor downstream of the subsidiary evaporator, the compressor can reliably be prevented from a compression of a liquid, which is harmful to the compressor. The dry evaporator contacting a target heating object is allowed to discharge the refrigerant of gas-liquid mixture state. Specifically, the quality of the refrigerant can be kept below a predetermined threshold level during vaporization of the refrigerant in the dry evaporator in the aforementioned manner, so that the dry evaporator is allowed to reliably establish a higher performance of cooling.

According to a third aspect of the present invention, there is provided a method of refrigeration comprising vaporizing a refrigerant within a dry evaporator incorporated in a circulation channel, through which the refrigerant circulates, so as to allow the refrigerant of gas-liquid mixture state to flow out of the dry evaporator.

The method of refrigeration allows the dry evaporator to discharge the refrigerant after incomplete vaporization of the refrigerant in the dry evaporator. The quality of the refrigerant can be kept below a predetermined threshold level during vaporization of the refrigerant in the dry evaporator in the aforementioned manner, so that the dry evaporator is allowed to reliably establish a higher performance of cooling.

The method of refrigeration may further comprise heating the refrigerant flowing out of the dry evaporator so as to completely evaporate the refrigerant of liquid state. If the refrigerant can completely be evaporated before it is introduced into a compressor incorporated in the circulation channel downstream of the dry evaporator, the compressor can reliably be prevented from a compression of a liquid. The compression of a liquid is harmful to the compressor, as conventionally known.

According to a fourth aspect of the present invention, there is provided a refrigeration system comprising: a circulation channel through which a refrigerant circulates; a dry evaporator incorporated in the circulation channel so as to contact a target heating object; a refrigerant outlet defined in the dry evaporator and designed to discharge the refrigerant of gas-liquid mixture state; and a gas-liquid separation filter incorporated in the-refrigerant outlet.

Even when the refrigerant is incompletely evaporated in the dry evaporator in this refrigeration system, the gas-liquid separation filter serves to reliably establish the quality of 1.0 for the refrigerant discharged from the dry evaporator. If such a dry refrigerant is introduced into a compressor incorporated in the circulation channel downstream of the dry evaporator, the compressor can reliably be prevented from a compression of a liquid, which is harmful to the compressor. The dry evaporator contacting a target heating object is allowed to discharge the refrigerant of gas-liquid mixture state. Specifically, the quality of the refrigerant can be kept below a predetermined threshold level during vaporization of the refrigerant in the dry evaporator in the aforementioned manner, so that the dry evaporator is allowed to reliably establish a higher performance of cooling.

The respective aforementioned refrigeration systems may include a dry evaporator, comprising: a casing defining a closed space; a refrigerant inlet defined in the casing so as to open at a wall surface; a refrigerant outlet defined in the casing so as to open at a wall surface; and a group of fins inwardly protruding from an inner surface of the casing so as to define a plurality of refrigerant passages extending in parallel from the refrigerant inlet toward the refrigerant outlet, for example. The group of fins serves to enlarge a heat transfer area or contact area between the casing and the refrigerant in the dry evaporator of this type. Heat can reliably be transferred from the casing to the refrigerant in an efficient manner.

In this case, the refrigerant passage preferably gets shorter at a position remoter from a straight line extending from the refrigerant inlet to the refrigerant outlet. In general, the refrigerant discharged out of the refrigerant inlet is supposed to flow along the straight line toward the refrigerant outlet, because the maximum pressure can be maintained along the shortest path. The remoter from the straight line the refrigerant passage is located at, the less pressurized force can be applied to the refrigerant passing through the refrigerant passage, as conventionally known. If the refrigerant passage gets shorter, the refrigerant passage may be released from a larger loss of the applied pressure. The shorter refrigerant passage at a position remoter from the straight line in the aforementioned manner is supposed to equally distribute the refrigerant to the respective refrigerant passage defined between the adjacent fins. The vaporization of the refrigerant can uniformly be achieved within the closed space.

In place of the aforementioned shorter refrigerant passage at a location remoter from the straight line, a refrigerant passage may get wider at a position remoter from the straight line. The wider refrigerant passage is supposed to reduce a larger loss of the applied pressure, so that the refrigerant is equally distributed to the respective refrigerant passage defined between the adjacent fins in the aforementioned manner. The vaporization of the refrigerant can uniformly be achieved within the closed space.

Alternatively, a dry evaporator may include: a casing defining a closed space between a top plate and a bottom plate and contacting a target heating object at the bottom plate; an intermediate plate disposed between the top and bottom plates within the closed space; a vaporization chamber defined between the intermediate and bottom plates; a refrigerant inlet defined in the top plate; an introduction chamber defined between the top and intermediate plates and extending from the refrigerant inlet toward the vaporization chamber; and a discharge chamber defined between the top and intermediate plates and extending from the vaporization chamber toward the refrigerant outlet.

In general, the refrigerant flowing out of the refrigerant outlet can be maintained at a temperature lower than that of the refrigerant flowing through the refrigerant inlet in the dry evaporator, since the negative pressure can be applied to the refrigerant outlet because of the operation of a compressor. The intermediate plate serves to establish a heat exchange between the refrigerants in the refrigerant inlet and outlet based on the difference in temperature. It is possible to restrain variation in the quality of the refrigerant headed toward the vaporization chamber from the refrigerant inlet. A still higher performance of cooling can be achieved in the dry evaporator.

In the above-described dry evaporator, a space between the top and intermediate plates may be set smaller than a space between the bottom and intermediate plates. The smaller space between the top and intermediate plates is expected to accelerate the loss of pressure for the refrigerant in the refrigerant introduction chamber, so that the refrigerant of the liquid state can be prevented from vaporization to the utmost before it is introduced into the vaporization chamber. A still higher performance of cooling can be achieved in the dry evaporator.

In the case where the space is reduced between the top and intermediate plates, it is preferable that the dry evaporator further comprises: an introduction opening defined by an edge of the intermediate plate and designed to connect the introduction and vaporization chambers to each other; and a dike extending along the edge of the intermediate plate so as to swell from the intermediate plate at its surface receiving a refrigerant within the introduction chamber. The dike serves to reliably accelerate the loss of pressure for the refrigerant in the introduction chamber. Moreover, the dike is also expected to establish a uniform flow of the refrigerant over the edge of the intermediate plate, namely, a uniform inflow of the refrigerant into the introduction opening.

The introduction chamber may be designed to by degree expand as it gets closer to the vaporization chamber. The introduction chamber of this type is expected to reliably establish a uniform inflow of the refrigerant into the vaporization chamber. The refrigerant uniformly spreads over the entire vaporization chamber. Additionally, the discharge chamber may be designed to by degree narrow as it gets closer to the refrigerant outlet. The discharge chamber of this type is expected to contribute to establishment of a uniform inflow of the refrigerant into the vaporization chamber.

A plurality of refrigerant passages may be defined within the introduction chamber so as to respectively extend from the refrigerant inlet toward the vaporization chamber. The refrigerant passages serve to uniformly distribute the refrigerant before it is introduced into the vaporization chamber.

An expanded passage is preferably connected to a downstream end of the refrigerant passage. The expanded passage serves to remarkably accelerate the loss of pressure for the refrigerant, so that the vaporization of the refrigerant flowing into the vaporization chamber can be promoted. A performance of cooling can still be improved in the dry evaporator.

Furthermore, the dry evaporator may comprise: a casing defining a closed space between a top plate and a bottom plate and contacting a target heating object at the bottom plate; an intermediate plate disposed between the top and bottom plates within the closed space and connected to an inner surface of the casing; a vaporization chamber defined between the intermediate and bottom plates; a discharge chamber defined between the top and intermediate plates; an inlet duct defining a refrigerant introduction passage penetrating through the discharge chamber so as to reach the vaporization chamber; and an outlet duct surrounding the inlet duct so as to define a refrigerant discharge passage extending from the discharge chamber. The dry evaporator serves to establish a heat exchange between the refrigerant flowing through the refrigerant introduction passage and the refrigerant flowing through the refrigerant discharge passage based on the heat transfer through the wall of the inlet duct. It is thus possible to restrain variation in the quality of the refrigerant headed toward the vaporization chamber from the refrigerant introduction passage to the utmost.

Alternatively, the refrigeration system may for example comprise: a circulation channel through which a refrigerant circulates; a dry evaporator incorporated in the circulation channel and contacting a target heating object at its bottom plate; a vaporization chamber defined within the dry evaporator for inducing a flow of the refrigerant along the bottom plate in a horizontal direction; and a flow controller incorporated in the circulation channel for discharging the refrigerant at a flow enough to establish a gas-liquid separation within the vaporization chamber. When the flow rate or current of the refrigerant introduced into the vaporization chamber is adjusted in this manner, the refrigerant of liquid state, namely, the refrigerant liquid is allowed to flow along the upper surface of the bottom plate within the vaporization chamber under the influence of the gravity. Accordingly, the refrigerant liquid is allowed to uniformly spread over the entire upper surface of the heat transfer or bottom plate. A higher performance of cooling can thus be achieved uniformly over the broader area of the bottom plate.

Furthermore, when the gas-liquid separation is intended within the vaporization chamber, the dry evaporator may comprise: a casing contacting a target heating object at a vertical heat transfer plate; a vaporization chamber defined adjacent the heat transfer plate within the casing; a refrigerant inlet opened at an inner surface of the vaporization chamber; a refrigerant outlet opened at the inner surface of the vaporization chamber at a location above the refrigerant inlet; and a plurality of fins integrally formed on the heat transfer plate within the vaporization chamber so as to define a plurality of refrigerant passages respectively extending in a vertical direction from the refrigerant inlet toward the refrigerant outlet.

A refrigerant discharged from the refrigerant inlet is allowed to flow upward within the vaporization chamber along the heat transfer plate and to finally reach the refrigerant outlet. If the gas-liquid separation is realized in the vaporization chamber, the refrigerant liquid falls on the bottom of the vaporization chamber under the influence of the gravity. The refrigerant liquid received on the bottom plate can uniformly be distributed into the respective refrigerant passages defined between the adjacent fins in the dry evaporator. When the dry evaporator of this type is employed in the refrigeration system of a closed cycle, a flow controller may be incorporated in the circulation channel for discharging the refrigerant at a flow enough to establish the gas-liquid separation within the vaporization chamber.

The dry evaporator of this type may further comprise: a bypass opening formed in the casing so as to open at a lowest position in the vaporization chamber; a duct connected to the casing so as to define a discharge channel extending from the refrigerant outlet; and a bypass channel connecting the bypass opening and the discharge channel to each other. For example, a lubricating agent such as oil may involuntarily be introduced into the vaporization chamber in the dry evaporator employed in the refrigeration system. The oil stored in the vaporization chamber can be led to the discharge channel or the circulation channel through the bypass channel under the influence of the difference in pressure between the refrigerant inlet and outlet. It is possible to prevent the oil, discharged from the compressor, from staying within the vaporization chamber.

Furthermore, when the gas-liquid separation is intended in the vaporization chamber, a dry evaporator still may comprise: a casing defining a vaporization chamber between a vertical heat transfer plate and a vertical back plate and contacting a target heating object at the heat transfer plate; a partition plate disposed between the heat transfer plate and the back plate so as to divide an upper portion of the vaporization chamber into an introduction space adjacent the heat transfer plate and a discharge space adjacent the back plate; a refrigerant inlet opened at the inner surface of the introduction space; and a refrigerant outlet opened at the inner surface of the discharge space. In this case, the depth of the lower portion of the vaporization chamber is set larger than the space or distance measured between the heat transfer plate and the partition plate. Here, the depth should be measured from the lower edge of the partition plate in the vertical direction. The dry evaporator of this type enables a jagged increase in the sectional area of the vaporization chamber when the refrigerant flows around the lower edge of the partition plate. The remarkable enlargement of the sectional area promotes the gas-liquid separation of the refrigerant in the vaporization chamber. Here, the sectional area of the vaporization chamber is measured based on a profile in a plane perpendicular to the direction of the flow or current of the refrigerant. When the dry evaporator of this type is employed in the refrigeration system of a closed cycle, a flow controller may be incorporated in the circulation channel for discharging the refrigerant at a flow enough to establish the gas-liquid separation within the vaporization chamber.

Otherwise, the dry evaporator may comprise a casing contacting a target heating object at a vertical heat transfer plate; and a micro channel formed on the heat transfer plate within the casing so as to extend in a vertical direction, said micro channel having a width enough to realize a capillary action of a refrigerant.

The dry evaporator of this kind allows the refrigerant liquid to ascend along the micro channel with the assistance of the capillary action overcoming the gravity. Accordingly, the heat transfer plate is allowed to hold the refrigerant liquid over a broader area irrespective of the level of the refrigerant liquid at the bottom of the casing. The refrigerant liquid is forced to vaporize in an efficient manner by heat transmitted to the heat transfer plate. The vaporization of the refrigerant liquid can thus be accelerated. When the dry evaporator of this type is employed in a refrigeration system of a closed cycle, a flow controller may be incorporated in the circulation channel for discharging the refrigerant at a flow enough to establish the gas-liquid separation within the vaporization chamber.

Furthermore, a dry evaporator may include: a casing contacting a target heating object at a heat transfer plate; a first wall surface defined on the heat transfer plate within the casing so as to extend from a datum line; and a second wall surface connected to the first wall surface at the datum line and opposed to the first wall surface. The space between the first and second wall surfaces gets larger as the second wall surface is distanced apart from the datum line. A micro channel is defined between the first and second wall surfaces so as to establish a capillary action of a refrigerant.

The dry evaporator enables generation of a larger surface tension at the surface of the refrigerant liquid facing the datum line when the refrigerant liquid is introduced between the first and second wall surfaces. The refrigerant liquid is sucked toward the datum line between the first and second wall surfaces with the assistance of the surface tension. A larger quantity of the refrigerant liquid can thus be held between the first and second wall surfaces. The vaporization of the refrigerant liquid can be accelerated.

An expanded groove may be defined at least on any of the first and second wall surfaces so as to extend along the datum line within the micro channel. The expanded groove serves to reliably hold a still larger quantity of the refrigerant liquid introduced between the first and second wall surfaces. The vaporization of the refrigerant liquid can still further be accelerated.

A dry evaporator may include: a casing contacting a target heating object at a heat transfer plate; a first erosion surface defined on the heat transfer plate within the casing; and a second erosion surface opposed to the first erosion surface so as to define a micro channel between the first and second erosion surfaces. A fine asperity can be established on the first and second erosion surfaces. Such a fine asperity serves to achieve an enlarged heat transfer area over the heat transfer plate and an improved wetness to the refrigerant liquid. The vaporization of the refrigerant liquid can still further be accelerated.

Alternatively, a dry evaporator may include: a casing contacting a target heating object at a heat transfer plate; a first wall surface defined on the heat transfer plate within the casing; a second wall surface opposed to the first wall surface so as to define a micro channel between the first and second wall surfaces; and heat conductive fine particles adhered to the first and second wall surfaces, respectively. The heat conductive fine particles serve to achieve an enlarged heat transfer area over the heat transfer plate and an improved wetness to the refrigerant liquid. The vaporization of the refrigerant liquid can thus be accelerated.

Furthermore, a refrigeration system may comprise: a circulation channel through which a refrigerant circulates; a compressor incorporated in the circulation channel and designed to discharge the refrigerant of gas state at a high pressure; a dry evaporator incorporated in the circulation channel so as to contact a target heating object at a heat transfer plate; a jet nozzle inserting a tip end into an interior of the dry evaporator; and a bypass channel diverging from the circulation channel downstream of the compressor so as to supply the refrigerant of gas state toward the jet nozzle.

During the operation of the compressor, the refrigerant of gas state, namely, the refrigerant gas, discharged from the compressor at a high pressure, is supplied to the jet nozzle through the bypass channel. The supplied refrigerant gas can be discharged out of the jet nozzle toward the refrigerant of liquid state at the bottom of the dry evaporator, for example. Drops of the refrigerant liquid may splash upward from the surface of the refrigerant liquid at the bottom of the dry evaporator. If the splashed refrigerant liquid is allowed to stick to the heat transfer plate, the refrigerant liquid can be held on the heat transfer plate over a broader area. The vaporization of the refrigerant liquid can be promoted in the dry evaporator. Simultaneously, the discharged refrigerant gas may also lead to stir of the refrigerant liquid at the bottom of the dry evaporator. The stir of the refrigerant liquid may contribute to a uniform distribution of the refrigerant liquid within the dry evaporator.

A flow controller, such as an electronic controlled valve, may be incorporated in the bypass channel. If the flow controller is allowed to control the flow or current of the refrigerant gas passing through the bypass channel, the jet amount of the refrigerant gas introduced into the dry evaporator at a high pressure can properly be adjusted. The vapor pressure within the dry evaporator. If the vapor pressure can properly be controlled in this manner, the boiling point of the refrigerant can properly be adjusted in the dry evaporator.

The aforementioned refrigeration system may be employed to cool a semiconductor device module such as a multichip module (MCM) in a large-sized computer such as a supercomputer, a main frame, and the like. In employment of the refrigeration system, a semiconductor device module may be prepared to include: a printed circuit board; a semiconductor element mounted on the printed circuit board; a dry evaporator contacting the semiconductor element and applicable to a refrigeration system of a closed cycle; and a heat insulator member containing the dry evaporator so as to fix the dry evaporator to the printed circuit board.

If the dry evaporator can be fixed to the printed circuit board in this manner, the semiconductor device module and the dry evaporator can be handled as a unit. The operability can be improved in replacement or maintenance of the semiconductor device module. The heat insulator member serves to prevent condensation and/or frost over the surface of the dry evaporator.

The heat insulator member may be divided into a first half piece containing the printed circuit board, and a second half piece containing the dry evaporator and detachably coupled to the first half piece. Detachment of the second half piece from the first half piece enables exposure of the surface of the printed circuit board. The semiconductor element or chip can be maintained or replaced on the printed circuit board without disturbance from the heat insulator member. The operability in replacement and/or maintenance of the semiconductor device module can further be improved.

A heater may be incorporated in the heat insulator member in the aforementioned semiconductor device module. The heater is designed to heat the heat insulator member. Incorporation of the heater in this manner thus enables reduction in the thickness or volume of the heat insulator member, when the prevention of condensation and/or frost is intended on the surface of the dry evaporator. The semiconductor device module can be made compact. The compact semiconductor device module may contribute to a higher density in arrangement of the semiconductor device module.

A heat conductive member may be interposed between the heater and the dry evaporator. The heat conductive member is preferably designed to have a property allowing heat to conduct at a first specific thermal conductivity in a vertical direction oriented from the heater to the dry evaporator and to conduct at a second specific thermal conductivity larger than the first specific thermal conductivity in a plane perpendicular to the vertical direction. When heat from the heater is transferred to the heat conductive member of the type, the heat conductive member serves to spread the heat from the heater over a broader area along the plane perpendicular to the vertical direction within the heat insulator member. Irrespective of the size of the heater, the heat insulator member can be heated over the broader area. On the other hand, the heat from the heater hardly reaches the dry evaporator, so that the performance of cooling in the dry evaporator is prevented from unnecessarily being consumed.

In addition, a semiconductor device module may comprise: a printed circuit board; a semiconductor element mounted on the upper side of the printed circuit board; a dry evaporator contacting the semiconductor element and applicable to a refrigeration system of a closed cycle; an input/output pin standing on the lower side of the printed circuit board; and a heater attached to the lower side of the printed circuit board.

In general, the input/output pin is made from a metallic material. The metallic input/output pin is easily cooled down under the influence of performance of cooling by the dry evaporator. If the input/output pin is excessively cooled down, the surface of the input/output pin tends to suffer from condensation and/or frost. Attachment of the heater to the lower side of the printed circuit board enables transmission of heat to the input/output pin, so that the input/output pin can be prevented from generation of condensation and/or frost on its surface.

Furthermore, a semiconductor device module may comprise: a printed circuit board; a semiconductor element mounted on the upper side of the printed circuit board; a dry evaporator contacting the semiconductor element and applicable to a refrigeration system of a closed cycle; an input/output pin standing on the lower side of the printed circuit board; and a heat insulator member containing the input/output pin. The heat insulator member contributes to prevention of condensation and/or frost on the surface of the input/output pin.

Furthermore, a semiconductor device module may comprise: a printed circuit board; a semiconductor element mounted on the printed circuit board; a heat transfer plate contacting the semiconductor element; a dry evaporator contacting the heat transfer plate and applicable to a refrigeration system of a closed cycle; a bolt for fixation received in a through bore defined in the heat transfer plate; and a low heat conductive member interposed between the heat transfer plate and the bolt. With this arrangement, when the dry evaporator is attached to the printed circuit board, it is possible to restrain a heat transfer between the dry evaporator and the printed circuit board. Accordingly, the printed circuit board can be prevented from an excessive cooling under the influence of the dry evaporator.

Furthermore, a semiconductor device module may comprise: a printed circuit board; a semiconductor element mounted on the printed circuit board; a dry evaporator contacting the semiconductor element and applicable to a refrigeration system of a closed cycle; and a heater contacting the dry evaporator.

In general, when the semiconductor device module is to be replaced or maintained, the semiconductor device module should return to the room temperature. If the semiconductor device module is exposed to the normal atmosphere before it has returned to the room temperature, condensation and/or frost may be induced on the surface of the semiconductor device module. Even when the semiconductor device module has been cooled down under the influence of the refrigeration system, the semiconductor device module can rapidly be heated by receiving heat from the heater. Since the rise in temperature can be accelerated by the heater as compared with the natural radiation of heat, the working time of replacement or maintenance can remarkably be shortened. The heater may be attached to the heat transfer plate disposed between the dry evaporator and the printed circuit board.

When the heater of the aforementioned type is employed, a thermal sensor is preferably mounted on the printed circuit board. The thermal sensor can be utilized to prevent an excessive rise in temperature by the heater, for example. Based on the temperature detected by the thermal sensor, the operation of the heater can reliably be terminated before the printed circuit board actually suffers from an excessive rise in temperature.

In general, any of the aforementioned semiconductor device modules may be received on a large-sized printed circuit board. A connector may be mounted on the large-sized printed circuit board so as to hold the semiconductor device module on the large-sized printed circuit board. When the prevention of condensation and/or frost on the surface of the input/output pin is intended in the aforementioned manner, such a connector for a semiconductor device module may comprise: an electric conductive member receiving an input/output pin protruding from the semiconductor device module; and a heater disposed to surround the electric conductive member.

When the aforementioned refrigeration system is intentionally employed to cool the semiconductor device module, a semiconductor device enclosure unit may be prepared to include a box-shaped enclosure designed to contain a dry evaporator contacting a semiconductor element on a printed circuit board; and a dehumidifier designed to release moisture from a closed space defined in the box-shaped enclosure to an open space outside the box-shaped enclosure.

When the dehumidifier serves to release moisture toward the open space outside the semiconductor device enclosure unit, a dry atmosphere can be established within the box-shaped enclosure. The dry atmosphere serves to lower the dew point of the vapor included in the air. Accordingly, condensation and/or frost can reliably be prevented on the surfaces of the printed circuit board, the semiconductor element and the dry evaporator within the box-shaped enclosure.

In this case, a heater may be attached to the inner surface of the box-shaped enclosure. The heater may be utilized when the semiconductor element is to be replaced or maintained. The heat from the heater serves to heat the atmosphere within the box-shaped enclosure. When the atmosphere in the box-shaped enclosure is heated, a rise in temperature can be established on the inner surface of the box-shaped enclosure and the surface of the printed circuit board. If the inner surface of the box-shaped enclosure and the surface of the printed circuit board are exposed to an exterior atmosphere of a room temperature after the atmosphere has been heated within the box-shaped enclosure in the aforementioned manner, it is possible to prevent condensation on the inner surface of the box-shaped enclosure and the surface of the printed circuit board. Since the rise in temperature can be accelerated as compared with the natural radiation of heat, the working time of replacement or maintenance can remarkably be shortened.

Otherwise, a semiconductor device enclosure unit may comprise: a first box-shaped enclosure designed to contain a dry evaporator contacting a semiconductor element on a printed circuit board; a second box-shaped enclosure designed to contain the first box-shaped enclosure; a first dehumidifier designed to release moisture from a closed space defined in the first box-shaped enclosure to an outside; and a second dehumidifier designed to release moisture from a closed space within the second box-shaped enclosure to an open space outside the second box-shaped enclosure. The semiconductor device enclosure unit of this type serves to further efficiently release moisture in the vicinity of the printed circuit board outward to the open space. Even when the atmosphere in the first box-shaped enclosure reaches a cryogenic temperature, it is still possible to reliably prevent condensation and/or frost within the first box-shaped enclosure. In this case, the aforementioned heater may be attached at least to the inner surface of the first box-shaped enclosure.

Furthermore, a semiconductor-device module may comprise: a printed circuit board; a semiconductor element mounted on the printed circuit board; a casing attached to the printed circuit board and designed to define a refrigerant passage; and a cooling element extending across the refrigerant passage and designed to protrude its tip end out of the casing. The tip end is allowed to contact the semiconductor element. In this semiconductor device module, the cooling element serves to transfer heat, generated at the semiconductor element, to the refrigerant in an efficient manner.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
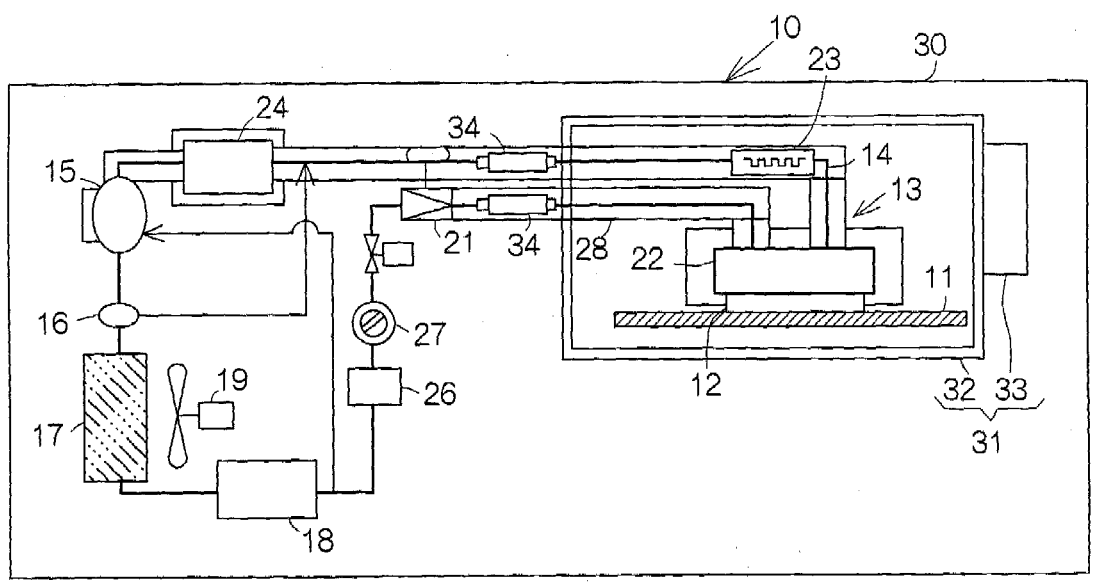
FIG. 1 schematically illustrates the structure of a large-sized computer incorporating a refrigeration system of a closed cycle according to a first embodiment of the present invention.

FIG. 1 schematically illustrates the structure of a large-sized computer 10, such as a main frame or the like. The large-sized computer 10 includes one or more large-sized printed circuit boards 11, for example. One or more semiconductor device modules 12 such as MCMs (multichip modules) are mounted on the surface of the printed circuit board 11. One or more memory chips or modules, not shown, likewise mounted on the surface of the printed circuit board 11, may electrically be connected to the semiconductor device module 12. As conventionally known, the semiconductor device module 12 includes a small-sized printed circuit board and one or more semiconductor chips or elements mounted on the small-sized printed circuit board. The semiconductor element can be represented by an LSI (large-scale integrated circuit) chip and the like, for example. The individual semiconductor device module 12 may function as a single CPU (central processing unit). Otherwise, any combination of the semiconductor device modules 12 can be utilized to establish a single CPU.

A refrigeration system 13 of a closed cycle according to a first embodiment of the present invention is connected or coupled to the large-sized printed circuit board 11. The refrigeration system 13 is provided with a circulation channel 14 through which a refrigerant of a low boiling point, such as an HFC (R-404A), is allowed to circulate. A compressor 15 is incorporated in the circulation channel 14 for discharging the refrigerant of gas state, namely, a refrigerant gas under a high pressure such as 15 atm, for example. An oil separator 16 is connected to the discharge port of the compressor 15 downstream of the compressor 15. The oil separator 16 is designed to separate the oil included in the refrigerant gas discharged out of the compressor 15. The separated oil is returned to the compressor 15. As conventionally known, the oil serves as a lubricating agent within the compressor 15.

A condenser 17 is incorporated in the circulation channel 14 downstream of the oil separator 16. The condenser 17 is designed to allow the refrigerant gas, supplied from the compressor 15, to condense into the refrigerant of liquid state, namely, a refrigerant liquid. The refrigerant liquid is supplied to a receiver 18 incorporated in the circulation channel 14 downstream of the condenser 17. A ventilation fan 19 or the like may be employed to promote heat radiation from the condenser 17, for example.

An expansion valve 21 as a flow controller is incorporated in the circulation channel 14 downstream of the receiver 18. The expansion valve 21 is designed to discharge the refrigerant liquid under a low pressure. Rapid reduction in pressure induces reduction in the temperature of the refrigerant liquid. The resulting low pressure also leads to a low boiling or vaporization temperature of the refrigerant liquid.

A dry evaporator 22 is incorporated in the circulation channel 14 downstream of the expansion valve 21. The dry evaporator 22 is designed to contact a target heating object, namely, the semiconductor element on the semiconductor device module 12. A quality controller or subsidiary evaporator 23 is incorporated in the circulation channel 14 downstream of the dry evaporator 22. The function of the dry and subsidiary evaporators 22, 23 will be described later in detail. An accumulator 24 is connected to the subsidiary evaporator 23 downstream of the subsidiary evaporator 23. As conventionally known, the accumulator 24 is designed to convert the refrigerant of liquid state, namely, the refrigerant liquid, erroneously discharged out of the subsidiary evaporator 23 into the refrigerant of gas state, namely, the refrigerant gas. In this manner, the compressor 15 is only allowed to receive the refrigerant gas. The accumulator 24 thus serves to prevent the compression of liquid in the compressor 15.

In addition, the circulation channel 14 may incorporate a strainer 26 and an observation window 27. The strainer 26 is designed to remove moisture, dust, and the like, from the refrigerant discharged out of the receiver 18. An operator may utilize the observation window 27 so as to visually observe the condition of the refrigerant circulating in the circulation channel 14. Optionally, a check valve, not shown, may be incorporated in the circulation channel 14.

A thermal insulator 28 is wrapped around the circulation channel 14 extending from the expansion valve 21 to the compressor 15. The thermal insulator 28 is designed to prevent a ductwork for the circulation channel 14 and the outer surface of the dry evaporator 22 from suffering from condensation and/or frost.

A semiconductor device enclosure unit 31 is disposed within a housing 30 of the large-sized computer 10. The enclosure unit 31 is designed to define a dry space, namely, a low dew point chamber inside. The enclosure unit 31 may include a box-shaped enclosure 32 airtightly containing the large-sized printed circuit board 11 and the dry evaporator 22 closely contacting the semiconductor element on the large-sized printed circuit board 11, and a dehumidifier 33 attached to the box-shaped enclosure 32. A detailed description will be made later on the dehumidifier 33. The dehumidifier 33 serves to establish the dry space within the box-shaped enclosure 32.

As is apparent from FIG. 1, couplers 34 may be employed to connect the section of the circulation channel 14 within the semiconductor device enclosure unit 31 and the section of the circulation channel 14 outside the enclosure unit 31. The couplers 34 serve to allow separation between the sections within and outside the enclosure unit 31 in the circulation channel 14. It is preferable that a self-sealing mechanism such as a mechanical seal, for example, is assembled within the respective couplers 34. The self-sealing mechanism serves to prevent air and/or other undesirable substances from entering the circulation channel 14 even when the connections of the couplers 34 have been released.

Here, description will be made on the operation of the refrigeration system 13. During the operation of the refrigeration system 13, the compressor 15 serves to induce the circulation of a refrigerant through the circulation channel 14. The refrigerant is maintained at a higher pressure in the circulation channel 14 starting from the compressor 15 so as to reach the expansion valve 21. In this situation, the refrigerant may have the vaporization temperature or boiling point at approximately 40 degrees Celsius, for example. On the other hand, the refrigerant is maintained at a lower pressure in the circulation channel 14 starting from the expansion valve 21 so as to return to the compressor 15. If the refrigerant is maintained at a lower pressure, the vaporization temperature of the refrigerant can be lowered to the level at approximately −20 degrees Celsius, for example. Accordingly, the vaporization of the refrigerant can be promoted at a lower pressure. Environmental or surrounding heat energy can be absorbed into the refrigerant in response to the vaporization.

The dry evaporator 22 receives the refrigerant at a quality of a range between 0.3–0.5. At the dry evaporator 22, the refrigerant is promoted to evaporate by receiving a heat energy from the semiconductor element. In this case, the quality of the refrigerant within the dry evaporator 22 is maintained at a level below 1.0, for example, at a level below approximately 0.85. In other words, the dry evaporator 22 is designed to discharge the refrigerant of the quality smaller than 0.85, namely, of gas-liquid mixture state. The quality established in the dry evaporator 22 can be adjusted based on the amount of heat generation at the target heating object or semiconductor element and the flow or current of the refrigerant introduced into the dry evaporator 22, as conventionally known. The flow or current of the refrigerant can be controlled by the discharge amount of the compressor 15 and the opening degree of the expansion valve 21.

The subsidiary evaporator 23 applies heat to the refrigerant of gas-liquid mixture state discharged out of the dry evaporator 22. The heat may be generated by the operation of a heater, for example. The applied heat serves to cause the refrigerant of liquid state, namely, the remaining refrigerant liquid to evaporate. After the quality of 1.0 has been achieved, the refrigerant of gas state is discharged out of the subsidiary evaporator 23. The quantity of the applied heat energy in the subsidiary evaporator 23 can be determined based on the quality and the flow or current of the refrigerant introduced into the subsidiary evaporator 23, for example.

Figure 2:
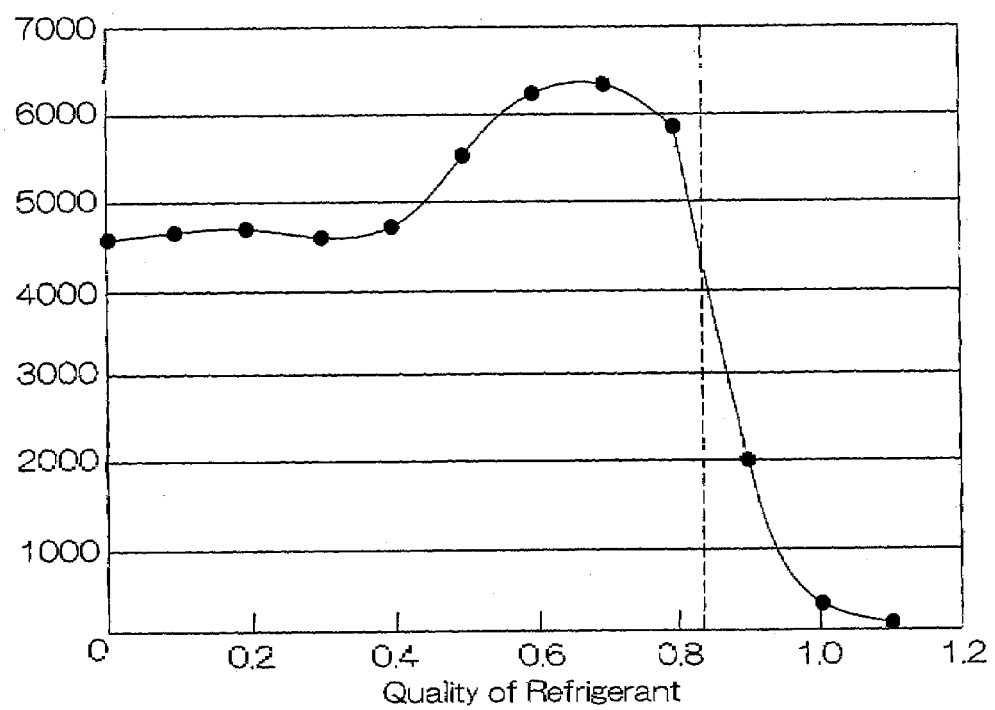
FIG. 2 is a graph illustrating a heat transfer coefficient of a refrigerant.

As is apparent from FIG. 2, the heat transfer coefficient, or the quantity of the heat transfer per unit area, of the refrigerant depends on the quality. In this specific example, the heat transfer coefficient of the refrigerant remarkably drops when the quality of the refrigerant exceeds 0.85. Accordingly, if the quality of the refrigerant is maintained at a level below 0.85 in the dry evaporator 22 directly contacting the target heating object, the dry evaporator 22 is allowed to accomplish a higher performance of cooling. Even when the refrigerant of gas-liquid state is discharged out of the dry evaporator 22 in the aforementioned manner, the subsidiary evaporator 23 serves to fully evaporate the remaining refrigerant liquid, so that the compressor 15 can reliably be prevented from a compression of a refrigerant liquid without increasing a load to the accumulator 24. If a refrigerant liquid completely evaporates in a dry evaporator in a conventional manner, the heat transfer coefficient of the refrigerant remarkably drops after the quality of the refrigerant exceeds 0.85. Specifically, the conventional dry evaporator is forced to absorb the heat from the target heating object or semiconductor element at a lower heat transfer coefficient. As compared with the dry evaporator 22 of the invention, only a lower performance of cooling can be obtained in the conventional dry evaporator. It should be noted that the quality of the refrigerant, other than 0.85, can be set in an appropriate manner in the aforementioned dry evaporator 22 of the invention based on the kind of a refrigerant and the capability of cooling required in the dry evaporator 22.

Figure 3:
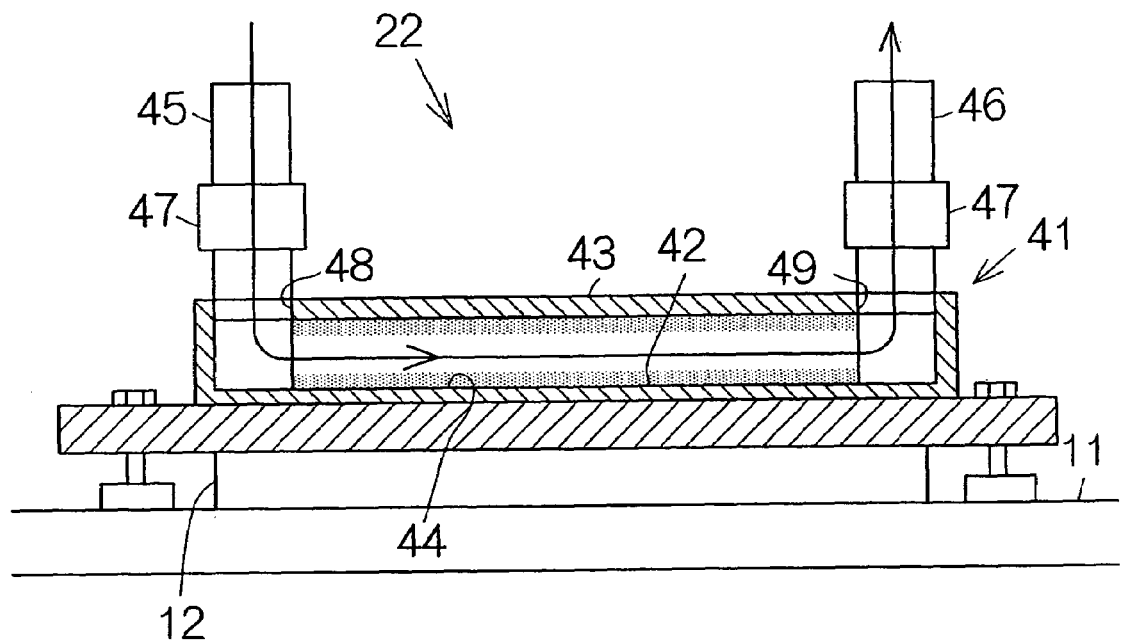
FIG. 3 is an enlarged sectional view illustrating a dry evaporator according to a specific example.

Next, a detailed description will be made on the structure of the dry evaporator 22. As shown in FIG. 3, for example, the dry evaporator 22 includes a casing 41. The casing 41 comprises a heat transfer or bottom plate 42 extending in a horizontal direction, and a top plate 43 extending in parallel with the bottom plate 42. The bottom plate 42 is designed to contact the semiconductor element on the semiconductor device module 12. A closed space or vaporization chamber 44 in the form of a rectangular parallelepiped is defined between the top and bottom plates 43, 42, for example. The casing 41 may be made from a high heat conductive material such as a copper material.

The top plate 43 is designed to receive the connection of an inlet duct 45, extending from the top plate 43 in a vertical direction so as to define a refrigerant introduction passage inside, and the connection of an outlet duct 46, likewise extending from the top plate 43 in a vertical direction so as to define a refrigerant discharge passage inside. The inlet and outlet ducts 45, 46 are coupled to the top plate 43 through couplers 47, respectively. A refrigerant inlet 48 is defined in the top plate 43 of the casing 41 so as to open the refrigerant introduction passage at the inner surface of the vaporization chamber 44 or the lower surface of the top plate 43. Likewise, a refrigerant outlet 49 is defined in the top plate 43 of the casing 41 so as to open the refrigerant discharge passage at the inner surface of the vaporization chamber 44 or lower surface of the top plate 43.

Figure 4:
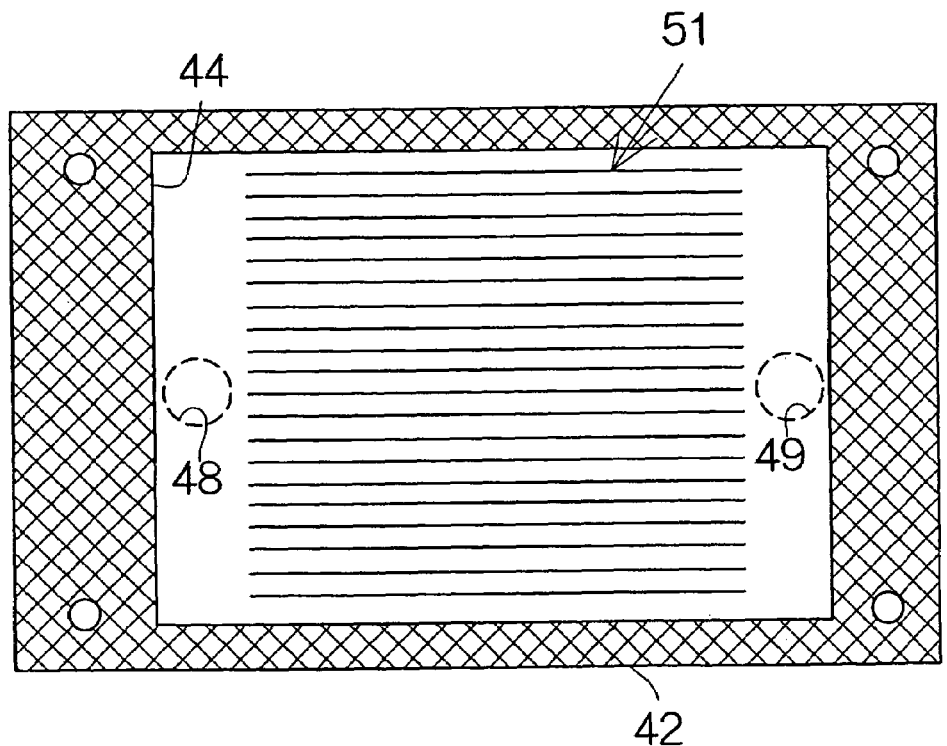
FIG. 4 is a plan view of a bottom plate for illustrating the structure of fins within a vaporization chamber.

As is apparent from FIG. 4, a group of fins 51 is formed on the bottom plate 42 so as to protrude from the inner surface of the vaporization chamber 44 or an upper surface of the bottom plate 42. The group of fins 51 is designed to define a plurality of refrigerant passages extending in parallel from the refrigerant inlet 48 toward the refrigerant outlet 49, respectively. The respective fins 51 may be formed to stand up from the upper surface of the bottom plate 42 so as to reach the lower surface of the top plate 43 at the tip ends, respectively. The group of fins 51 serves to enlarge a heat transfer area or direct contact area between the heat transfer or bottom plate 42 and the refrigerant introduced in the vaporization chamber 44, so that heat generated at the semiconductor element on the semiconductor device module 12 can efficiently be transferred to the refrigerant.

Figure 5:
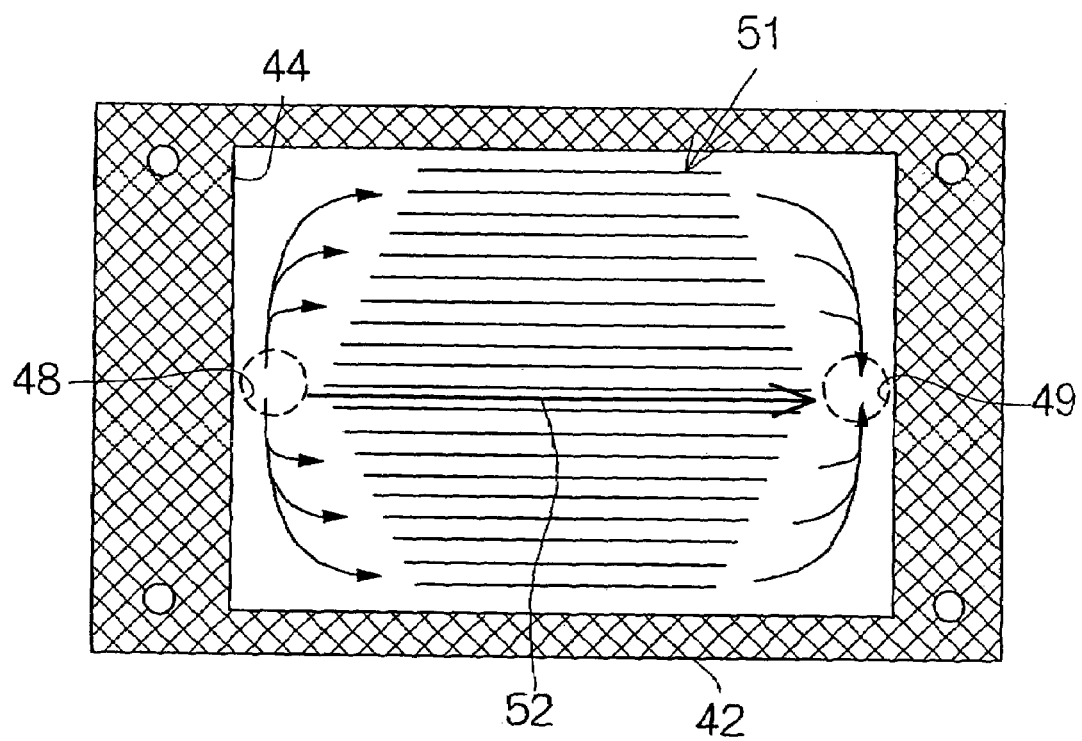
FIG. 5 is a plan view of a bottom plate for illustrating the structure of fins according to another specific example.

As shown in FIG. 5, assume that a straight line 52 is defined in the vaporization chamber 44 so as to extend from the refrigerant inlet 48 to the refrigerant outlet 49, for example. In this case, it is preferable that the individual fin 51 gets shorter at a position remoter from the straight line 52. The fins 51 in this manner serve to provide a shorter refrigerant passage at a position remoter from the straight line 52.

The refrigerant circulating through the circulation channel 14 is allowed to pass through the vaporization chamber 44 based on the pressurized or urging force applied from the compressor 15. The refrigerant discharged out of the refrigerant inlet 48 is supposed to flow along the straight line 52 toward the refrigerant outlet 49, because the maximum pressure can be maintained along the shortest path. The remoter from the straight line 52 the refrigerant passage is located at, the less pressurized force can be applied to the refrigerant passing through the refrigerant passage. If the refrigerant passage gets shorter, the refrigerant passage may be released from a larger loss of the applied pressure. The shorter refrigerant passage at a position remoter from the straight line 52 in the aforementioned manner is supposed to equally distribute the refrigerant to the respective refrigerant passages defined between the adjacent fins 51. A higher performance of cooling for the semiconductor element on the semiconductor device module 12 can uniformly be established in the overall vaporization chamber 44.

Figure 6:
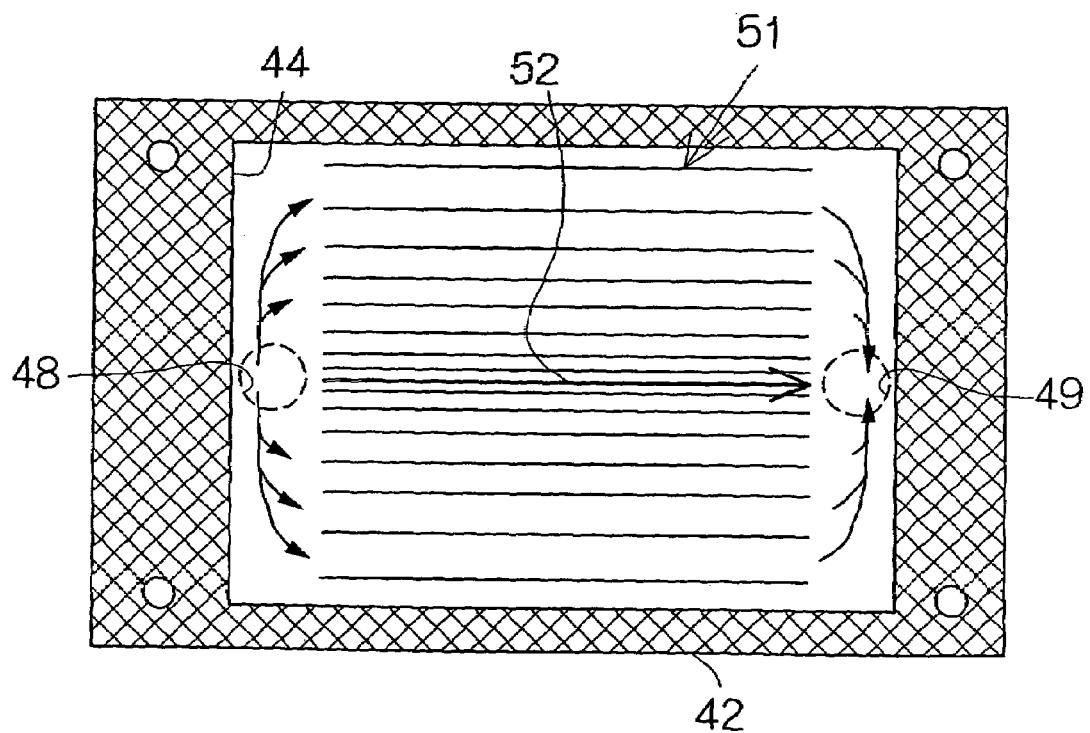
FIG. 6 is a plan view of a bottom plate for illustrating the structure of fins according to a further specific example.

In place of the aforementioned shorter refrigerant passage at a location remoter from the straight line 52, a refrigerant passage may get wider at a position remoter from the straight line 52, as shown in FIG. 6, for example. The wider refrigerant passage is supposed to reduce a larger loss of the applied pressure, so that the refrigerant is equally distributed to the respective refrigerant passages defined between the adjacent fins 51 in the same manner as the aforementioned example. A higher performance of cooling for the semiconductor element on the semiconductor device module 12 can uniformly be established in the overall vaporization chamber 44.

Figure 7:
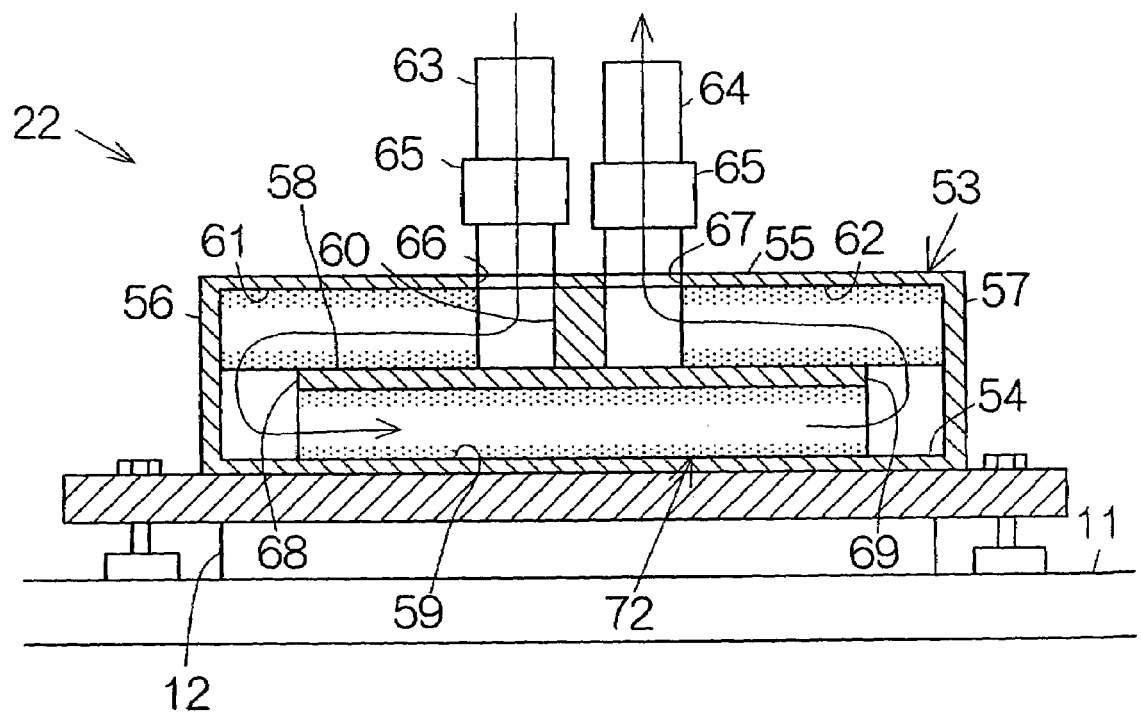
FIG. 7 is a sectional view illustrating the structure of a dry evaporator according to another specific example.

FIG. 7 illustrates the structure of the dry evaporator 22 according to another specific example. The dry evaporator 22 includes a casing 53. The casing 53 comprises a bottom plate 54 extending in a horizontal direction, and a top plate 55 extending in parallel with the bottom plate 54. The bottom plate 54 is designed to contact the semiconductor element on the semiconductor device module 12. A closed space in the form of a rectangular parallelepiped is defined between the top and bottom plates 54, 55, for example. First and second side walls 56, 57 are designed to stand upright on the bottom plate 54 on the opposite sides of the closed space. The first and second side walls 56, 57 reach the top plate 55 at their top ends, respectively. An intermediate or partition plate 58 is disposed between the top and bottom plates 55, 54 within the closed space. The intermediate plate 58 is designed to extend in parallel with the bottom plate 54. A vaporization chamber 59 is defined between the intermediate and bottom plates 58, 54. The casing 53 may be made from a high heat conductive material such as a copper material.

A partition wall 60 is disposed within the closed space between the intermediate and the top plates 58, 55. The partition wall 60 is designed to extend in parallel with the first and second side walls 56, 57 between the first and second side walls 56, 57. The partition wall 60 serves to define a refrigerant introduction chamber adjacent the first side wall 56 and a refrigerant discharge chamber 62 adjacent the second side wall 57 between the intermediate and top plates 58, 55.

The top plate 55 is designed to receive the connection of an inlet duct 63, extending from the top plate 55 in a vertical direction so as to define a refrigerant introduction passage inside, and the connection of an outlet duct 64, likewise extending from the top plate 55 in a vertical direction so as to define a refrigerant discharge passage inside. The inlet and outlet ducts 63, 64 are coupled to the top plate 55 through couplers 65, respectively. A refrigerant inlet 66 is defined in the top plate 55 of the casing 53 at a location adjacent the partition wall 60 so as to open the refrigerant introduction passage at the inner surface of the refrigerant introduction chamber 61 or the lower surface of the top plate 55. Likewise, a refrigerant outlet 67 is defined in the top plate 55 of the casing 53 at a location adjacent the partition wall 60 so as to open the refrigerant discharge passage at the inner surface of the refrigerant discharge chamber 62 or the lower surface of the top plate 55.

Figure 8:
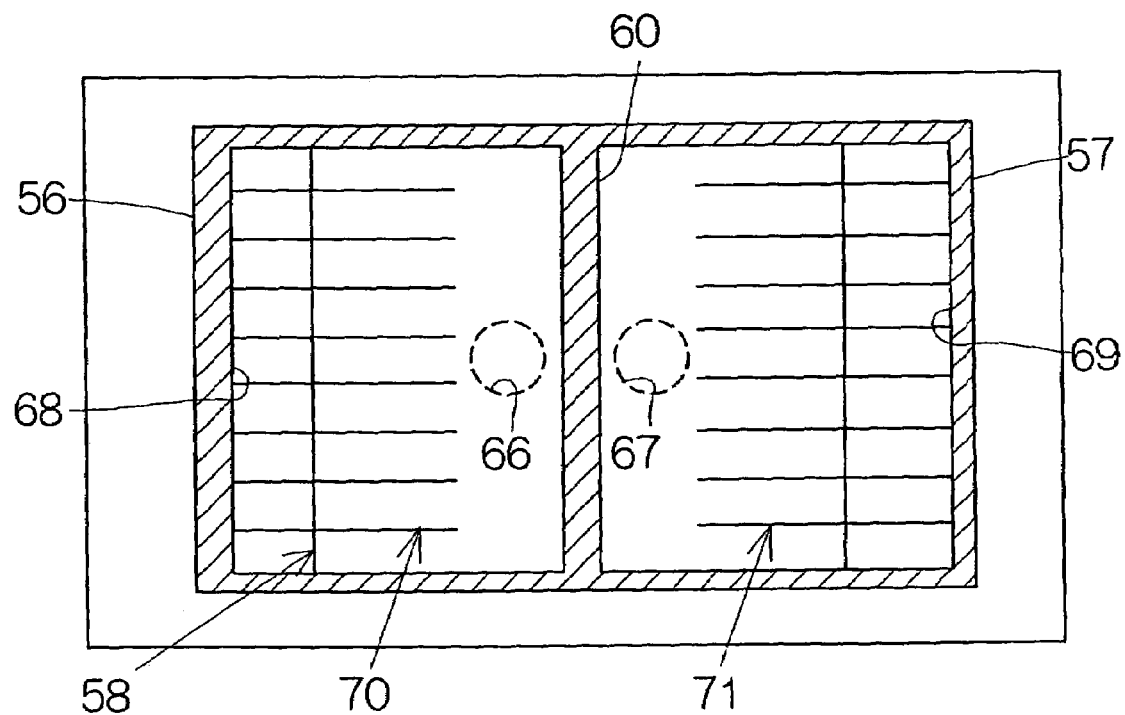
FIG. 8 is a plan view of an intermediate plate of the dry evaporator.

As is apparent from FIG. 8, an introduction opening 68 is defined between the first side wall 56 and the peripheral edge of the intermediate plate 58. The introduction opening 68 serves to connect the upper refrigerant introduction chamber 61 and the lower vaporization chamber 59 to each other. In this manner, the refrigerant introduction chamber 61 is allowed to extend from the refrigerant inlet 66 to the vaporization chamber 59. On the other hand, a discharge opening 69 is likewise defined between the second side wall 57 and the peripheral edge of the intermediate plate 58. The discharge opening 69 serves to connect the upper refrigerant discharge chamber 62 and the lower vaporization chamber 59 to each other. In this manner, the refrigerant discharge chamber 62 is allowed to extend from the vaporization chamber 59 to the refrigerant outlet 67.

A refrigerant is introduced into the refrigerant introduction chamber 61 from the inlet duct 63 through the refrigerant inlet 66 in this dry evaporator 22. The introduced refrigerant flows along the intermediate plate 58 so as to enter the vaporization chamber 59 through the introduction opening 68. The refrigerant in the vaporization chamber 59 is allowed to receive or absorb heat of the semiconductor device module 12 via the heat transfer or bottom plate 54. The semiconductor device module 12 is thus cooled down.

The refrigerant of a higher quality is led to the refrigerant discharge chamber 62 through the discharge opening 69. The refrigerant then flows along the intermediate plate 58 into the refrigerant outlet 67. The refrigerant flowing out of the refrigerant outlet 67 is maintained at a temperature lower than that of the refrigerant flowing through the refrigerant inlet 66. The intermediate plate 58 is allowed to achieve a heat exchange between the refrigerants in the refrigerant inlet and outlet 66, 67 based on the difference in temperature. It is possible to restrain variation in the quality of the refrigerant headed toward the vaporization chamber 59 from the refrigerant inlet 66. A still higher performance of cooling can be achieved in the dry evaporator 22.

As shown in FIG. 8, a plurality of fins 70 may integrally be formed on the intermediate plate 58 so as to define a plurality of refrigerant passages crossing the refrigerant introduction chamber 61 from the refrigerant inlet 66 to the introduction opening 68. Likewise, a plurality of fins 71 may integrally be formed on the intermediate plate 58 so as to define a plurality of refrigerant passages crossing the refrigerant discharge chamber 62 from the discharge opening 69 to the refrigerant outlet 67. The fins 70, 71 are expected to promote the aforementioned heat exchange between the refrigerants in the refrigerant inlet and outlet 66, 67. In addition, a plurality of fins 72 may integrally be formed on the bottom plate 54, as shown in FIG. 7. The fins 72 are designed to define a plurality of refrigerant passages extending in parallel from the introduction opening 68 and the discharge opening 69. The fins 72 serve to efficiently transfer heat of the semiconductor element on the semiconductor device module 12 to the refrigerant. If the fins 72 are allowed to reach the intermediate plate 58 at the top ends, the aforementioned heat exchange between the refrigerants may further be promoted.

Figure 9:
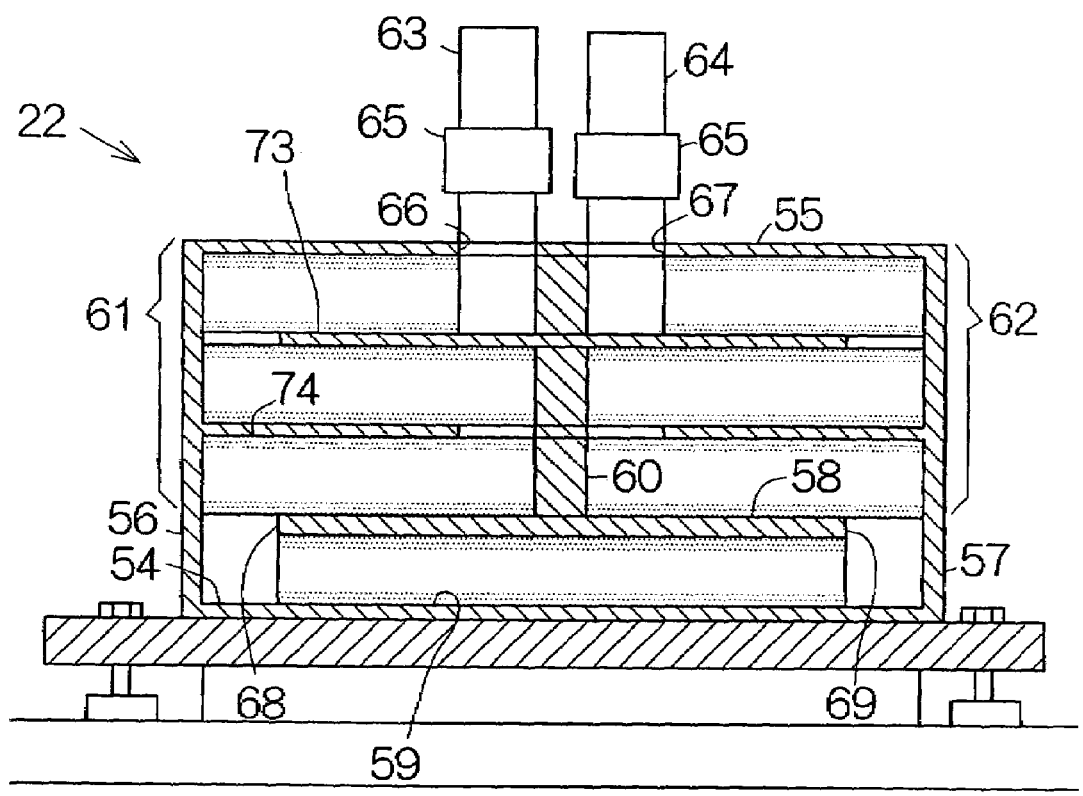
FIG. 9 is a sectional view illustrating the structure of a dry evaporator according to a modification of the specific example shown in FIG. 7.

For example, the refrigerant introduction chamber 61 and/or the refrigerant discharge chamber 62 in the dry evaporator 22 may be divided into a plurality of cumulative or piled chambers, as shown in FIG. 9. First and second subsidiary intermediate or partition plates 73, 74 can be employed to achieve such division. The first and second subsidiary intermediate plates 73, 74 are designed to extend between the intermediate plate 58 and the top plate 55 in parallel with the bottom plate 54. The first and second subsidiary intermediate plates 73, 74 are supposed to further improve a heat exchange between the refrigerant flowing through the refrigerant inlet 66 and the refrigerant flowing through the refrigerant outlet 67.

Figure 10:
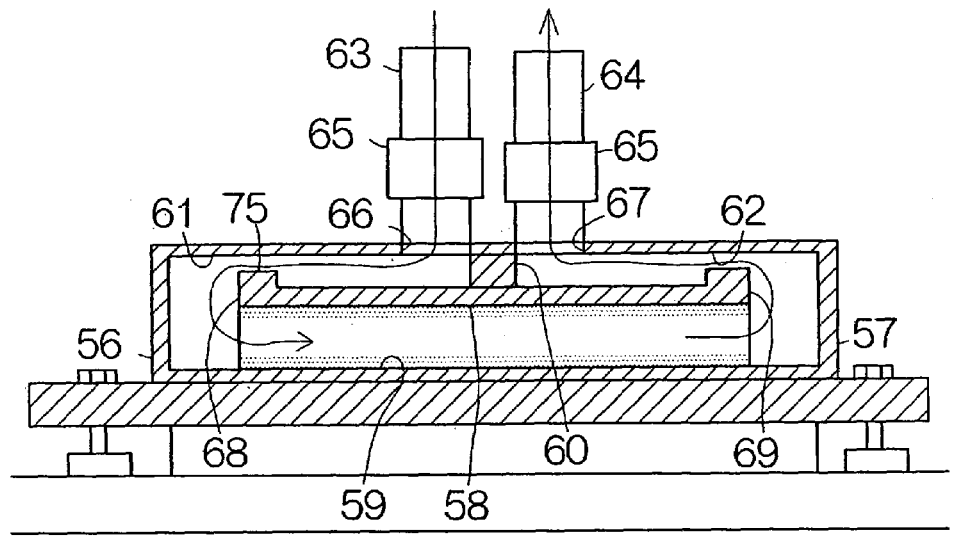
FIG. 10 is a sectional view illustrating the structure of a dry evaporator according to another modification of the specific example shown in FIG. 7.
Figure 11:
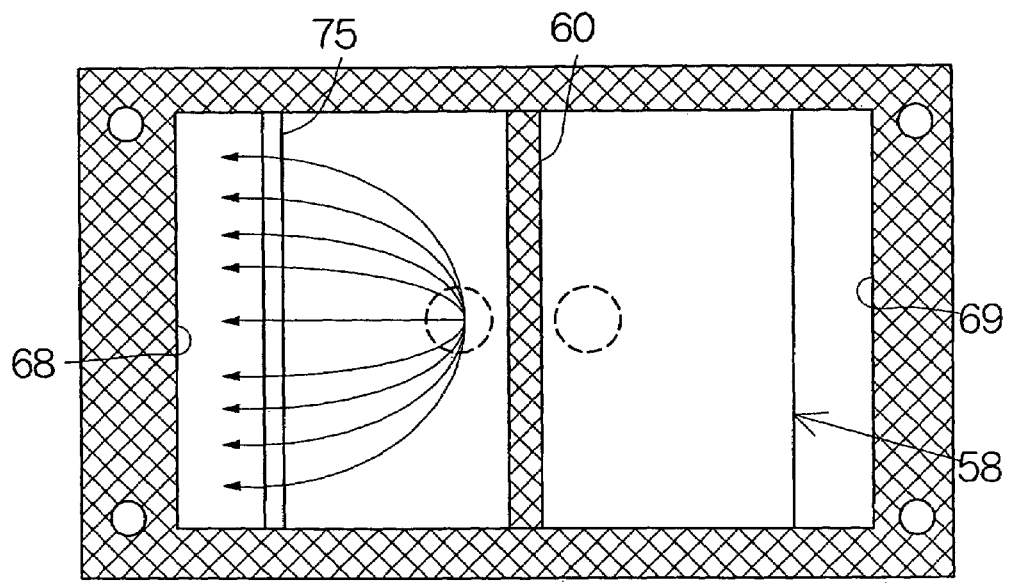
FIG. 11 is a plan view illustrating an intermediate plate of the dry evaporator.

FIGS. 10 and 11 illustrates the dry evaporator 22 according to a modification of the aforementioned specific example. The space between the top and intermediate plates 55, 58 is set smaller than the space between the bottom and intermediate plates 54, 58 in this dry evaporator 22. The smaller space between the top and intermediate plates 55, 58 is expected to accelerate the loss or consumption of pressure for the refrigerant in the refrigerant introduction chamber 61, so that the refrigerant liquid can be prevented from vaporization to the utmost before it is introduced into the vaporization chamber 59. A still higher performance of cooling can be achieved in the dry evaporator 22.

In this case, it is preferable that a dike 75 is formed on the intermediate plate 58 so as to swell from the upper surface of the intermediate plate 58. The dike 75 is designed to extend along the edge of the intermediate plate 58 at a location adjacent the introduction opening 68. The dike 75 serves to reliably promote an accelerated loss or consumption of pressure for the refrigerant in the refrigerant introduction chamber 61. The refrigerant liquid is still reliably prevented from vaporization. Moreover, the dike 75 is also expected to allow a uniform inflow of the refrigerant over the entire introduction opening 68, so that the refrigerant can uniformly be distributed into the respective refrigerant passages within the vaporization chamber 59.

Figure 12:
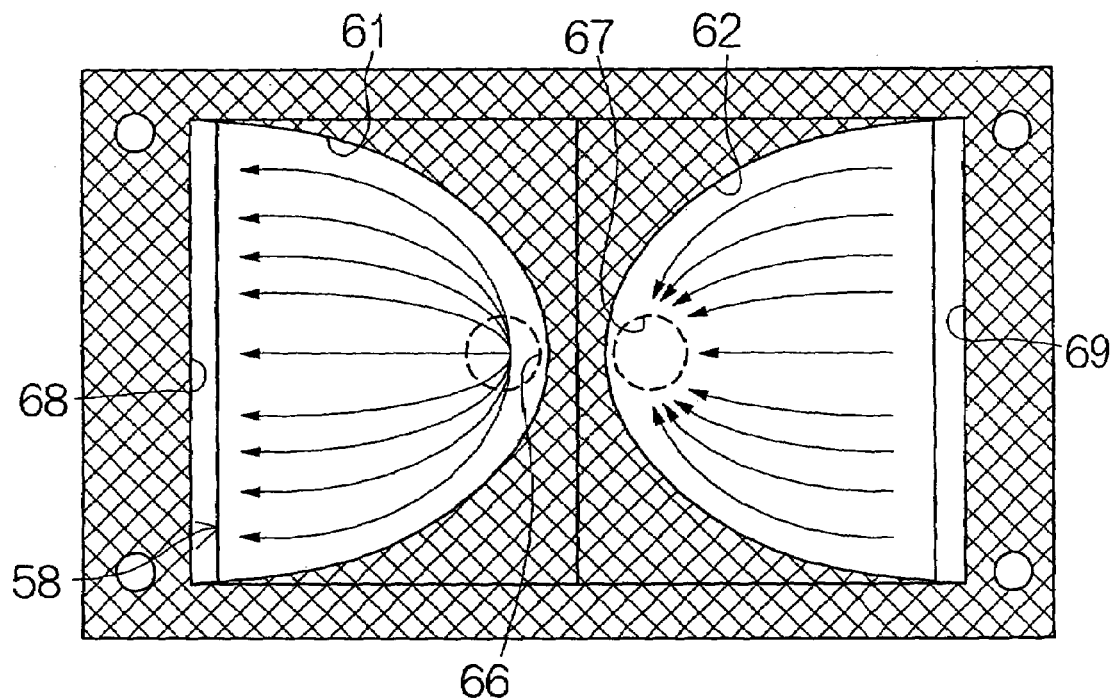
FIG. 12 is a plan view of an intermediate plate for illustrating the structure of a refrigerant introduction chamber and a refrigerant discharge chamber.

In addition, the refrigerant introduction chamber 61 may be designed to by degree expand as it gets closer to the introduction opening 68, namely, the vaporization chamber 59, as shown in FIG. 12, for example. The refrigerant introduction chamber 61 of this type is expected to reliably making a uniform inflow of the refrigerant over the entire introduction opening 68. The refrigerant can uniformly be distributed into the respective refrigerant passages in the aforementioned manner. Moreover, the refrigerant discharge chamber 62 may be designed to by degree narrow as it gets closer to the refrigerant outlet 67. The refrigerant discharge chamber 62 of this type also contributes to a uniform distribution of the refrigerant into the respective refrigerant passages in the vaporization chamber 59. The gradually expanded refrigerant introduction chamber 61 and/or the gradually narrowed refrigerant discharge chamber 62 may be formed by simply defining a curved surface on the inner surface of the refrigerant introduction and discharge chambers 61, 62, as is apparent from FIG. 12.

Figure 13:
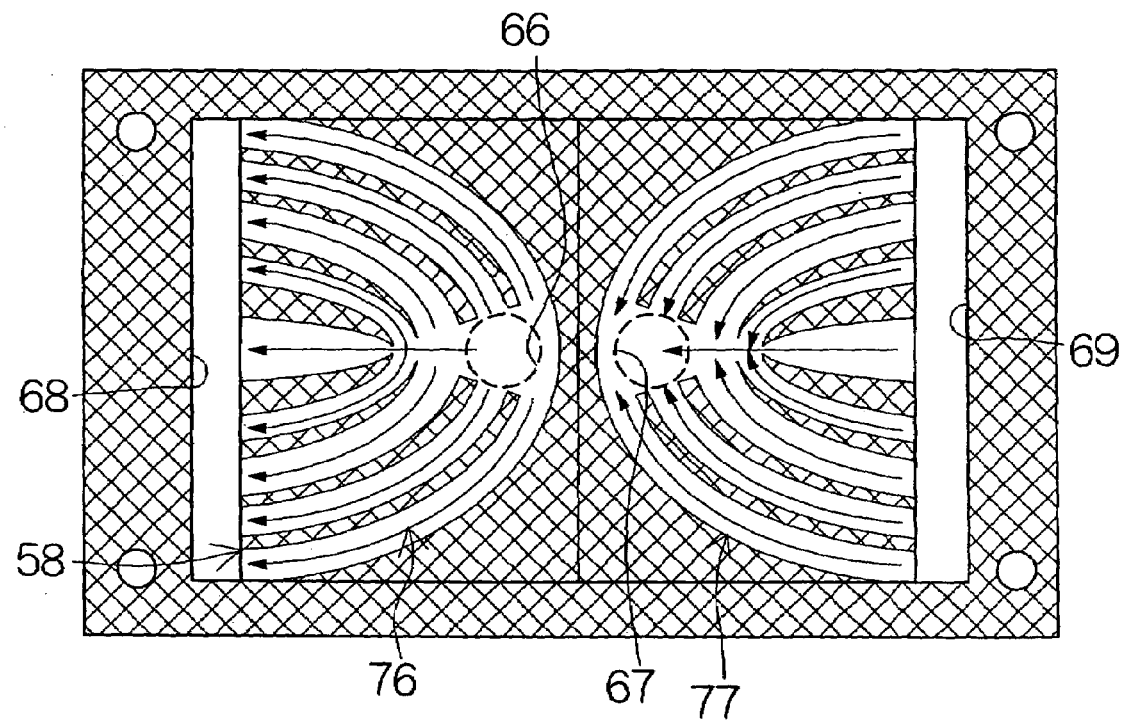
FIG. 13 is a plan view of an intermediate plate for illustrating the structure of a refrigerant introduction chamber and a refrigerant discharge chamber.

As shown in FIG. 13, a plurality of refrigerant passages 76 may be defined within the refrigerant introduction chamber 61 so as to respectively extend from the refrigerant inlet 66 to the introduction opening 68, namely, the vaporization chamber 59, for example. The refrigerant passages 76 serve to uniformly distribute the refrigerant to the respective refrigerant passages in the vaporization chamber 49. In this case, a plurality of refrigerant passages 77 may likewise be defined within the refrigerant discharge chamber 62 so as to respectively extend from the vaporization chamber 59, namely, the discharge opening 69 to the refrigerant outlet 67, as is apparent from FIG. 13, for example. The refrigerant passages 77 also contribute to a uniform distribution of the refrigerant into the respective refrigerant passages in the vaporization chamber 59.

Figure 14:
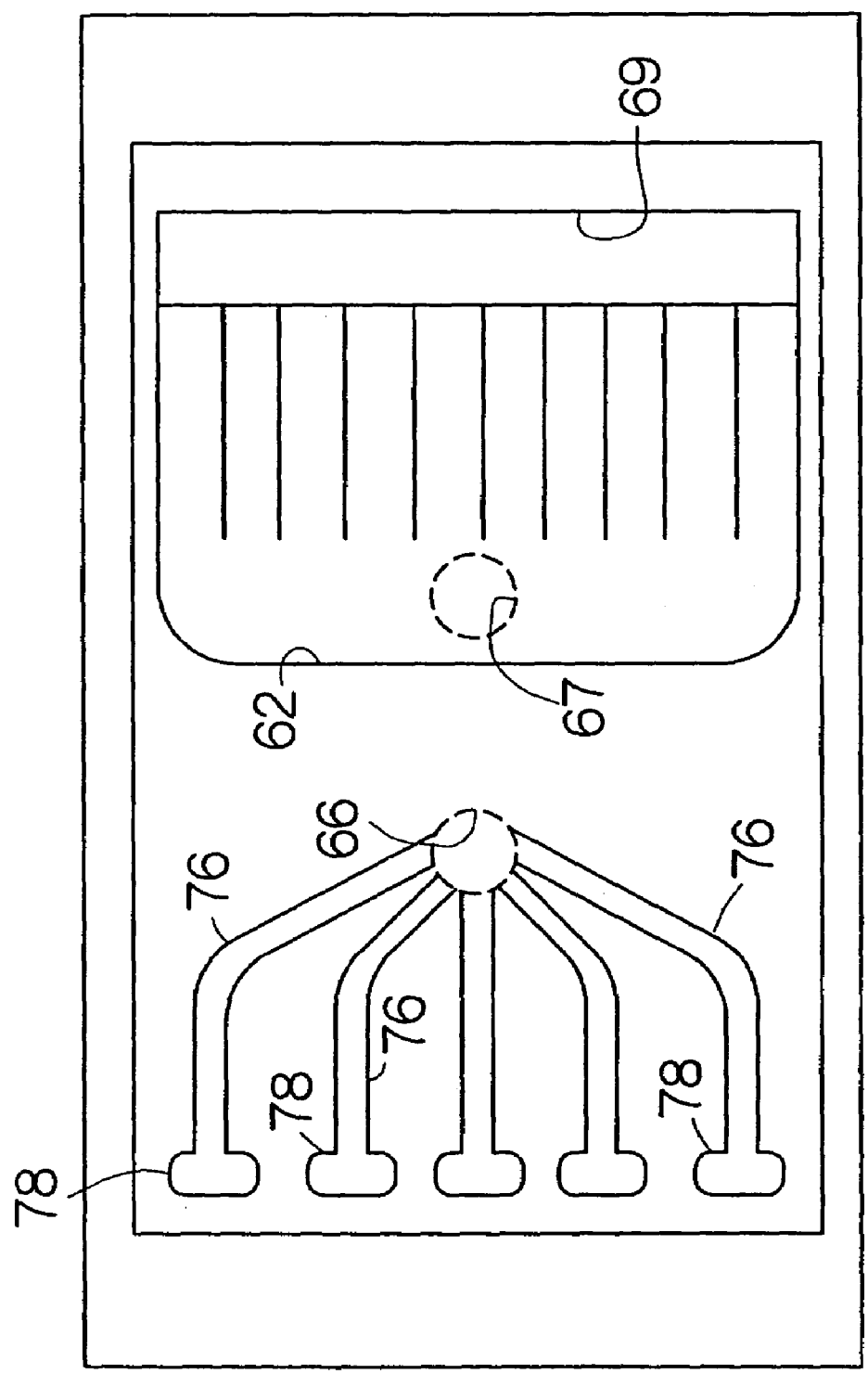
FIG. 14 is a plan view of an intermediate plate for illustrating the structure of a refrigerant introduction chamber and a refrigerant discharge chamber.

If the refrigerant passages 76 are defined within the refrigerant introduction chamber 61 in this manner, an expanded passage 78 may be connected to the downstream end of the individual refrigerant passage 76, as shown in FIG. 14, for example. The individual refrigerant passage 76 is connected to the lower vaporization chamber 59 through the expanded passage 78. The expanded passage 78 serves to remarkably increase the loss of pressure for the refrigerant, so that the vaporization of the refrigerant flowing into the vaporization chamber 59 can be promoted. A performance of cooling can be improved in the dry evaporator 22.

Figure 15:
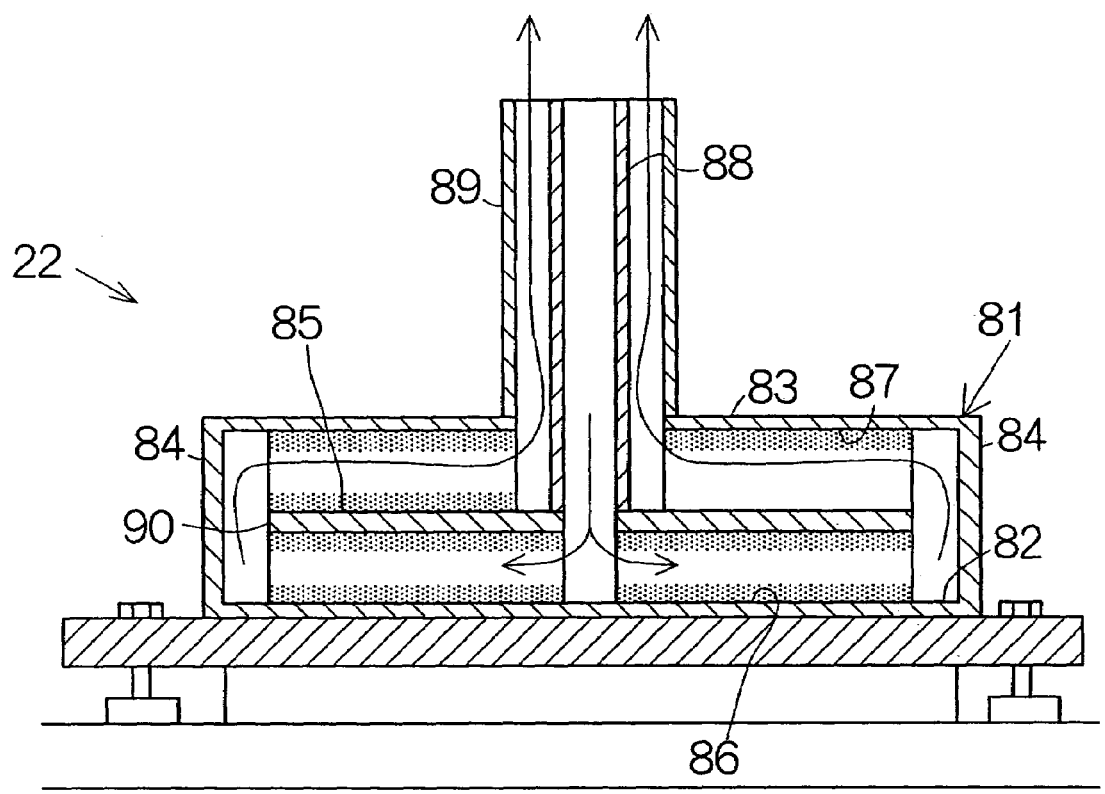
FIG. 15 is a sectional view illustrating the structure of a dry evaporator according to a further specific example.
Figure 16:
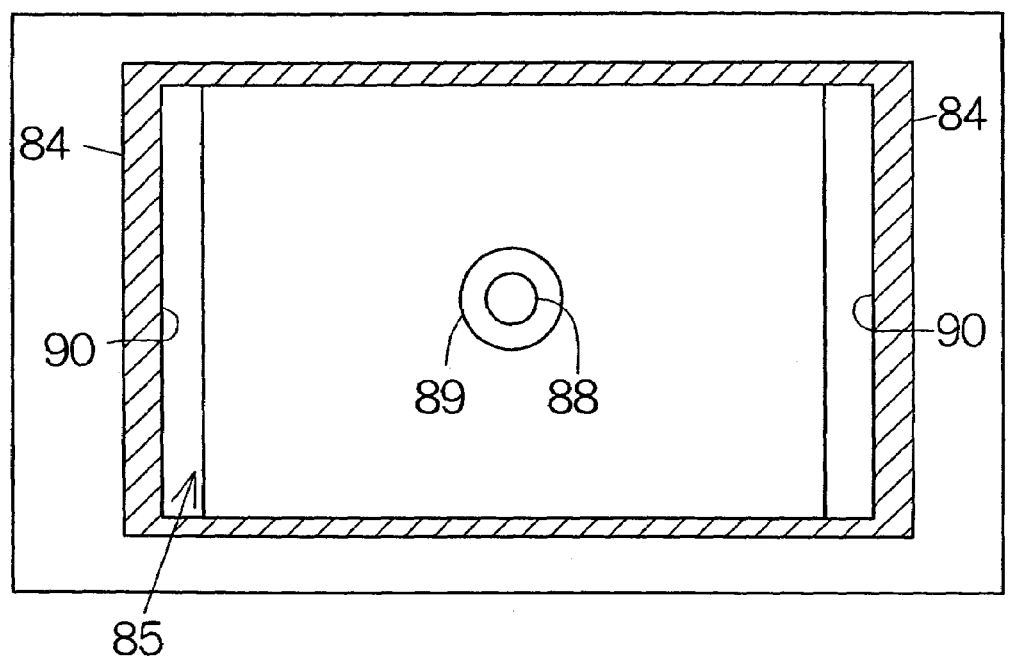
FIG. 16 is a plan view of an intermediate plate for illustrating the structure of a refrigerant introduction chamber and a refrigerant discharge chamber in the dry evaporator shown in FIG. 15.

FIGS. 15 and 16 illustrates the structure of the dry evaporator 22 according to a further specific example. The dry evaporator 22 includes a casing 81. The casing 81 comprises a bottom plate 82 extending in a horizontal direction, and a top plate 83 extending in parallel with the bottom plate 82. The bottom plate 82 is designed to contact the semiconductor element on the semiconductor device module 12. A closed space in the form of a rectangular parallelepiped is defined between the top and bottom plates 82, 83, for example. The closed space is surrounded by a side wall 84. The side wall 84 is designed to stand upright on the upper surface of the bottom plate 82 and reach the top plate 83 at its top end. An intermediate or partition plate 85 is disposed between the top and bottom plates 83, 82 within the closed space. The intermediate plate 85 is designed to extend in parallel with the bottom plate 82. A vaporization chamber 86 is defined between the intermediate and bottom plates 85, 82. On the other hand, a refrigerant discharge chamber 87 is likewise defined between the intermediate and top plates 85, 83. The casing 81 may be made from a high heat conductive material such as a copper material.

An inlet duct 88 is connected to the intermediate plate 85. The inlet duct 88 is designed to extend in a vertical direction. The inlet duct 88 is utilized to define a refrigerant introduction passage which penetrates through the refrigerant discharge chamber 87 so as to reach the vaporization chamber 86. The inlet duct 88 may be made from a high heat conductive material such as a copper material. An outlet duct 89 extending in a vertical direction is likewise connected to the top plate 83. The outlet duct 89 is designed to define a refrigerant discharge passage extending from the refrigerant discharge chamber 87. The refrigerant discharge passage surrounds the inlet duct 88. Referring also to FIG. 16, a discharge opening is defined between the edge of the intermediate plate 85 and the side wall 84 so as to connect the lower vaporization chamber 86 and the upper refrigerant discharge chamber 87.

A refrigerant is introduced in the vaporization chamber 86 through the refrigerant introduction passage defined within the inlet duct 88 in the aforementioned dry evaporator 22. The refrigerant in the vaporization chamber 86 is allowed to receive or absorb heat of the semiconductor device module 12 via the heat transfer or bottom plate 82. The semiconductor device module 12 is thus cooled down.

The refrigerant of a higher quality is led to the upper refrigerant discharge chamber 87 from the lower vaporization chamber 86. The refrigerant then flows out through the refrigerant discharge passage defined between the inner surface of the outlet duct 89 and the outer surface of the inlet duct 88. In this situation, the refrigerant flowing through the refrigerant discharge passage is maintained at a temperature lower than that of the refrigerant flowing through the refrigerant introduction passage. The wall of the inlet duct 88 serves to establish a heat exchange between the refrigerants in the refrigerant discharge and introduction passages based on the difference in temperature. It is thus possible to restrain variation in the quality of the refrigerant headed toward the vaporization chamber 86 from the refrigerant introduction passage. A higher performance of cooling can be achieved in the dry evaporator 22.

Figure 17:
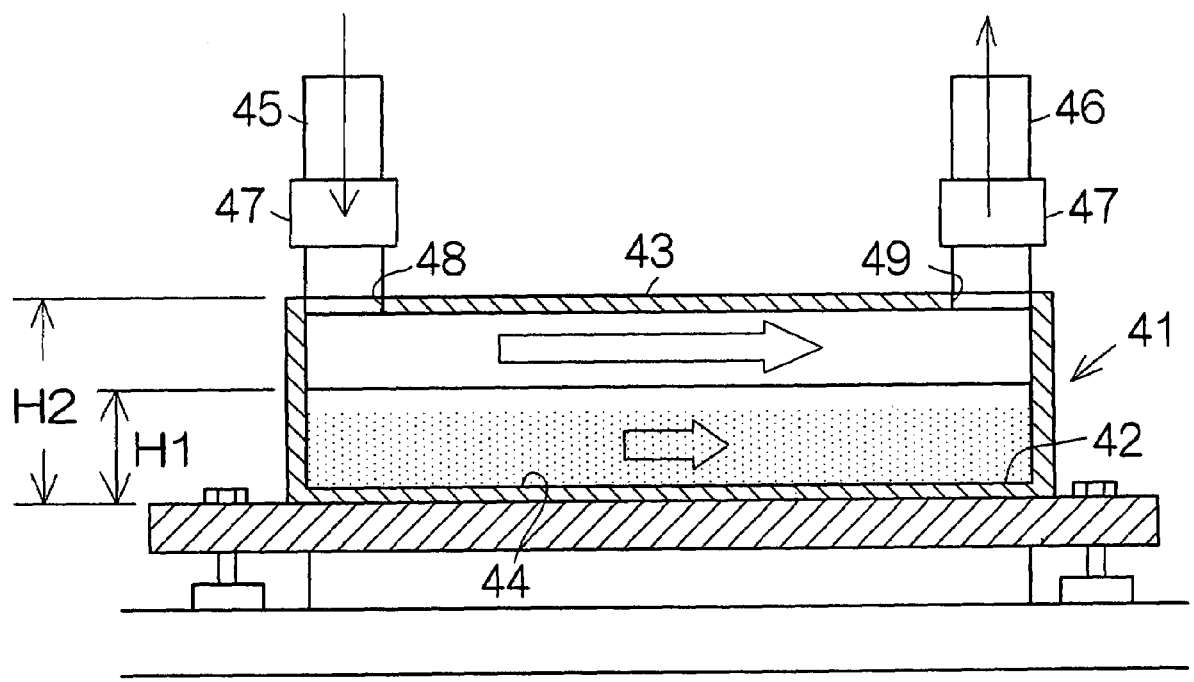
FIG. 17 is a sectional view of the dry evaporator for illustrating the concept of a gas-liquid separation within the vaporization chamber.

For example, the dry evaporator 22 shown in FIG. 3 may accomplish a gas-liquid separation of the refrigerant in the vaporization chamber 44. The gas-liquid separation can be achieved based on the flow or current of the refrigerant discharged from a flow or current controller such as the expansion valve 21. In this case, the refrigerant of liquid state, namely, the refrigerant liquid runs along the upper surface of the bottom plate 42 under the influence of the gravity in the vaporization chamber 44, as shown in FIG. 17, for example. On the other hand, the refrigerant of gas state, namely, the refrigerant gas receives a smaller influence of the gravity, so that the refrigerant gas is allowed to flow along the lower surface of the top plate 43. If the gas-liquid separation can be achieved in this manner, the refrigerant liquid is allowed to uniformly spread over the entire upper surface of the heat transfer or bottom plate 42, so that a higher performance of cooling can be achieved uniformly over the broader area of the bottom plate 43.

In particular, it is preferable that the dry evaporator 22 is designed to have a larger sectional area in the vaporization chamber 44, as is apparent from FIG. 17, if the gas-liquid separation is intended in the aforementioned manner. The larger sectional area of the vaporization chamber 44 can be achieved by enlarging the space H1, defined between the bottom and top plates 42, 43, to the space H2, for example. Here, the sectional area of the vaporization chamber 44 is measured based on a profile in a plane perpendicular to the direction of the flow or current of the refrigerant.

Figure 18:
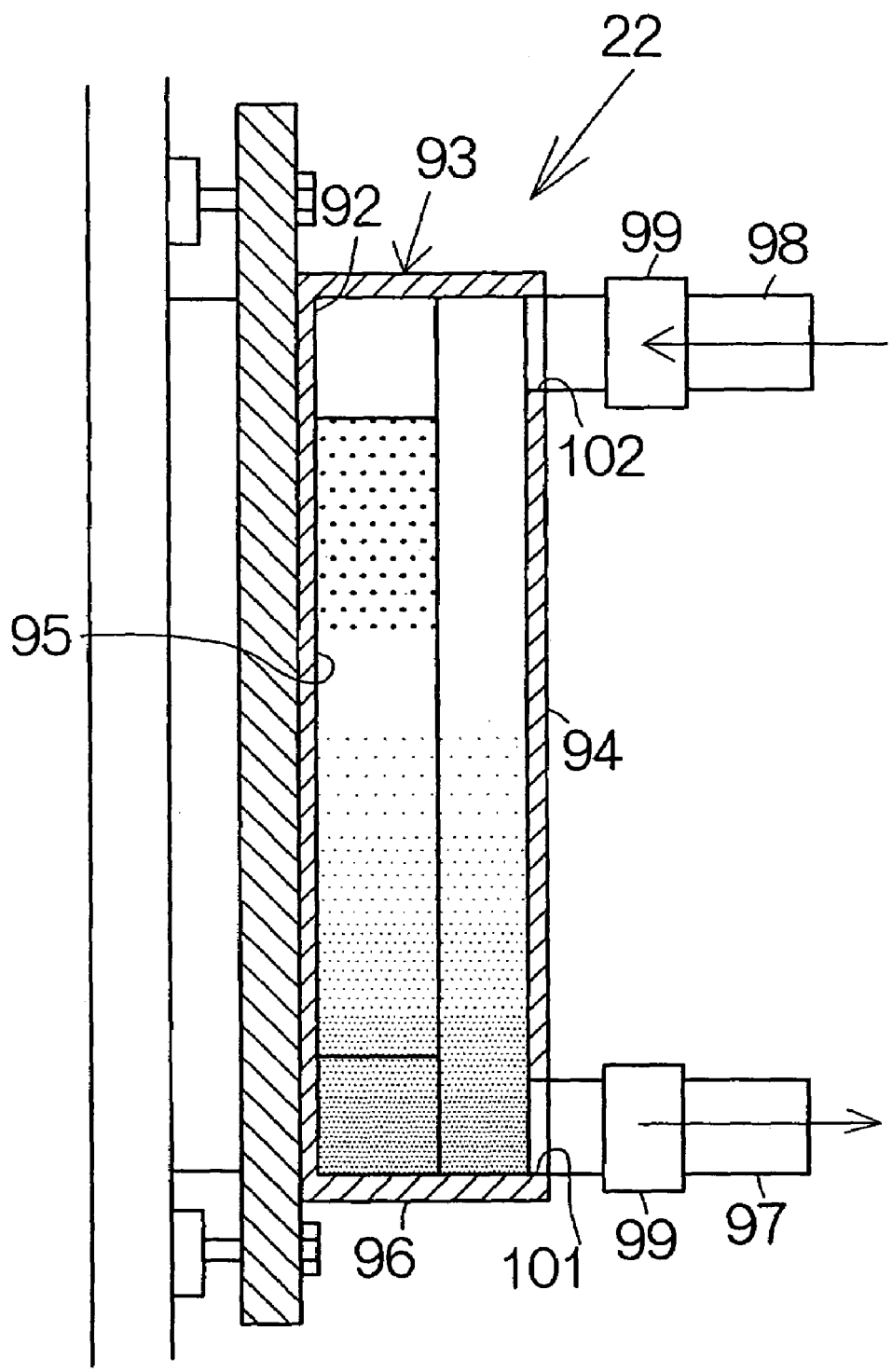
FIG. 18 is a sectional view illustrating the dry evaporator according to a specific example for the gas-liquid separation.

When the aforementioned gas-liquid separation is intended, the dry evaporator 22 may include a casing 93 comprising a vertical heat transfer plate 92 designed to contact a target heating object such as the semiconductor device module 12, as shown in FIG. 18, for example. A closed space or vaporization chamber 95 in the form of a parallelepiped is defined between the heat transfer plate 92 and a back plate 94 extending in parallel with the heat transfer plate 92 in this casing 93. The vaporization chamber 95 is allowed to extend in a vertical direction along the heat transfer plate 92 from a bottom plate 96 upright to the heat transfer plate 92. The bottom plate 96 is designed to extend in a horizontal direction from the heat transfer plate 96 so as to reach the back plate 94 at the tip end. The casing 93 may be made from a high heat conductive material such as a copper material, for example.

Figure 19:
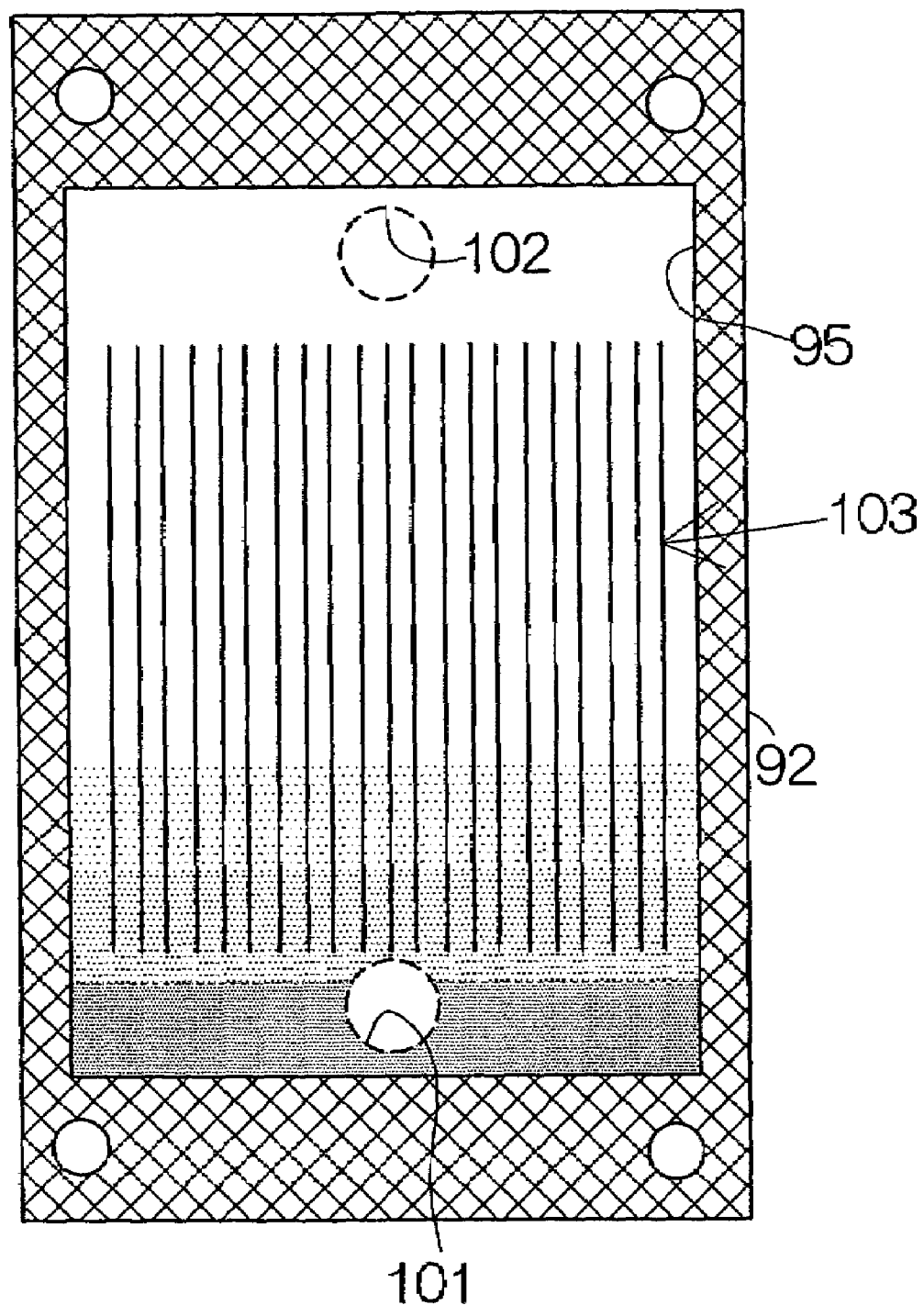
FIG. 19 is a plan view of a heat transfer plate for illustrating the dry evaporator according to the specific example shown in FIG. 18.

The back plate 94 is designed to receive the connection of an inlet duct 97, extending in a horizontal direction so as to define a refrigerant introduction passage inside, and the connection of an outlet duct 98, likewise extending in a horizontal direction so as to define a refrigerant discharge passage inside. The inlet and outlet ducts 97, 98 are coupled to the back plate 94 through couplers 99, respectively. A refrigerant inlet 101 is defined in the back plate 94 of the casing 93 so as to open the refrigerant introduction passage at the inner surface of the vaporization chamber 95. Likewise, a refrigerant outlet 102 is defined in the back plate 94 so as to open the refrigerant discharge passage at the inner surface of the vaporization chamber 95. The refrigerant outlet 102 is located at a position above the refrigerant inlet 101 in a vertical direction. As is apparent from FIG. 19, a plurality of fins 103 are integrally formed on the heat transfer plate 92 so as to define a plurality of refrigerant passages extending in parallel from the refrigerant inlet 101 to the refrigerant outlet 102, for example.

A refrigerant discharged from the refrigerant inlet 101 is allowed to flow upward within the vaporization chamber 95 along the heat transfer plate 92 and to finally reach the refrigerant outlet 102. If the gas-liquid separation is realized in the vaporization chamber 95, the refrigerant liquid falls on the upper surface of the bottom plate 96 under the influence of the gravity. The refrigerant liquid received on the bottom plate 96 can uniformly be distributed into the respective refrigerant passages defined between the adjacent fins 103 in the dry evaporator 22.

Figure 20:
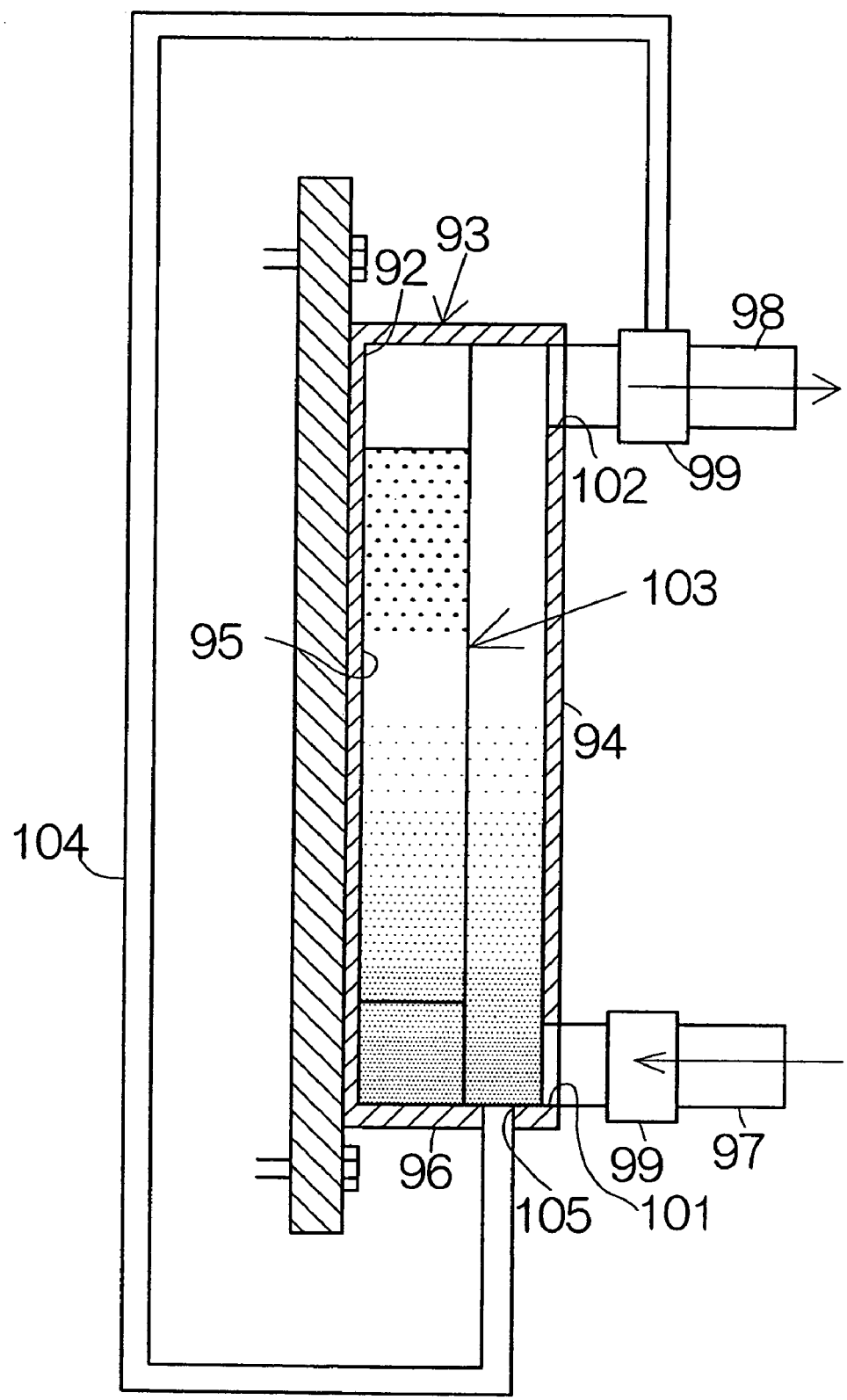
FIG. 20 is a sectional view illustrating the dry evaporator according to a modification of the specific example shown in FIGS. 18 and 19.

As shown in FIG. 20, the dry evaporator 22 may further include a bypass duct 104 extending from the bottom plate 96 of the casing 93 to the outlet duct 98, for example. The bypass duct 104 serves provide a bypass channel for connecting a bypass opening 105, opened at the lowest position within the vaporization chamber 95, and a discharge channel, such as the refrigerant discharge passage defined in the outlet duct 98, to each other. The oil from the compressor 15, which is involuntarily introduced in the vaporization chamber 95, received on the bottom plate 96 can be led to the refrigerant discharge passage or the circulation channel 14 through the bypass duct 104 under the influence of the difference in pressure between the refrigerant inlet and outlet 101, 102. It is possible to prevent the oil, discharged from the compressor 15, from staying within the vaporization chamber 95.

Figure 21:
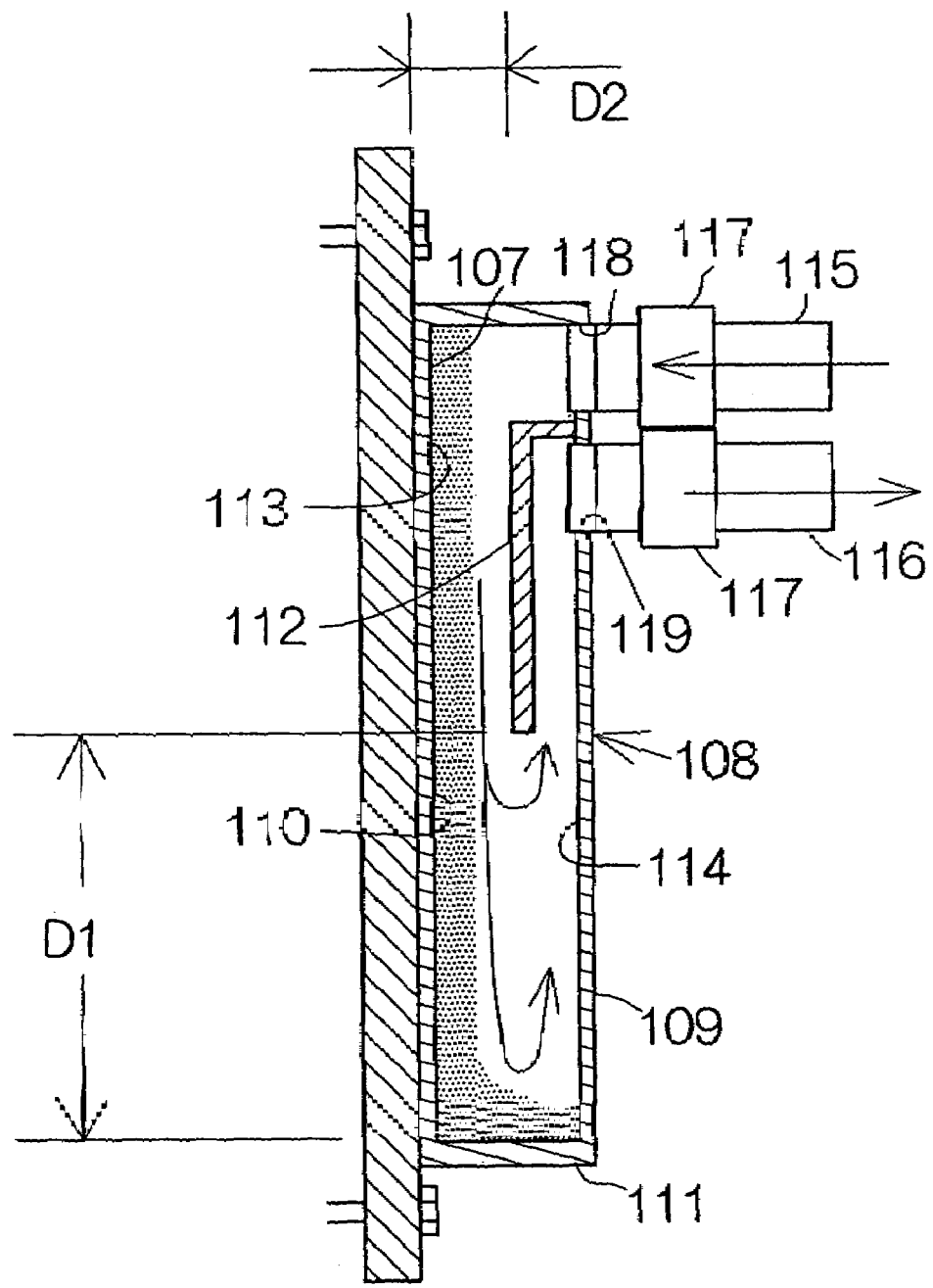
FIG. 21 is a sectional view illustrating the dry evaporator according to another modification of the specific example shown in FIGS. 18 and 19.

When the aforementioned gas-liquid separation is intended, the dry evaporator 22 may include a casing 108 comprising a vertical heat transfer plate 107 designed to contact a target heating object such as the semiconductor device module 12, as shown in FIG. 21, for example. A closed space or vaporization chamber 110 in the form of a parallelepiped is defined between the heat transfer plate 107 and a back plate 109 extending in parallel with the heat transfer plate 107 in this casing 108. The vaporization chamber 110 is allowed to extend in a vertical direction along the heat transfer plate 107 from a bottom plate 111 upright to the heat transfer plate 107. The bottom plate 111 is designed to extend in a horizontal direction from the heat transfer plate 107 so as to reach the back plate 109 at the tip end. The casing 108 may be made from a high heat conductive material such as a copper material, for example.

A partition plate 112 is disposed between the heat transfer plate 107 and the back plate 109 within the upper portion of the vaporization chamber 110 so as to extend in parallel with the heat transfer plate 107. The partition plate 112 is designed to divide the upper portion of the vaporization chamber 110 into an introduction space 113 adjacent the heat transfer plate 107 and a discharge space 114 adjacent the back plate 109.

The back plate 109 is designed to receive the connection of an inlet duct 115, extending in a horizontal direction so as to define a refrigerant introduction passage inside, and the connection of an outlet duct 116, likewise extending in a horizontal direction so as to define a refrigerant discharge passage inside. The inlet and outlet ducts 115, 116 are coupled to the back plate 109 through couplers 117, respectively. A refrigerant inlet 118 is defined in the back plate 109 of the casing 108 so as to open the refrigerant introduction passage at the inner surface of the introduction space 113. Likewise, a refrigerant outlet 119 is defined in the back plate 109 so as to open the refrigerant discharge passage at the inner surface of the discharge space 114.

The depth D1 of the lower portion is set larger than the space D2 measured between heat transfer plate 107 and the partition plate 112 in the vaporization chamber 110. The depth D1 of the lower portion can be measured between the lower edge of the partition plate 112 and the upper surface of the bottom plate 111 along a vertical direction.

A refrigerant discharged from the refrigerant inlet 118 is allowed to flow downward within the vaporization chamber 110 along the heat transfer plate 107. The refrigerant flows through the introduction space 113 in the upper portion to the lower portion. The refrigerant is then allowed to flow around the lower edge of the partition plate 112 so as to enter the discharge space 114 in the upper portion. The refrigerant is thereafter discharged out of the refrigerant outlet 119. Since the depth D1 of the lower portion is set larger than the space D2 between the heat transfer plate 107 and the partition plate 112, the sectional area is forced to jaggedly increase in the vaporization chamber 110. The remarkable enlargement of the sectional area promotes the gas-liquid separation of the refrigerant in the vaporization chamber 110. Here, the sectional area of the vaporization chamber 110 is measured based on a profile in a plane perpendicular to the direction of the flow or current of the refrigerant.

Figure 22:
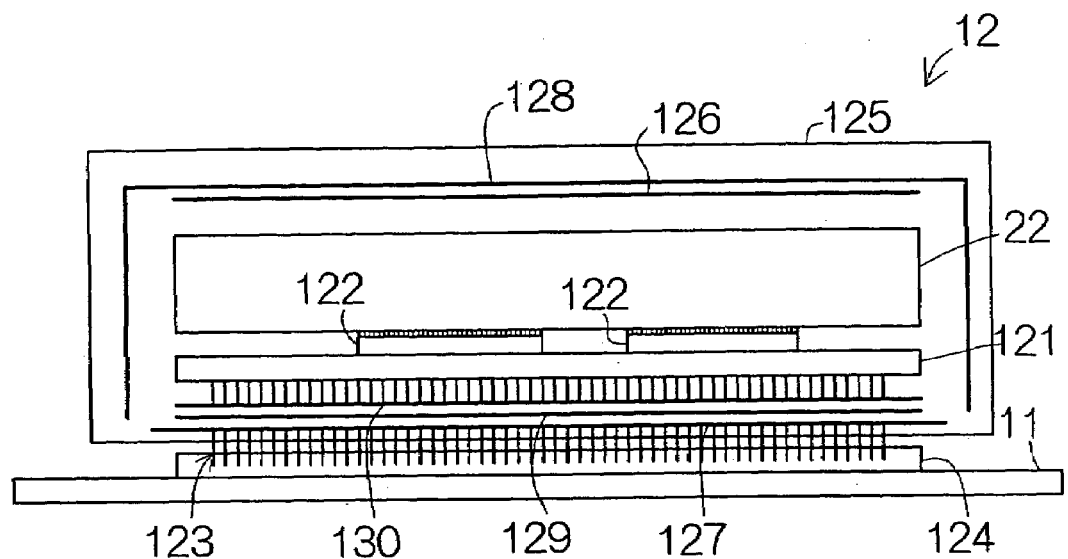
FIG. 22 is a sectional view illustrating the semiconductor device module according to a specific example.

The semiconductor device module 12 may be prepared to include a semiconductor element 122 such as an LSI chip mounted on the upper side of a small-sized printed circuit board 121, as shown in FIG. 22, for example. A plurality of semiconductor elements 122 may also be mounted in a single small-sized printed circuit board 121. A plurality of input/output pins 123 are designed to stand on and protrude from the lower side of the printed circuit board 121. The individual input/output pin 123 is received in a corresponding socket bore defined in a socket 124 mounted on the large-sized printed circuit board 11. The socket 124 serves to hold the small-sized printed circuit board 121, namely, the semiconductor device module 12 on the surface of the large-sized printed circuit board 11. The socket 124 may be represented by a so-called ZIF (zero insertion force) connector, for example.

The dry evaporator 22 is fixed on the upper side of the printed circuit board 121. Fixation is achieved with a heat insulator member 125 containing the dry evaporator 22. The heat insulator member 125 serves to hold the dry evaporator 22 in contact with the upper surface of the semiconductor element 122. Integration of the dry evaporator 22 to the semiconductor device module 12 in this manner contributes to a facilitated attachment and detachment of the semiconductor device module 12 and the dry evaporator 22 to and from the large-sized printed circuit board 11. The operability can be improved in replacement or maintenance of the semiconductor device module or modules 12. The heat insulator member 125 is designed to prevent condensation and/or frost over the surface of the dry evaporator 22.

As is apparent from FIG. 22, the heat insulator member 125 may also contain the input/output pins 123. In general, the metallic input/output pins 123 are easily cooled down under the influence of the performance of cooling by the dry evaporator 22. If the input/output pins 123 are excessively cooled down, the surfaces of the input/output pins 123 tend to suffer from condensation and/or frost. The input/output pins 123 wrapped by the heat insulator member 125 can be protected from condensation and/or frost.

The heat insulator member 125 may be made from a foam plastic or the like. In this case; the semiconductor element 122 is first mounted on the upper side of the small-sized printed circuit board 121. The dry evaporator 22 is then mounted on the semiconductor element 122 on the printed circuit board 121. Thereafter, the fluid foam material is introduced in a die to completely include the dry evaporator 22, the semiconductor element 122 and the printed circuit board 121. When the introduced fluid foam is hardened, the heat insulator member 125 can be obtained. The printed circuit board 121, the semiconductor element 122 and the dry evaporator 22 are thus completely embedded in the heat insulator member 125.

As is apparent from FIG. 22, the heat insulator member 125 may also contain film heaters 126, 127 inside in the semiconductor device module 12. The input/output pins 123 may be allowed to penetrate through the film heater 127 so as to enter the corresponding socket bores defined in the socket 124. The heat from the film heaters 126, 127 serves to heat the heat insulator member 125. The heat from the film heaters 126, 127 thus enables reduction in the thickness or volume of the heat insulator member 125, even when prevention of condensation and/or frost is intended on the surface of the dry evaporator 22. Such reduction in the thickness of the heat insulator member 125 contributes to a higher density of the semiconductor device module 12 on the large-sized printed circuit board 11. The film heater 126, 127 may comprise a cancellate or mesh-shaped heat wire unit interposed between a pair of resin films, for example.

As is apparent from FIG. 22, a heat conductive film 128 may be superposed on the film heater 126. The heat conductive film 128 is designed to conduct heat at a higher specific thermal conductivity. Such a heat conductive film 128 serves to spread heat from the film heater 126 over the entire area in the heat insulator member 125 even when the film heater 126 of a small size is employed. The heat conductive film 128 may be made of a carbon film, for example.

On the other hand, a heat conductive member or film 129 may be interposed between the dry evaporator 22 and the film heater 127, as shown in FIG. 22, for example. The heat conductive film 129 is designed to have a property allowing heat to conduct at a first specific thermal conductivity in a vertical direction oriented from the film heater 127 to the dry evaporator 22, while allowing heat to conduct at a second specific thermal conductivity larger than the first specific thermal conductivity in a plane perpendicular to the vertical direction. The heat conductive film 129 may be made of a carbon film, for example. The carbon film in general exhibits a specific thermal conductivity approximately equal to hundredth of that of the copper in the vertical direction and a specific thermal conductivity equal to twice the specific thermal conductivity of the copper in the plane. The heat conductive film 129 serves to spread heat from the film heater 127 over the entire area in the heat insulator member 125 even when the film heater 129 of a small size is employed. Condensation and/or frost can thus reliably be prevented. Simultaneously, heat from the film heater 127 can reliably be prevented from reaching the dry evaporator 22, so that the performance of cooling in the dry evaporator 22 can solely be concentrated on the semiconductor element 122. It is preferable that a heat insulator film 130 is interposed between the heat conductive film 129 and the dry evaporator 22.

Figure 23:
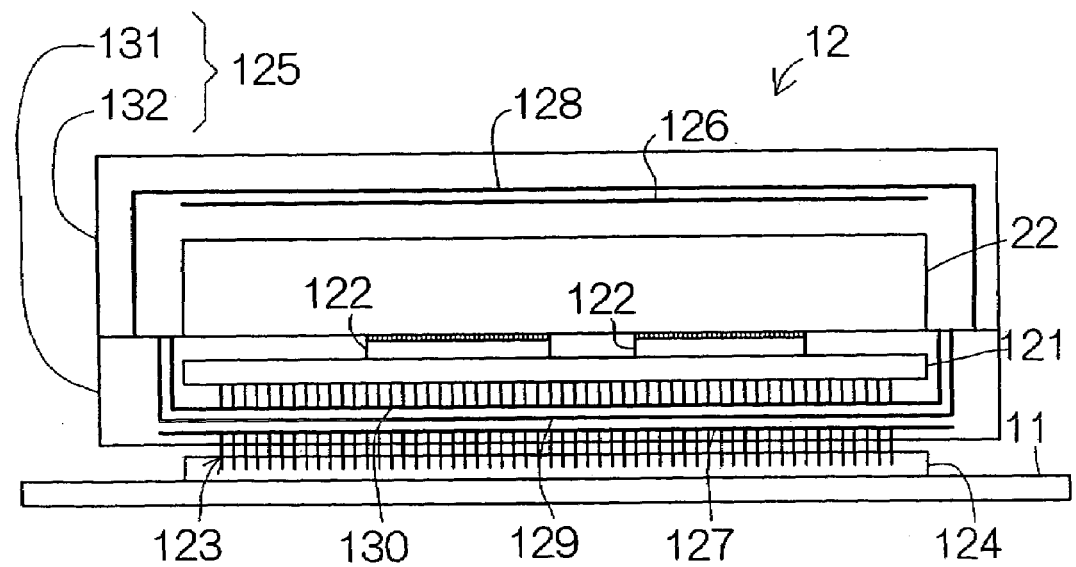
FIG. 23 is a sectional view illustrating the semiconductor device module according to a modification of the specific example.

As shown in FIG. 23, for example, the heat insulator member 125 may be divided into a first half piece 131 containing the small-sized printed circuit board 121, and a second half piece 132 containing the dry evaporator 22. The first and second half pieces 131, 132 are detachably coupled to each other. The division into the first and second half pieces 131, 132 serves to facilitate removal of the semiconductor element 122 and the dry evaporator 22 from the small-sized printed circuit board 121. The operability can be improved in replacement or maintenance of the semiconductor element 122.

Figure 24:
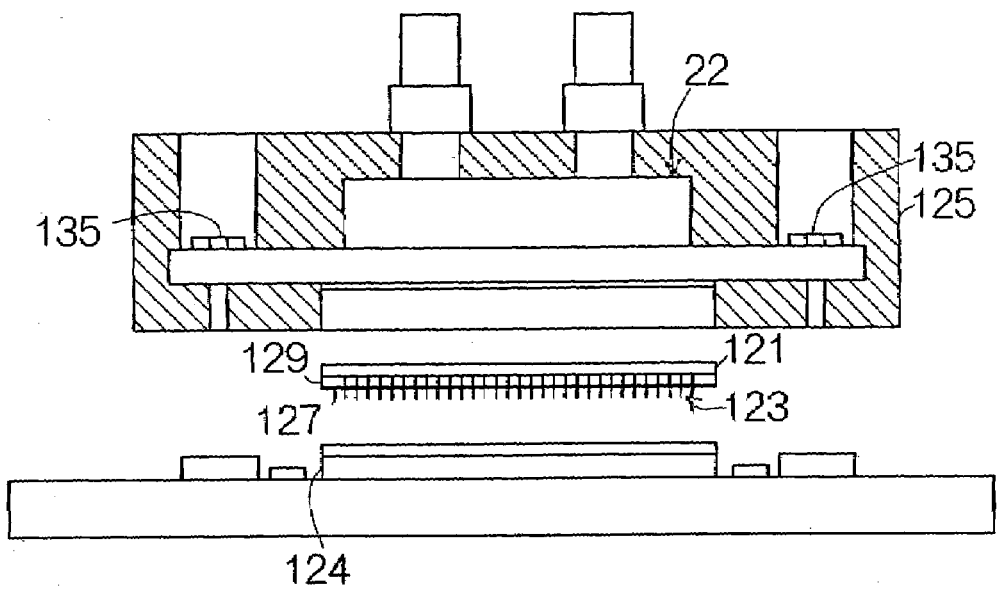
FIG. 24 is a sectional view illustrating the semiconductor device module according to another specific example.
Figure 25:
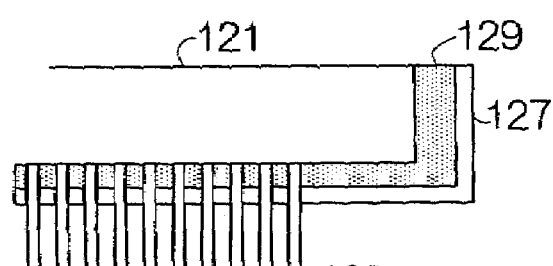
FIG. 25 is an enlarged partial view illustrating a film heater according to a specific modified example.
Figure 26:
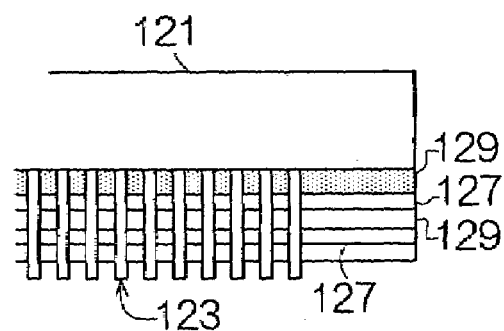
FIG. 26 is an enlarged partial view illustrating a film heater according to another specific modified example.
Figure 27:
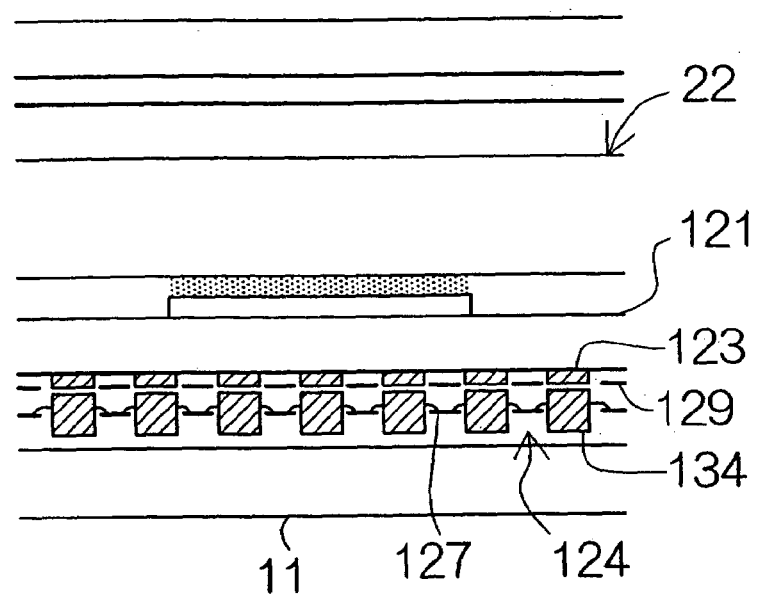
FIG. 27 is an enlarged sectional view partly illustrating a film heater according to a further specific modified example.

As shown in FIG. 24, the film heater 127 may be attached to the lower side of the small-sized printed circuit board 121. The input/output pins 123 are allowed to penetrate through the film heater 127 so as to enter the corresponding socket bores defined in the socket 124. A heat conductive film 129 may be interposed between the film heater 127 and the printed circuit board 121. The film heater 127 and/or the heat conductive film 129 may extend around the outer periphery of the printed circuit board 121, as shown in FIG. 25. Alternatively, a plurality of the film heaters 127 and the heat conductive film 129, alternately layered one another, may be attached to the printed circuit board 121, as shown in FIG. 26. Otherwise, the film heater 127 may be attached to the socket 124, as shown in FIG. 27. The film heater 127 is located offset to electric conductive member or pads 134 so as to surround the individual electric conductive member or pad 134 in the socket 124. The electric conductive members 134 are designed to receive the corresponding input/output pins 123 in the socket 124. The electric conductive members 134 may be embedded in the corresponding socket bores in the socket 124.

Figure 28:
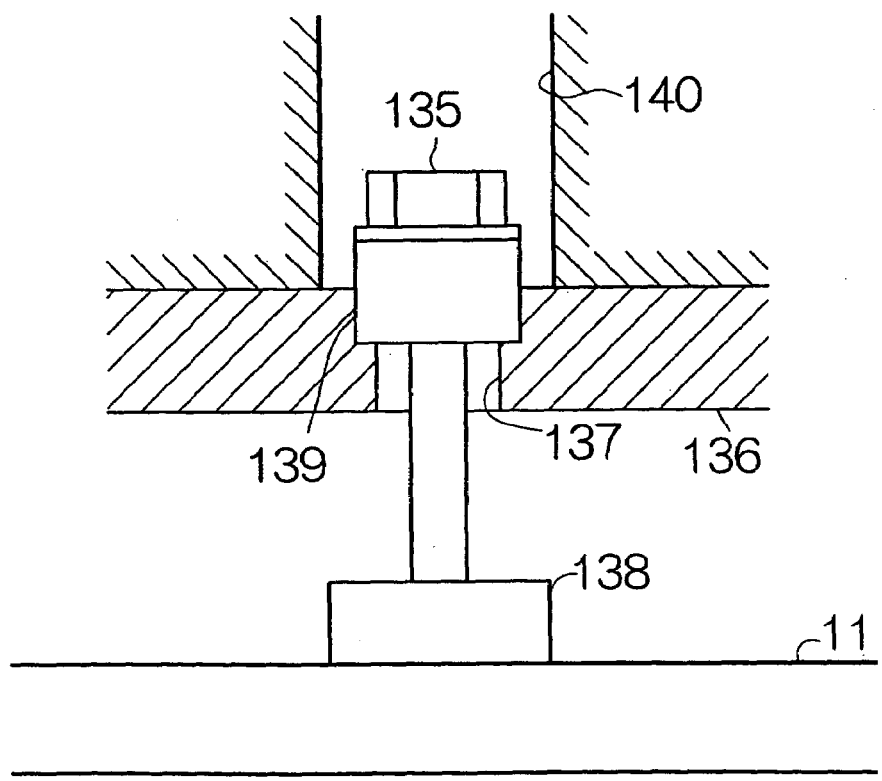
FIG. 28 is an enlarged sectional view illustrating a bolt for fixation.

As is apparent from FIG. 24, bolts 135 may be employed to fix the dry evaporator 22 to the large-sized printed circuit board 11. The bolts for fixation may be received in a through bore 137 defined in a heat transfer plate 136 of the dry evaporator 22, as shown in FIG. 28. The tip end of the individual bolt 135 is coupled to a corresponding screw nut 138 fixed to the large-sized printed circuit board 11. In this case, a low heat conductive member 139 is preferably interposed between the heat transfer plate 136 and the individual bolt 135. The low heat conductive member 139 serves to avoid heat transfer between the dry evaporator 22 and the large-sized printed circuit board 11 to the utmost. Accordingly, an excessive cooling of the large-sized printed circuit board 11 can be avoided. A receiving bore 140 may be defined in the heat insulator member 125 so as to receive the bolt 135 for fixation. The low heat conductive member 139 may be made from nylon of a higher insulation, for example.

Figure 29:
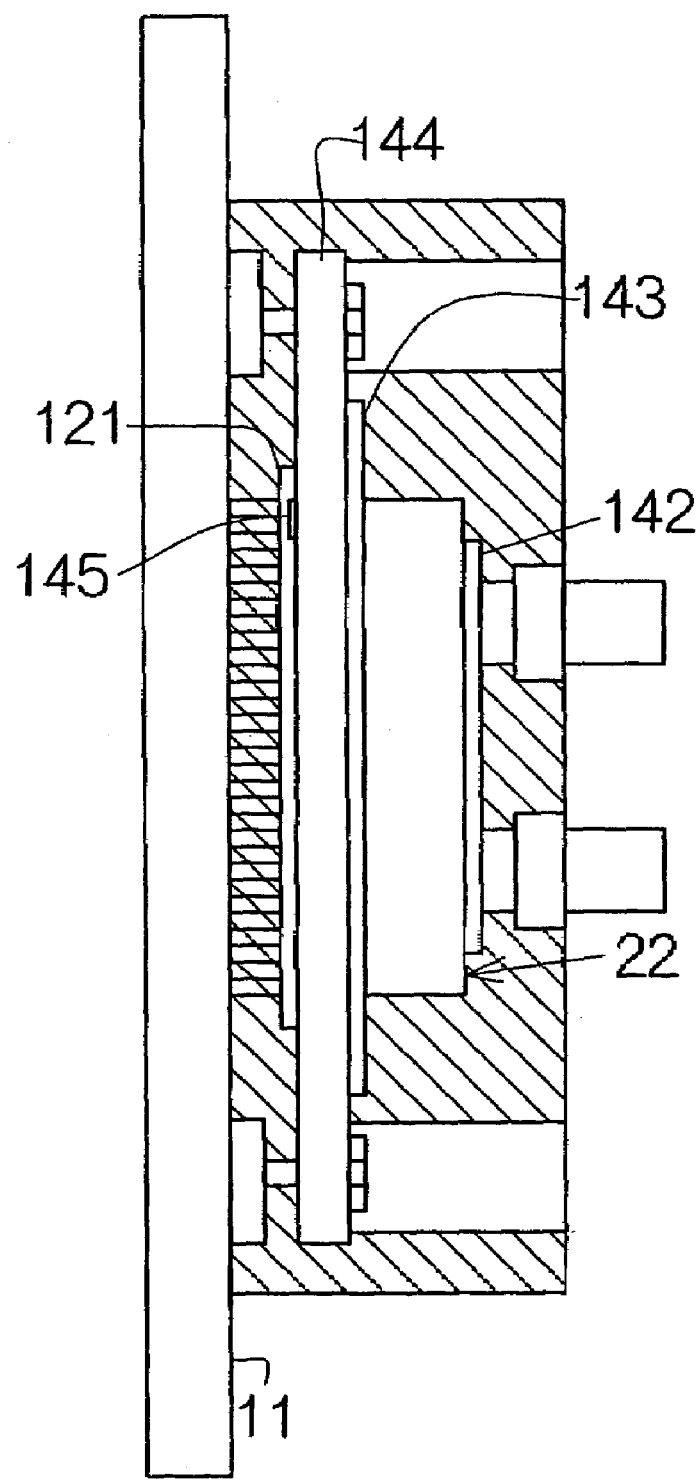
FIG. 29 is a side view illustrating the semiconductor device module according to a further specific example.
Figure 30:
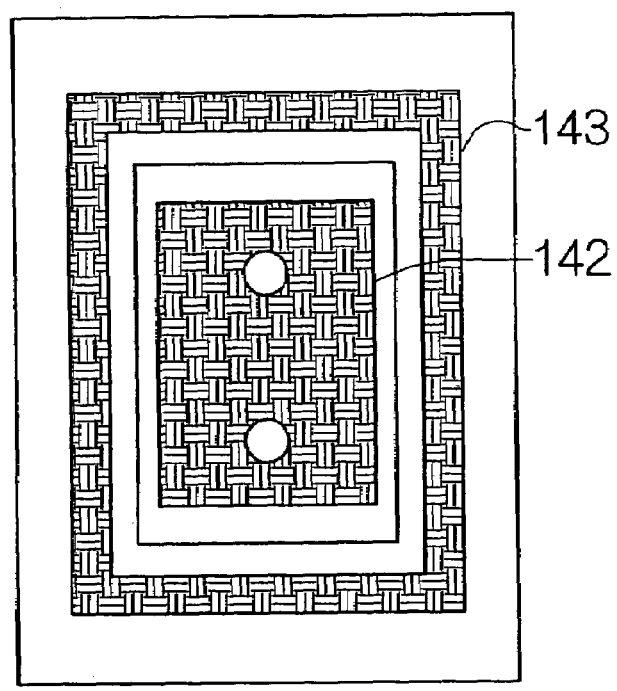
FIG. 30 is a plan view of the dry evaporator for illustrating the shape of a heater.
Figure 32:
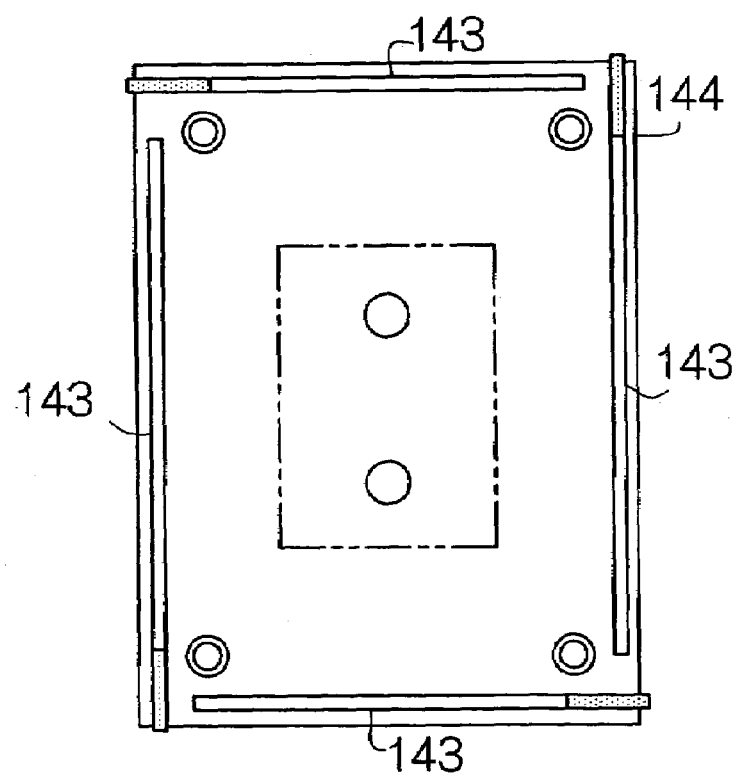
FIG. 32 is a sectional view, of the heat transfer plate, taken along the line 32—32 in FIG. 31.

Otherwise, the semiconductor device module 12 may comprise heaters 142, 143 directly attached to the dry evaporator 22, as shown in FIGS. 29 and 30, for example. The heaters 142, 143 are kept in contact with the surfaces of the dry evaporator 22 and the heat transfer plate 144. The heaters 142, 143 are in general utilized when the semiconductor device module 12 is to be removed or maintained. The heaters 142, 143 may be turned on only when the operation of the refrigeration system 13 is terminated. Heat from the heaters 142, 143 serves to heat the dry evaporator 22 and the heat transfer plate 143 which may have been cooled to a level below zero degrees Celsius, for example. If the semiconductor device enclosure unit 31 is opened after the dry evaporator 22 and the heat transfer plate 144 have been heated, the dry evaporator 22, the heat transfer plate 144 and the small-sized printed circuit board 121 can be prevented from condensation. Since the rise in temperature can be accelerated by the heaters 142, 143 as compared with the natural radiation of heat, the working time of replacement or maintenance can be shortened. The heater 143 may be embedded in the heat transfer plate 144, as shown in FIGS. 31 and 32, for example.

Figure 31:
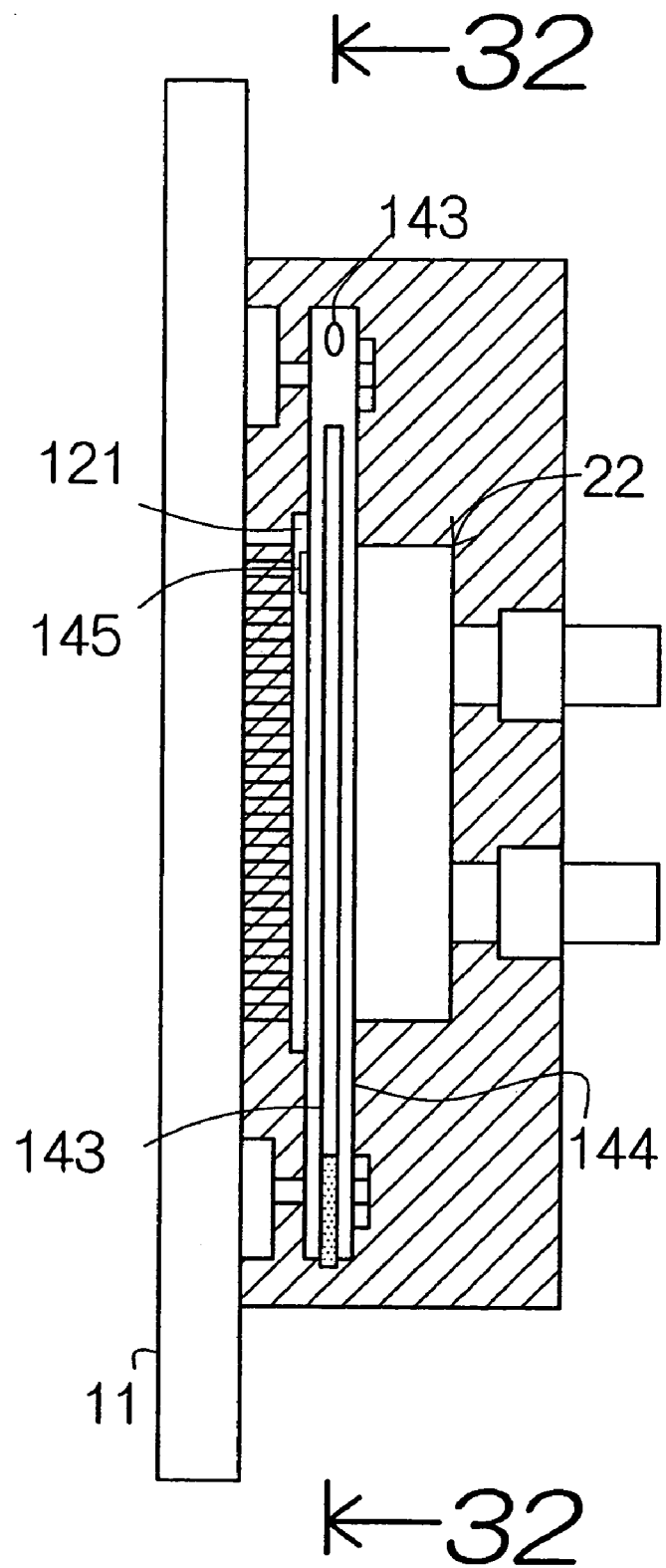
FIG. 31 is a sectional view illustrating the semiconductor device module according to a still further specific example.

When employment of the aforementioned heaters 142, 143 are intended, a thermal sensor 145 is preferably mounted on the small-sized printed circuit board 121, as shown in FIGS. 29 and 31. The thermal sensor 145 can be represented by a thermistor, for example. The thermal sensor 145 can be utilized to prevent an excessive rise in temperature by the heaters 142, 143, for example. Based on the temperature detected by the thermal sensor 145, the operation of the heaters 142, 143 can reliably be terminated before the small-sized printed circuit board 121 suffers from an excessive rise in temperature.

Figure 33:
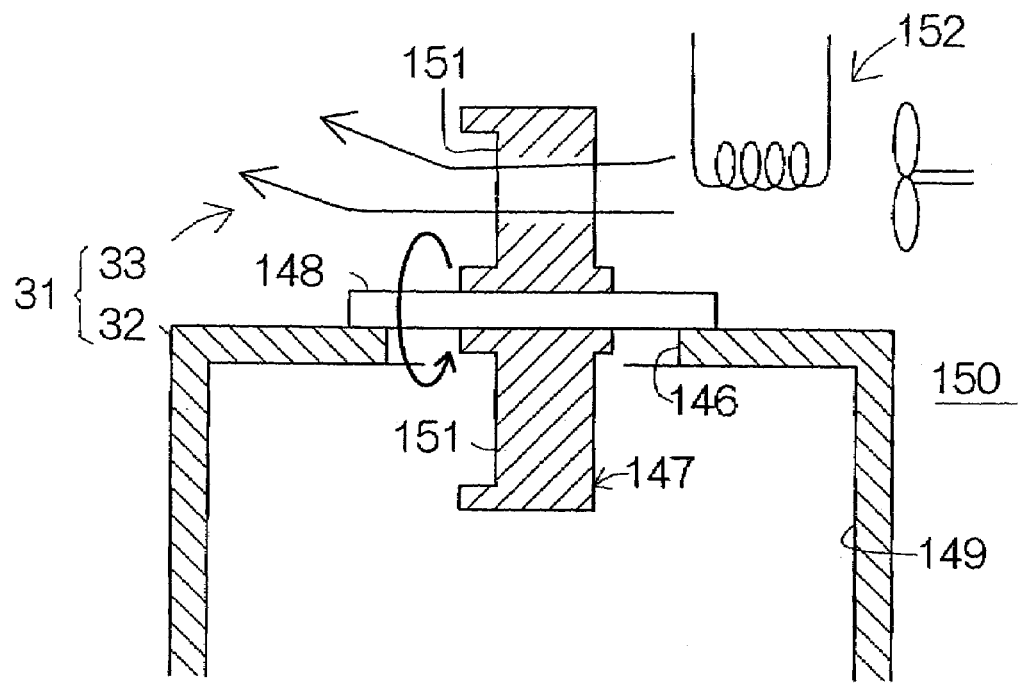
FIG. 33 is an enlarged sectional view of the semiconductor device enclosure unit for illustrating the dehumidifier according to a specific example.

FIG. 33 illustrates a specific example of the dehumidifier 33 incorporated in the semiconductor device enclosure unit 31. The humidifier 33 includes a rotor 147 disposed within an opening 146 defined in the box-shaped enclosure 32. The rotor 147 is designed to rotate around a rotational shaft 148 extending across the opening 146, for example. The rotor 147 is allowed to simultaneously protrude a closed space 149 within the box-shaped enclosure 32 and an open space 150 outside the box-shaped enclosure 32. The rotor 147 may include a plurality of vanes 151 extending in the radial directions from the rotational shaft 148. The respective vanes 151 may be made from a dehydrator such as silica gel, zeolite, and the like, for example. A fan heater 152 may be disposed in the open space 150 outside the box-shaped enclosure 32 so as to supply a hot air to the rotor 147.

When the rotor 147 is driven to rotate, the individual vane 151 is allowed to alternately enter the closed space 149 within the box-shaped enclosure 32 and the open space 150 outside the box-shaped enclosure 32 along the circular path around the rotational shaft 148. The dehydrator of the vane 151 catches the moisture in the closed space 149 within the box-shaped enclosure 32. When the vane 151 then moves into the open space 150 outside the box-shaped enclosure 32 from the closed space 149 within the box-shaped enclosure 32, the moisture caught by the dehydrator can be released at the open space 150. The release of the moisture can be promoted by the hot air supplied from the fan heater 152. The vane 151 enters the closed space 149 again after the release of the moisture in the open space 150.

In this manner, the individual vane 151 is allowed to pass through the closed space 149 within the box-shaped enclosure 32 and the open space 150 outside the box-shaped enclosure 32 alternately, so that a dry atmosphere can be maintained within the box-shaped enclosure 32. Such a dry atmosphere serves to establish a lower dew point within the box-shaped enclosure 32. Accordingly, it is possible to further reliably prevent condensation and/or frost on the surfaces of the dry evaporator 22 and the large-sized printed circuit board 11 as well as the surface of the ductwork, defining the circulation channel 14 in the box-shaped enclosure 32.

In particular, if the dehydrator is made from zeolite, the dry atmosphere can be maintained in the box-shaped enclosure 32 for a longer time irrespective of the environment in which the large-sized computer 10 is located. On the other hand, particles of nicotinic acid amid, often included in a smoke of cigarette, for example, tends to deteriorate silica gel. If silica gel is employed as the dehydrator, the large-sized computer 10 should be located in a clean environment.

Figure 34:
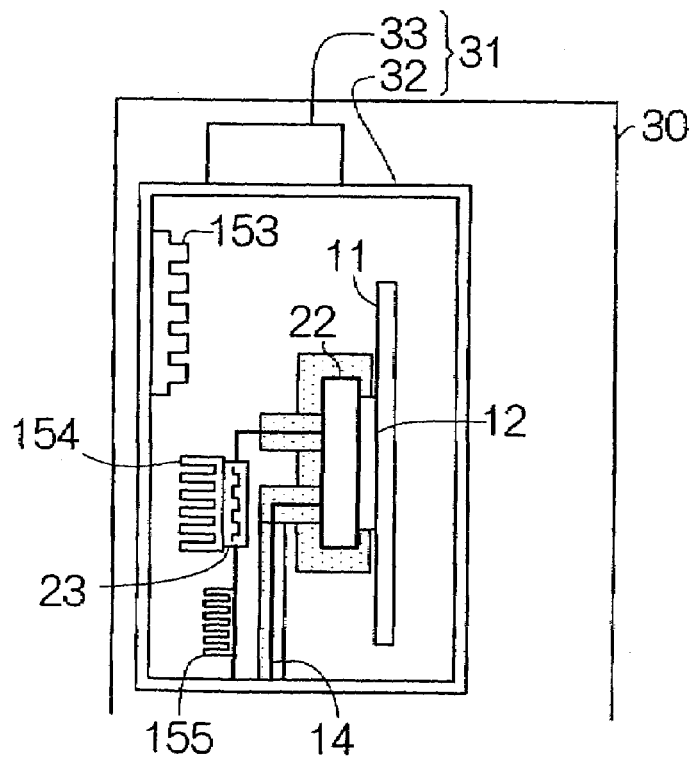
FIG. 34 is an enlarged sectional view of the semiconductor device enclosure unit according to another specific example.

As shown in FIG. 34, a heater 153 may be disposed in the box-shaped enclosure 32 so as to heat the atmosphere in the box-shaped enclosure 32, for example. The heater 153 can be operated when the semiconductor device module 12 is replaced or maintained. The heat from the heater 153 serves to heat the atmosphere within the box-shaped enclosure 32. When the atmosphere in the box-shaped enclosure 32 is heated, a rise in temperature can be established on the inner surface of the box-shaped enclosure 32 and the semiconductor device module 12. If the semiconductor device enclosure unit 31, namely, the box-shaped enclosure 32 is opened after the atmosphere has been heated in the aforementioned manner, it is possible to prevent condensation on the inner surface of the box-shaped enclosure 32 and the semiconductor device module 12. Since the rise in temperature can be accelerated as compared with the natural radiation of heat, the working time of replacement or maintenance can remarkably be shortened.

In this case, heat exchangers 154, 155 may be disposed within the box-shaped enclosure 43 of the semiconductor device enclosure unit 31, in addition to the aforementioned heater 153, as is apparent from FIG. 34. The heat exchangers 154, 155 are coupled to the subsidiary evaporator 23 and the circulation channel 14, respectively. The heater 153 and the heat exchangers 154, 155 serve to control the temperature in the box-shaped enclosure 32 during the operation of the refrigeration system 13. If the control in temperature by the heater 153 and the heat exchangers 154, 155 serves to prevent an excessive drop in temperature, the box-shaped enclosure 32 can be prevented from condensation and/or frost on the outer surface. It is possible to reduce the thickness or volume of a heat insulator, not shown, attached to the outer surface of the box-shaped enclosure 32, or completely omit such a heat insulator. If the aforementioned control in temperature serves to prevent an excessive rise in temperature, the semiconductor device module 12 can continuously be cooled down in an efficient manner.

Figure 35:
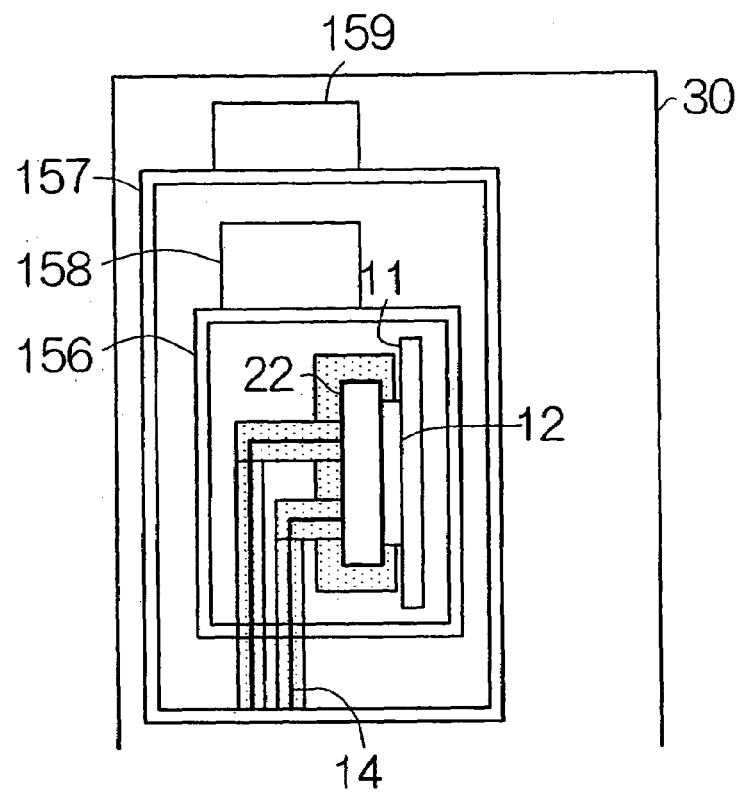
FIG. 35 is an enlarged sectional view of the semiconductor device enclosure unit according to a further specific example.

FIG. 35 illustrates the structure of the semiconductor device enclosure unit 31 according to another specific example. The semiconductor device enclosure unit 31 includes a first or inner box-shaped enclosure 156 airtightly containing the large-sized printed circuit board 11 and the dry evaporator 22 closely contacting the semiconductor element on the large-sized printed circuit board 11, and a second or outer box-shaped enclosure 157 airtightly containing the first box-shaped enclosure 156. A first dehumidifier 158 is attached to the first box-shaped enclosure 156 of the same structure as the aforementioned dehumidifier 33. Likewise, a second dehumidifier 159 is attached to the second box-shaped enclosure 157 of the same structure as the aforementioned dehumidifier 33. The first dehumidifier 158 is designed to release moisture from the closed space within the first box-shaped enclosure 156 to the outside of the first box-shaped enclosure 156, namely, the closed space defined between the first and second box-shaped enclosures 156, 157 within the second box-shaped enclosure 157. The second dehumidifier 159 is designed to release moisture from the closed space within the second box-shaped enclosure 157 to the open space outside the second box-shaped enclosure 157. With this arrangement, the moisture can reliably be released out of the first box-shaped enclosure 156 into the open space in an efficient manner. Even when the atmosphere in the first box-shaped enclosure 156 reaches a cryogenic temperature, it is possible to reliably prevent condensation and/or frost within the first box-shaped enclosure 156.

Figure 36:
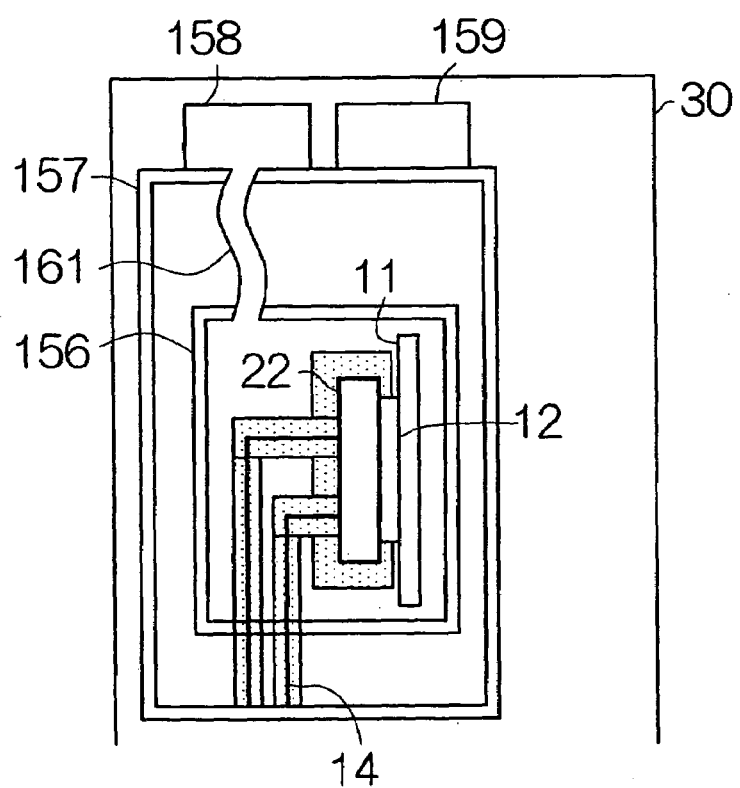
FIG. 36 is an enlarged sectional view of the semiconductor device enclosure unit according to a modification of the further specific example.

As shown in FIG. 36, the aforementioned first dehumidifier 158 may be attached to the second box-shaped enclosure 157 in the above-described semiconductor device enclosure unit 31, for example. An air duct 161 may be employed to connect the closed space within the first box-shaped enclosure 156 and the first dehumidifier 158 to each other. The air duct 161 is designed to extend across the closed space within the second box-shaped enclosure 157. Such location of the first dehumidifier 158 contributes to reduction in the closed space within the second box-shaped enclosure 157, so that the second box-shaped enclosure 157, namely, the entire semiconductor device enclosure unit 31 can be made compact. It is preferable that the air duct 161 has an elasticity enough to deform to some extent.

Figure 37:
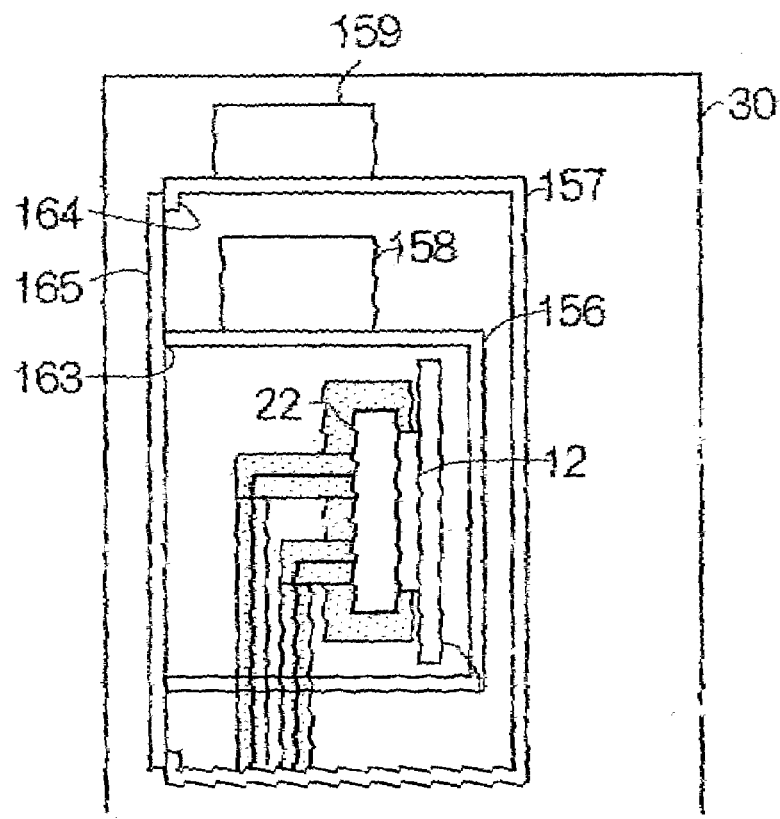
FIG. 37 is an enlarged sectional view of the semiconductor device enclosure unit according to another modification of the further specific example.
Figure 38:
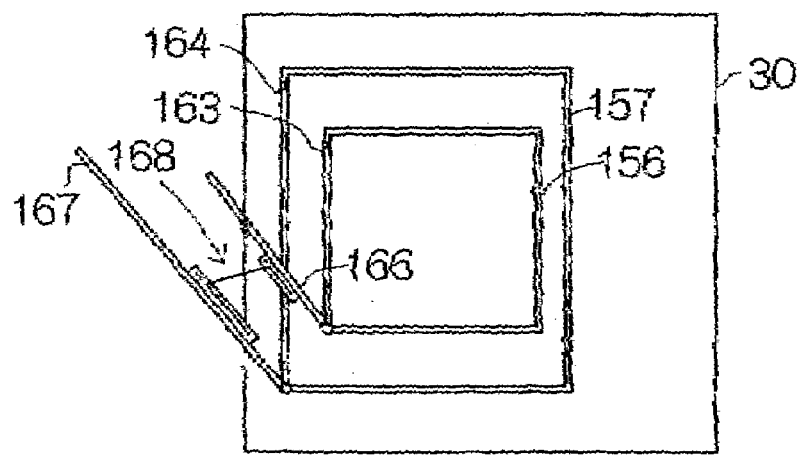
FIG. 38 is an enlarged sectional view of the semiconductor device enclosure unit according to a further modification of the further specific example.

In the case where the semiconductor device enclosure unit 31 includes the first and second box-shaped enclosures 156, 157 as described above, a common single door 165 is preferably attached to the first and second box-shaped enclosures 156, 157 so as to close together openings 163, 164 defined in the first and second box-shaped enclosures 156, 157, as shown in FIG. 37, for example. When the semiconductor device module 12 is to be replaced or maintained, the closed spaces within the first and second box-shaped enclosure 156, 157 should sequentially be opened. The common single door 165 serves to allow the closed spaces in the first and second box-shaped enclosures 156, 157 to be opened with a single opening operation. Accordingly, the operability can be improved at the time of replacement or maintenance for the semiconductor device module 12. In place of the common single door 165, an interlocking mechanism 168 may be established between doors or flappers 166, 167 attached to the first and second box-shaped enclosures 156, 157, respectively, as shown in FIG. 38, for example. The interlocking mechanism 168 is designed to cause the opening and closing motion of the door 166 in response to the opening and closing motion of the door 167.

Figure 39:
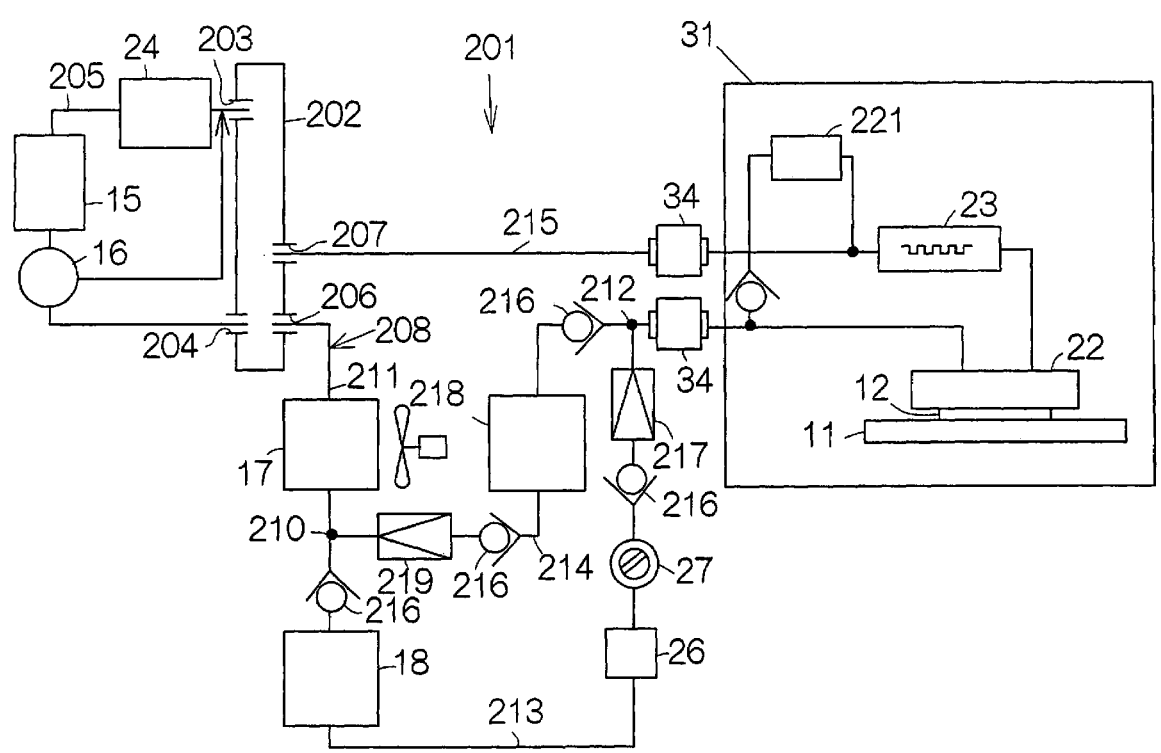
FIG. 39 schematically illustrates the structure of a refrigeration system of a closed cycle according to a second embodiment of the present invention.

FIG. 39 schematically illustrates the structure of a refrigeration system of a closed cycle according to a second embodiment of the present invention. The refrigeration system 201 of this embodiment includes a first circulation channel 205 extending from a first discharge port 203 of a switching valve 202 to a first suction port 204 of the switching valve 202, and a second circulation channel 208 extending from a second discharge port 206 of the switching valve 202 to a second suction port 207 of the switching valve 202. An accumulator.24, a compressor 15 and an oil separator 16 are sequentially connected in serial to the first discharge port 203 in the first circulation channel 105. The accumulator 24, the compressor 15 and the oil separator 16 may have the same structure as those included in the aforementioned refrigerant system 13 of the first embodiment.

The second circulation channel 208 includes a first bidirectional passage 211 extending from the second discharge port 206 to a first bifurcated point 210, first and second one-way passages 213, 214 respectively extending from the first bifurcated point 210 to a second bifurcated point 212, and a second bidirectional passage 215 extending from the second bifurcated point 212 to the second suction port 207. The first one-way passage 213 is designed to allow the refrigerant to flow from the first bifurcated point 210 to the second bifurcated point 212 and restrain the flow of refrigerant from the second bifurcated point 212 to the first bifurcated point 210. On the other hand, the second one-way passage 214 is designed to restrain the flow of the refrigerant from the first bifurcated point 210 to the second bifurcated point 212 and to allow the refrigerant to flow from the second bifurcated point 212 to the second suction port 207. Check valves 216 may be incorporated in the first and second one-way passages 213, 214, respectively, so as to achieve the aforementioned controlled flow of the refrigerant.

A condenser 17, a dry evaporator 22 and a subsidiary evaporator 23 are incorporated in the first and second bidirectional passages 211, 215 in the same manner as the aforementioned first embodiment. A first expansion valve 217 is likewise incorporated in the first one-way passage 213 downstream of the receiver 18. Otherwise, a strainer 26 and an observation window 27 may likewise be incorporated in the first one-way passage 213 in the aforementioned manner.

A receiver 218 is also incorporated in the second one-way passage 214 downstream of the second bifurcated point 212. A second expansion valve 219 is incorporated in the second one-way passage 214 downstream of the receiver 218. The receiver 218 and the second expansion valve 219 may have the same structure as the aforementioned receiver 18 and first expansion valve 217.

Figure 40:
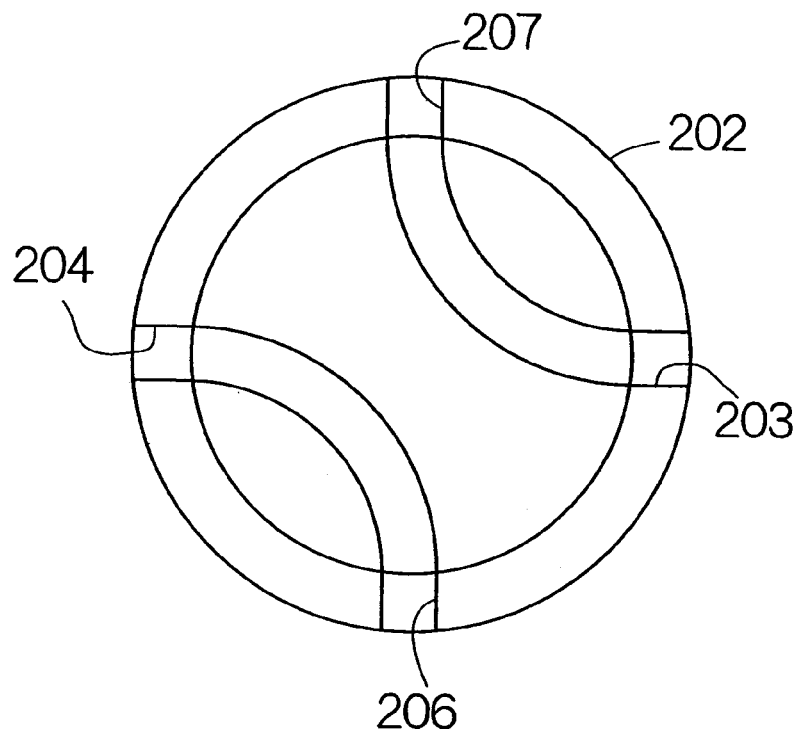
FIG. 40 is an enlarged sectional view illustrating a switching valve.

Assume that the switching valve 202 is operated to establish connection between the first suction port 204 and the second discharge port 206, as shown in FIG. 40, for example. In this case, the second suction port 207 is connected to the first discharge port 203 in the switching valve 202. Accordingly, the refrigerant discharged from the second discharge port 206 is led to the second bidirectional passage 215 through first bidirectional passage 211 and the first one-way passage 213 during the operation of the compressor 15. The dry evaporator 22 cools the semiconductor device module 12 in the aforementioned manner. The quality of the refrigerant in the dry evaporator 22 is maintained at a level below 1.0, for example, at a level below approximately 0.85. A higher performance of cooling can thus be established in the dry evaporator 22 in the aforementioned manner. The subsidiary evaporator 23 serves to completely transform the refrigerant of gas-liquid mixture state, discharged from the dry evaporator 22, into the refrigerant of gas state, namely, the refrigerant gas.

Figure 41:
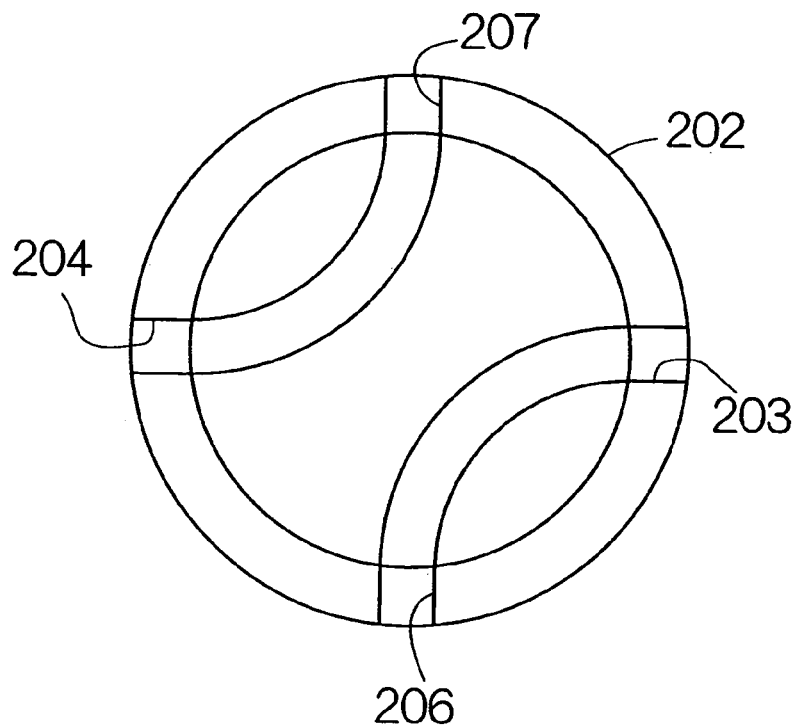
FIG. 41 is an enlarged sectional view illustrating the switching valve.

Here, assume that the semiconductor device module 12 is to be replaced or maintained. The semiconductor device enclosure unit 31 should be opened prior to replacement or maintenance of the semiconductor device module 12. As shown in FIG. 41, the switching valve 202 is switched over, for example, before the semiconductor device enclosure unit 31 is opened. The changeover causes the first and second suction ports 204, 207 to be connected to each other in the switching valve 202. The refrigerant is allowed to flow out of the second suction port 207 of the switching valve 202. The discharged refrigerant is led to the first bidirectional passage 211 through the second bidirectional passage 215 and the second one-way passage 214.

When the refrigerant is allowed to circulate in the reverse direction in the second circulation channel 208 in this manner, the dry evaporator 22 and the subsidiary evaporator 23 are allowed to function as a condenser, while the condenser 17 is forced to function as a dry evaporator. Accordingly, the dry evaporator 22 and the subsidiary evaporator 23 heat the semiconductor device module 12, the large-sized printed circuit board 11 and the atmosphere within the semiconductor device enclosure unit 31. If the semiconductor device enclosure unit 31, namely, the box-shaped enclosure 32 is opened to the open air after heating has been effected by the evaporators 22, 23, condensation and the like can reliably be prevented on the inner surface of the box-shaped enclosure 32 and the semiconductor device module 12. Since the rise in temperature can be accelerated as compared with the natural radiation of heat, the working time of replacement or maintenance can remarkably be shortened.

As is apparent from FIG. 39, a heater 221 is incorporated in the refrigeration system 201 in parallel with the dry evaporator 22 and the subsidiary evaporator 23. The heater 221 is in general utilized only when the refrigerant circulates along the second circulation channel 208 in the reverse direction. The heater 221 serves to completely condense the refrigerant directed to the receiver 218. A smaller heat transfer area can only be established in the dry evaporator 22 and the subsidiary evaporator 23 as compared with the condenser 17 in the aforementioned refrigeration system 201. Without the heater 221, an enough performance of condensing cannot be achieved at the dry evaporator 22 and the subsidiary evaporator 23 irrespective of a relatively higher performance of cooling at the condenser 17.

Figure 42:
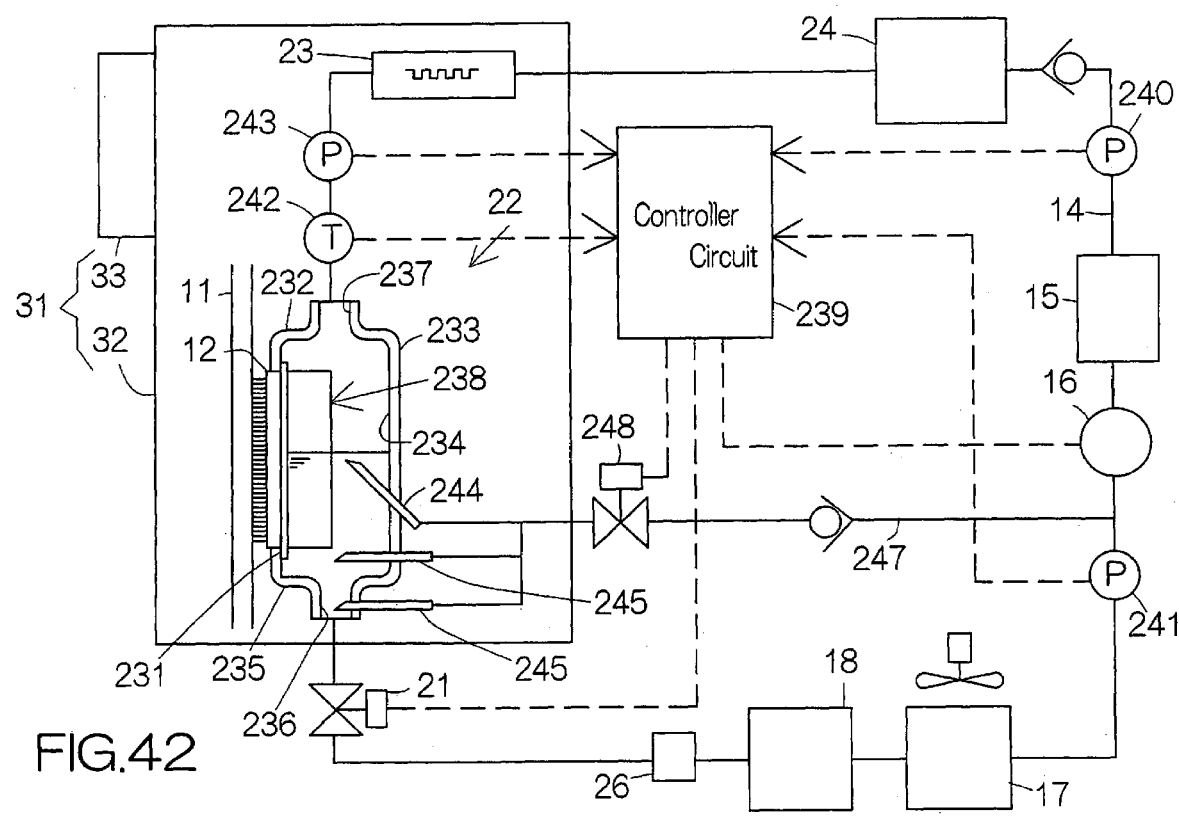
FIG. 42 schematically illustrates the structure of a refrigeration system of a closed cycle according to a second embodiment of the present invention.

FIG. 42 schematically illustrates a refrigeration system of a closed cycle according to a third embodiment of the present invention. The refrigeration system 230 includes a circulation channel 14 in the same manner as the aforementioned refrigeration system 13. A compressor 15, a condenser 17, a receiver 18, an expansion valve 21, a dry evaporator 22, a subsidiary evaporator 23 and an accumulator 24, in addition to the other components such as an oil separator 16 and a strainer 26, are incorporated in the circulation channel 14 in the same manner as the refrigeration system 13.

The dry evaporator 22 includes a casing 232 contacting an target heating object such as the semiconductor device module 12 at a vertical heat transfer plate 231, as shown in FIG. 42. A closed space or vaporization chamber 234 is defined between the heat transfer plate 231 and a back plate 233 extending in parallel with the heat transfer plate 231 in the casing 232. The vaporization chamber 234 is allowed to extend in a vertical direction along the heat transfer plate 231 from a bottom plate 235 upright to the heat transfer plate 231. The bottom plate 235 is designed to extend in a horizontal direction from the heat transfer plate 231 so as to reach the back plate 233 at the tip end. The casing 232 may be made from a high heat conductive material such as a copper material, for example.

A refrigerant inlet 236 is defined to open at the lowest position into the vaporization chamber 234 so as to introduce the refrigerant into the vaporization chamber 234. A refrigerant outlet 237 is defined to open at the highest position into the vaporization chamber 234 so as to allow the refrigerant to flow out of the vaporization chamber 234. A fin aggregate 238 is integrally formed on the heat transfer plate 231 so as to define refrigerant passages extending in a vertical direction from the refrigerant inlet 236 to the refrigerant outlet 237, respectively. The structure of the fin aggregate 238 will be described later in detail.

The refrigeration system 230 is designed to allow a gas-liquid separation at the vaporization chamber 234. The gas-liquid separation can be achieved based on the flow or current of the refrigerant from a flow or current controller such as the expansion valve 21. A proper management on the operation of the compressor 15 and the expansion valve 21 serves to control the flow or current of the refrigerant. A controller circuit or unit 239 can be employed to manage the operation of the compressor 15 and the expansion valve 21. The controller circuit 239 is designed to calculate the compression ratio for the compressor 15 based on the output received from pressure sensors 240, 241, for example. The pressure sensors 240, 241 are incorporated in the circulation channel 14 upstream and downstream of the compressor 15, respectively. The controller circuit 239 is also designed to utilize the output from a thermal sensor 242 and a pressure sensor 243 incorporated in the circulation channel 14 downstream of the dry evaporator 22, for example. If the gas-liquid separation can be achieved in this manner, the refrigerant liquid is allowed to stay on the bottom plate 235 within the vaporization chamber 234 under the influence of the gravity. The refrigerant liquid is thus uniformly distributed into the respective refrigerant passages defined in the fin aggregate 238.

First and second jet nozzles 244, 245 are attached to the casing 232 so as to insert the tip ends into the vaporization chamber 234, respectively. As is apparent from FIG. 42, the extension of the axial line of the first jet nozzle 244 is designed to interest the surface of the refrigerant liquid staying at the bottom of the vaporization chamber 234 and is directed toward the fin aggregate 238. The second jet nozzle 245 is designed to position its tip end or spout between the fin aggregate 238 and the refrigerant inlet 236. A bypass duct defining a bypass channel 247 is connected to the first and second jet nozzles 244, 245. The bypass channel 247 is designed to diverge from the circulation channel 14 downstream of the compressor 15 and the oil separator 16.

During the operation of the compressor 15, the refrigerant of gas state, namely, the refrigerant gas, discharged from the compressor 15 at a high pressure, is supplied to the first and second jet nozzles 244, 245 through the bypass channel 247. When the refrigerant gas is allowed to spout out of the first jet nozzle 244, the refrigerant liquid splashes upward from the surface of the refrigerant liquid at the bottom of the vaporization chamber 234. The splashed refrigerant liquid is directed to the fin aggregate 238. The splashed refrigerant liquid is allowed to stick to the fin aggregate 238 on the heat transfer plate 231. In this manner, the refrigerant liquid is held on the heat transfer plate 231 over a broader area. The vaporization of the refrigerant can be promoted in the vaporization chamber 234.

When the refrigerant gas is supplied to the second jet nozzle 245 through the bypass channel 237, the refrigerant gas is forced to spout out of the second jet nozzle 245. The refrigerant gas serves to stir the refrigerant liquid at the bottom of the vaporization chamber 234. Such stir of the refrigerant liquid in the vicinity of the refrigerant inlet 236 contributes to a uniform influent of the refrigerant liquid into the vaporization chamber 234.

As is apparent from FIG. 42, an electronic controlled valve 248 may be incorporated in the bypass channel 247 so as to control the flow or current of the refrigerant gas passing through the bypass channel 247. The control of the flow or current in the bypass channel 247 is allowed to adjust the jet amount of the refrigerant gas introduced into the vaporization chamber 234 at a high pressure. It is accordingly possible to properly control the vapor pressure within the vaporization chamber 234. If the vapor pressure can properly be controlled in this manner, the boiling point of the refrigerant can properly be adjusted in the vaporization chamber 234.

Figure 43:
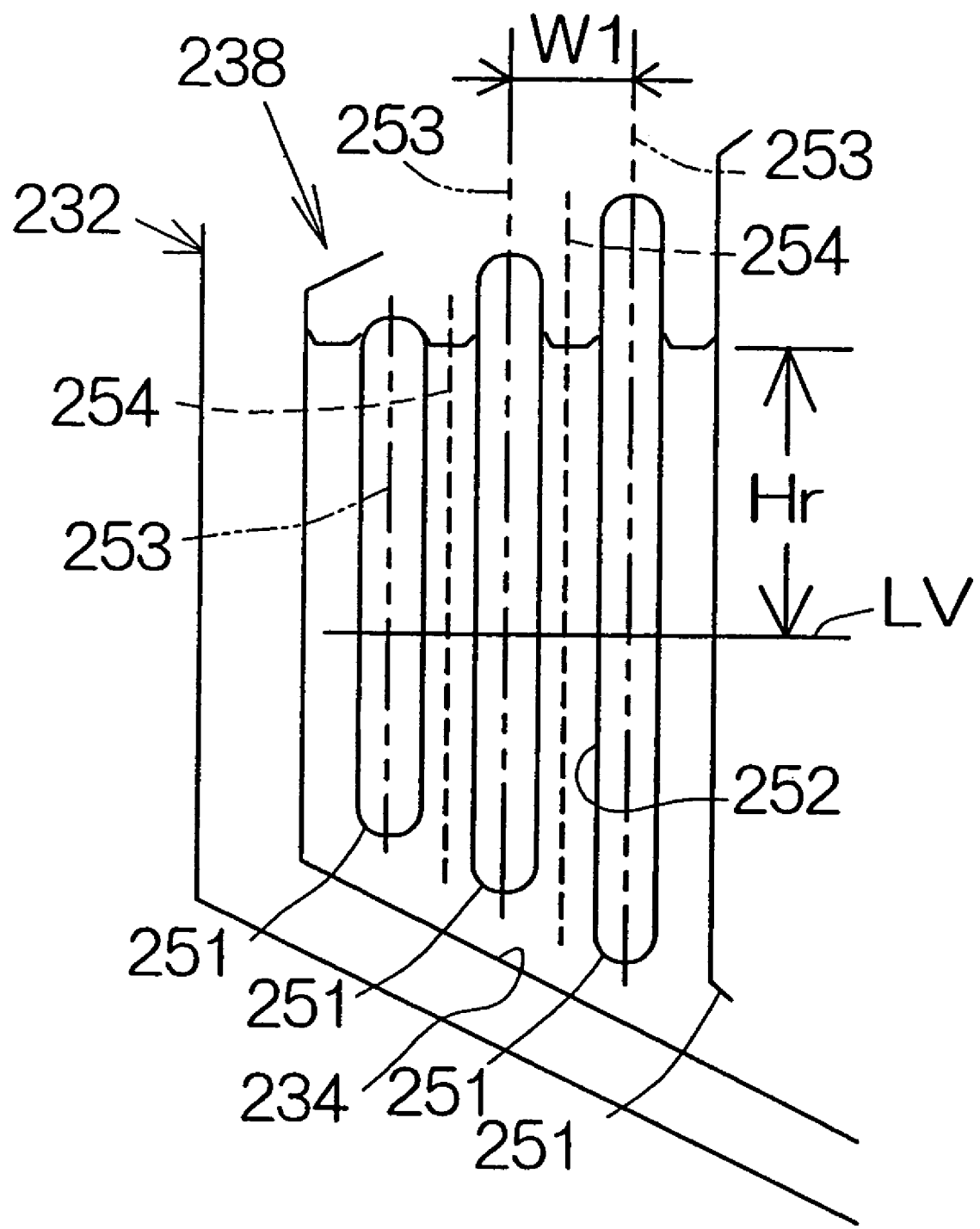
FIG. 43 is an enlarged partial plan view of the heat transfer plate for illustrating the structure of a fin aggregate within the vaporization chamber.

As shown in FIG. 43, the fin aggregate 238 includes a plurality of fins 251 raised from the surface of the heat transfer plate 231 and extending in a vertical direction, for example. Micro channels 252 are defined between the adjacent fins 251, respectively. The individual micro channel 252 is designed to have a lateral width W1 enough to realize the capillary action of the refrigerant liquid. The fin aggregate 238 serves to induce an ascent of the refrigerant liquid from the bottom of the vaporization chamber 234 along the micro channel 252. Accordingly, the fin aggregate 238, namely, the heat transfer plate 231 is allowed to hold the refrigerant liquid over a broader area irrespective of the level LV of the refrigerant liquid at the bottom of the vaporization chamber 234. The vaporization of the refrigerant liquid is thus be accelerated. It should be noted that the level Hr of the ascent within the micro channel 252 can be controlled based on the surface tension of the refrigerant liquid and the lateral width W1 of the micro channel 252.

Figure 44:
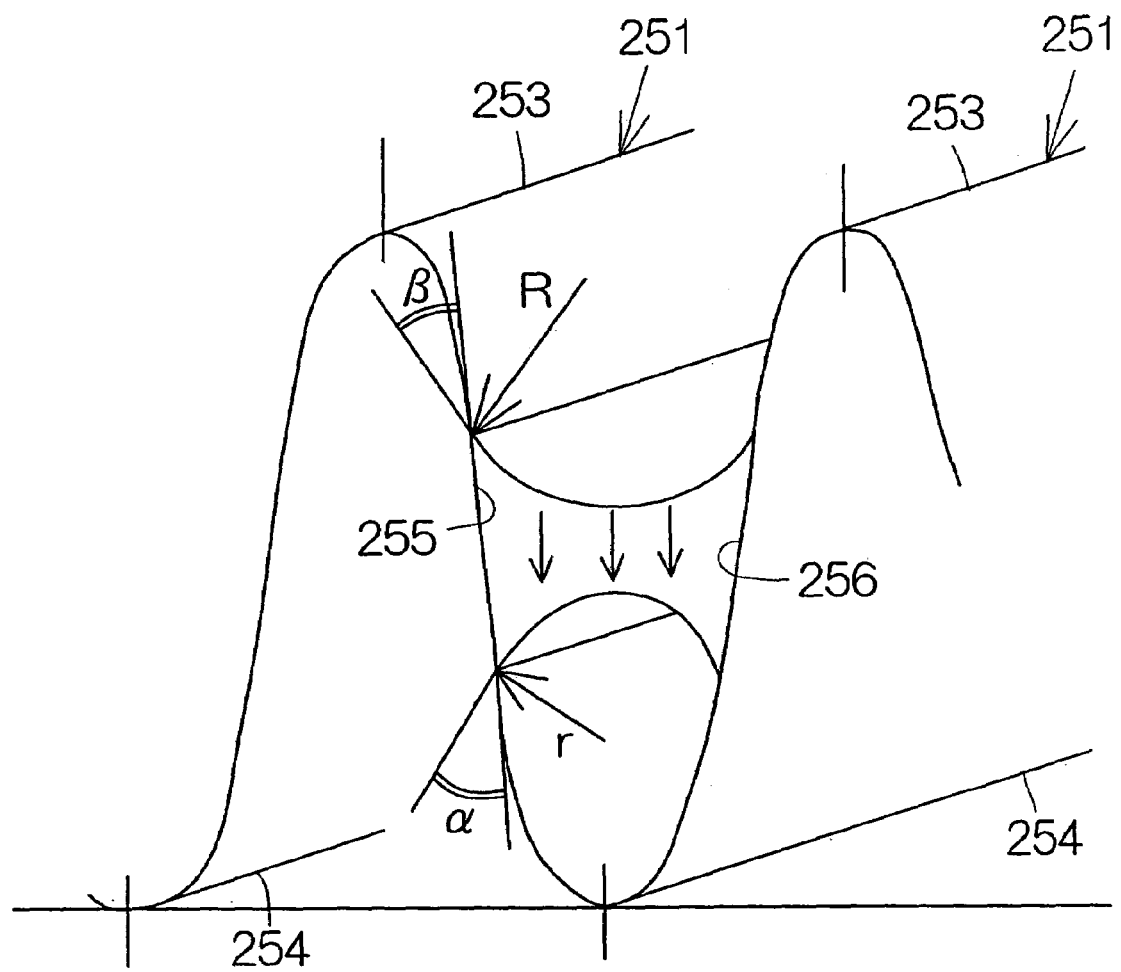
FIG. 44 is a sectional perspective view taken along the line 44—44 in FIG. 43.

Referring also to FIG. 44, the edges or ridgelines 253 of the respective fins 251 are designed to extend in parallel with each other. A datum line 254 is defined between the adjacent ridgelines 253 so as to extend in parallel with the adjacent ridgelines 253. A first wall surface 255 extends from the ridgeline 253 of one of the adjacent fins 251 to the common datum line 254, while a second wall surface 256 extends from the ridgeline 253 of the other of the adjacent fins 251 to the aforementioned common datum line 254. The first and second wall surfaces 255, 256 are opposed to each other. The first and second wall surfaces 255, 256 are connected to each other at the common datum line 254. The first and second surface walls 255, 256 extend along the common datum line 254.

The first and second wall surfaces 255, 256 comprises a curved surface extending from the ridgeline 253 to the datum line 254. Accordingly, the space between the first and second wall surfaces 255, 256 gets larger as the first and second wall surfaces 255, 256 are distanced apart from the common datum line 253, as is apparent from FIG. 44. In this case, the refrigerant liquid exhibits a first surface tension F1 at the surface opposed to the surface of the refrigerant liquid between the first and second wall surfaces 255, 256, based on the radius of curvature r of its surface and the relative angle α to the first and second wall surfaces 255, 256. On the other hand, the refrigerant liquid also exhibits a second surface tension F2 at the surface opened to the ridgelines 253 based on the radius of curvature R of its surface and the relative angle β to the first and second wall surfaces 255, 256. As is extracted from the following equation, the first surface tension F1 is remarkably larger than the second surface tension F2:

$$F1 = \frac{2\sigma\cos\alpha}{r} \gg \frac{2\sigma\cos\beta}{R} = F2 \qquad \text{[Equation 1]}$$

When the refrigerant liquid is squirted in the micro channel 252, a larger surface tension F1 can be generated at the surface of the refrigerant on the side of datum line 254, so that the refrigerant liquid is sucked toward the datum line 254, namely, into the bottom of the micro channel 252, based on the difference between the first and second surface tensions F1, F2. Consequently, a larger quantity of the refrigerant liquid can reliably be held between the first and second wall surfaces 255, 256. The vaporization of the refrigerant liquid is thus promoted.

Figure 45:
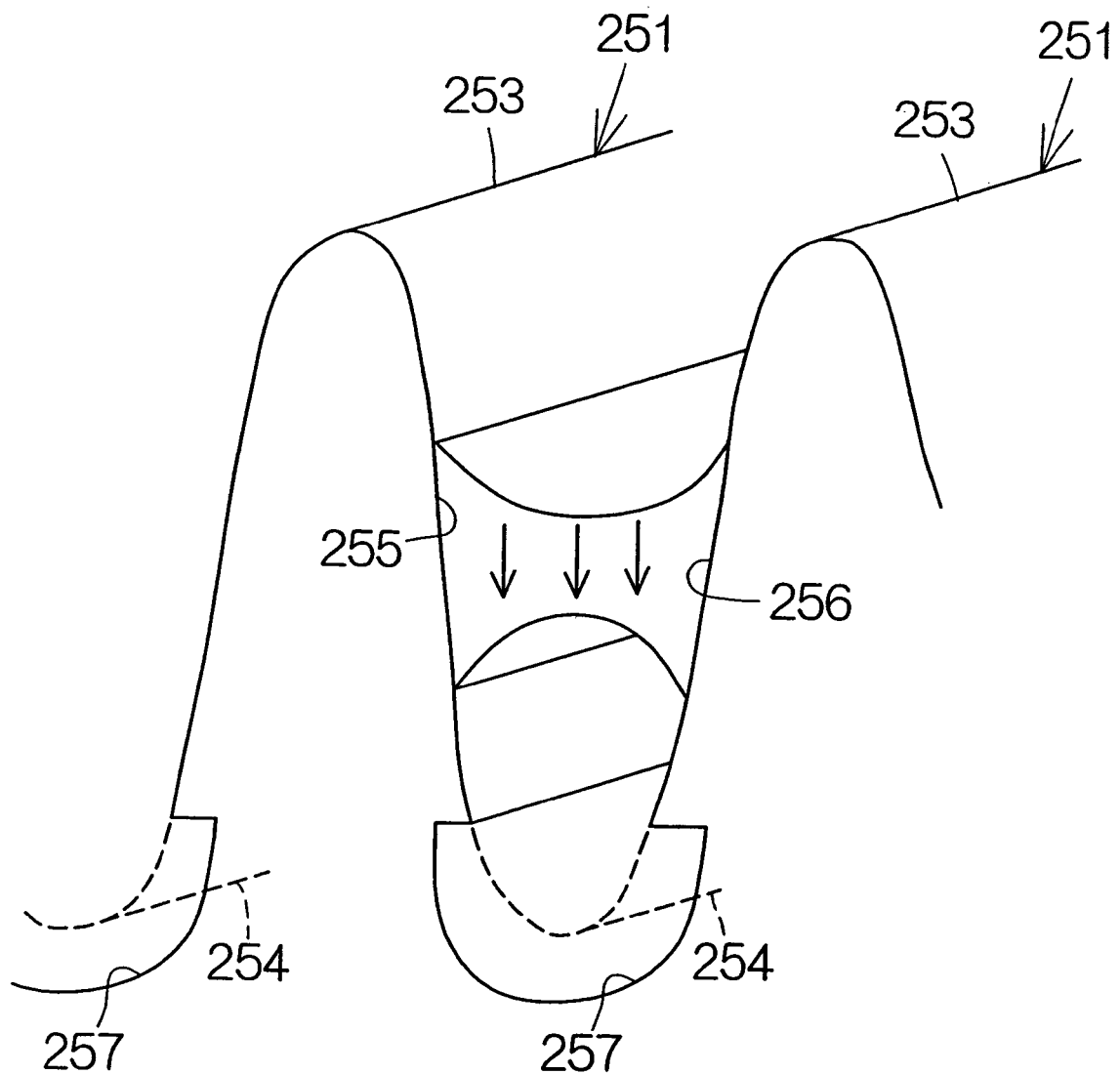
FIG. 45 is a sectional perspective view illustrating the fin aggregate according to another specific example.

As shown in FIG. 45, the micro channel 252 may further include an expanded groove 257 defined between the first and second wall surfaces 255, 256, for example. The expanded groove 257 extends along the datum line 254. The expanded groove 257 serves to still reliably hold the refrigerant liquid introduced between the first and second wall surfaces 255, 256. The vaporization of the refrigerant liquid can still further be accelerated.

Figure 46:
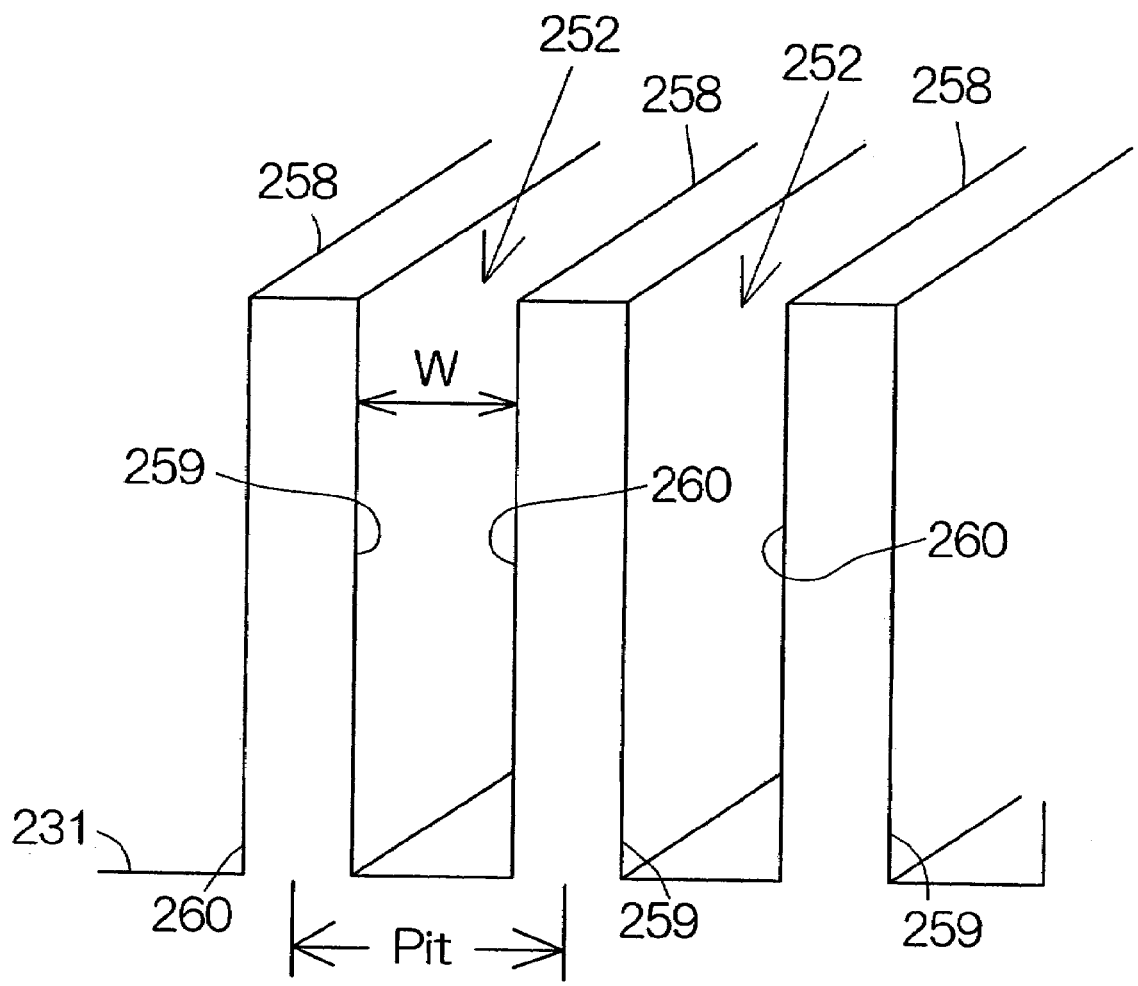
FIG. 46 is a sectional perspective view illustrating the fin aggregate according to a further specific example.

As shown in FIG. 46, the fin aggregate 238 may comprise a plurality of plate-shaped fins 258, in place of the aforementioned fins 251, so as to hold the refrigerant liquid within the micro channels 252, for example. The plate-shaped fins 258 are designed to stand from the surface of the heat transfer plate 231, respectively, so as to extend in parallel with each other at a pitch Pit smaller than 1.0 mm, for example. A first wall surface 259 defined on one of the adjacent plate-shaped fins 258 serves to define the micro channel 252, in cooperation with a second wall surface 260 defined on the other of the adjacent plate-shaped fins 258, between the adjacent plate-shaped fins 258. The first and second wall surfaces 259, 260 are opposed to each other. A thin rim saw, not shown, having a thickness equal to the groove width W of the micro channel 252, may be applied to the surface of the heat transfer plate 231 so as to form the micro channel 252, for example. The thin rim saw serves to engrave the surface of the heat transfer plate 231 so as to shape the plate-shaped fins 258 on the surface of the heat transfer plate 231. Alternatively, the plate-shaped fins 258 may be a thin plate of copper or aluminum, for example, fixed to the surface of the heat transfer plate 231.

First and second erosion surfaces may be provided on the first and second wall surfaces 259, 260, respectively. A fine asperity can be established on the first and second erosion surfaces. Such a fine asperity serves to achieve an enlarged heat transfer area over the plate-shaped fins 258 and an improved wetness to the refrigerant liquid. The vaporization of the refrigerant liquid can still further be accelerated. Erosive agent such as HF may be employed to form the first and second erosion surfaces on the first and second wall surfaces 259, 260, respectively.

Alternatively, heat conductive fine particles may be adhered to the first and second wall surfaces 259, 260, respectively, so as to achieved an improved wetness. The size of the particles may be set at the order of microns. The fine particles serve to achieve an enlarged heat transfer area over the plate-shaped fins 258 and an improved wetness to the refrigerant liquid in the aforementioned manner. The vaporization of the refrigerant liquid can thus be accelerated. The heat conductive fine particles may be made of any heat conductive material such as diamond, gold, silver, carbon fibers, and the like.

Figure 47:
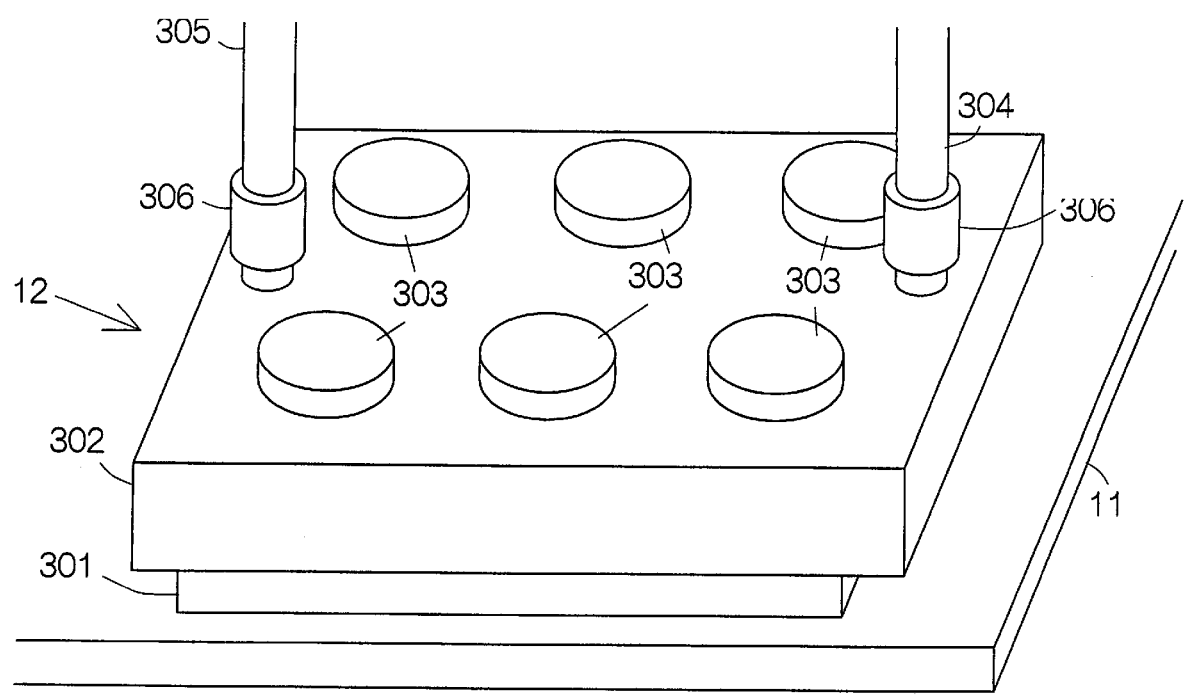
FIG. 47 is an enlarged perspective view illustrating the structure of a dry evaporator comprising a cooling element or piston.

The dry evaporator 22 employed in the aforementioned refrigeration systems 13, 201, 230 according to the first, second and third embodiments, may comprise a casing 302 attached to a small-sized printed circuit board 301 extending in the horizontal direction, and a cooling element or elements, namely, pistons 303 incorporated in the casing 302, as shown in FIG. 47, for example. The casing 302 is designed to receive the connection of a inlet duct 304 and an outlet duct 305 extending in a vertical direction, respectively. The inlet and outlet ducts 304, 305 are coupled to the casing 302 through couplers 306.

Figure 48:
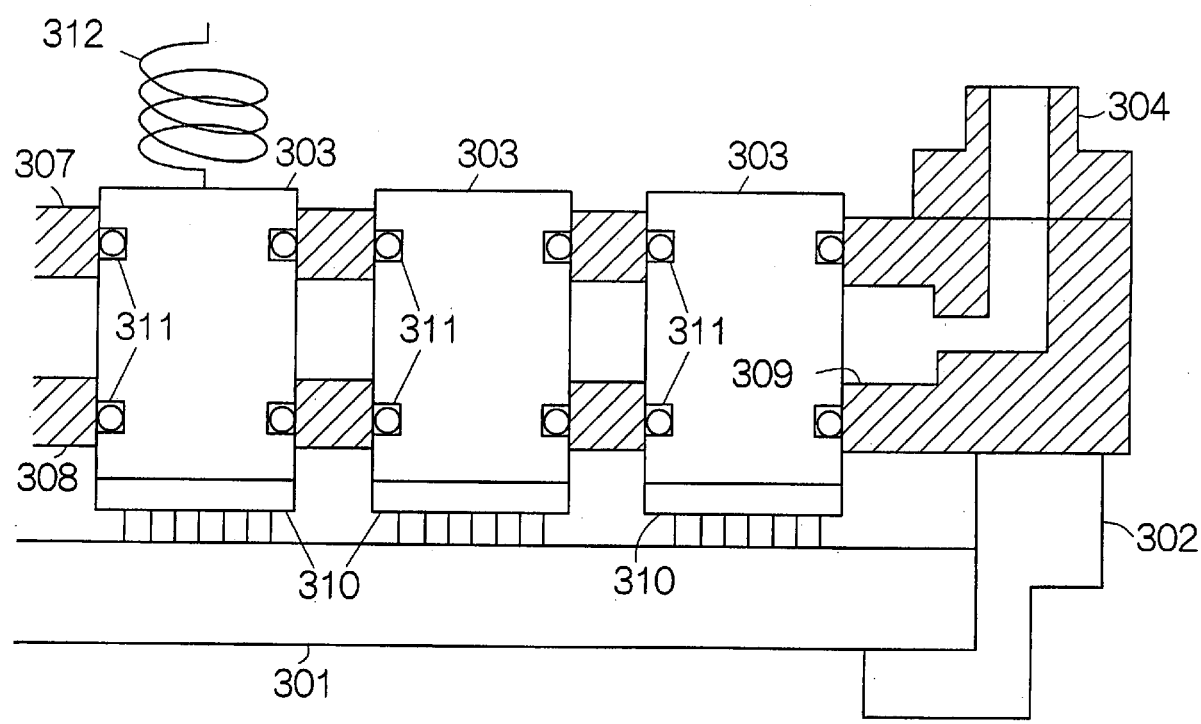
FIG. 48 is a sectional partial view of the dry evaporator for illustrating the structure of pistons.

As is apparent from FIG. 48, a refrigerant passage 309 is defined between a top plate 307 and a bottom plate 308 extending in parallel in the horizontal direction in the casing 302. A refrigerant is introduced into the refrigerant passage 309 through a refrigerant introduction passage defined in the inlet duct 304. After passing through the refrigerant passage 309, the refrigerant is allowed to flow out through a refrigerant discharge passage defined in the outlet duct 305. The pistons 303 are designed to extend across the refrigerant passage 309 by penetrating through the top and bottom plates 307, 308 of the casing 302, respectively. The piston 303 is allowed to protrude its tip end out of the casing 302 so as to contact a semiconductor element 310 at the tip end. The piston 303 may be made from a high heat conductive material such as a copper material.

Sealing members 311 are attached around the piston 303. The sealing members 311 are interposed between the top plate 307 and the piston 303 as well as between the bottom plate 308 and the piston 303. The sealing members 311 serve to prevent any leakage of the refrigerant through connections between the top plate 307 and the piston 303 as well as between the bottom plate 308 and the piston 303. A spring 312 may be added to the casing 302 so as to bias the piston 303 against the surface of the semiconductor element 310.

Heat generated at the semiconductor element 310 is efficiently transferred to the refrigerant through the pistons 303 in the dry evaporator 22. The semiconductor element 310 can efficiently be cooled down. If the casing 302 is made from a heat insulating material such as a synthetic resin, heat is solely transferred to the refrigerant through the pistons 303. A performance of cooling can further be improved in the dry evaporator 22.

Figure 49:
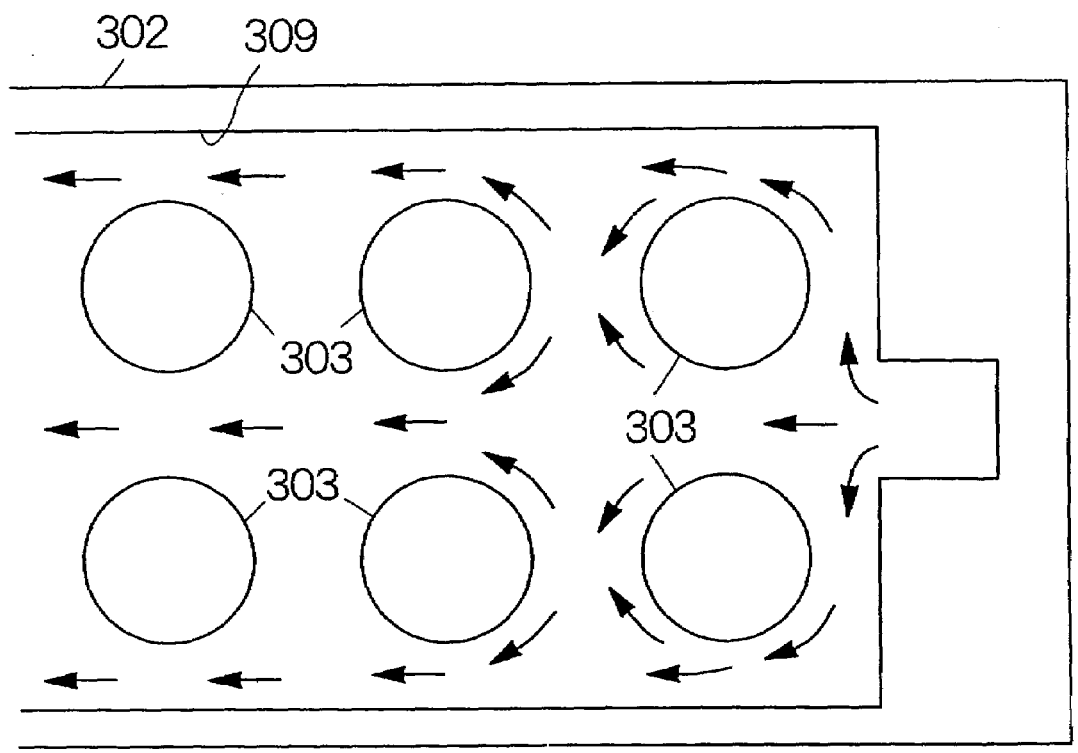
FIG. 49 is a plan view schematically illustrating the structure of a refrigerant passage within the casing.
Figure 50:
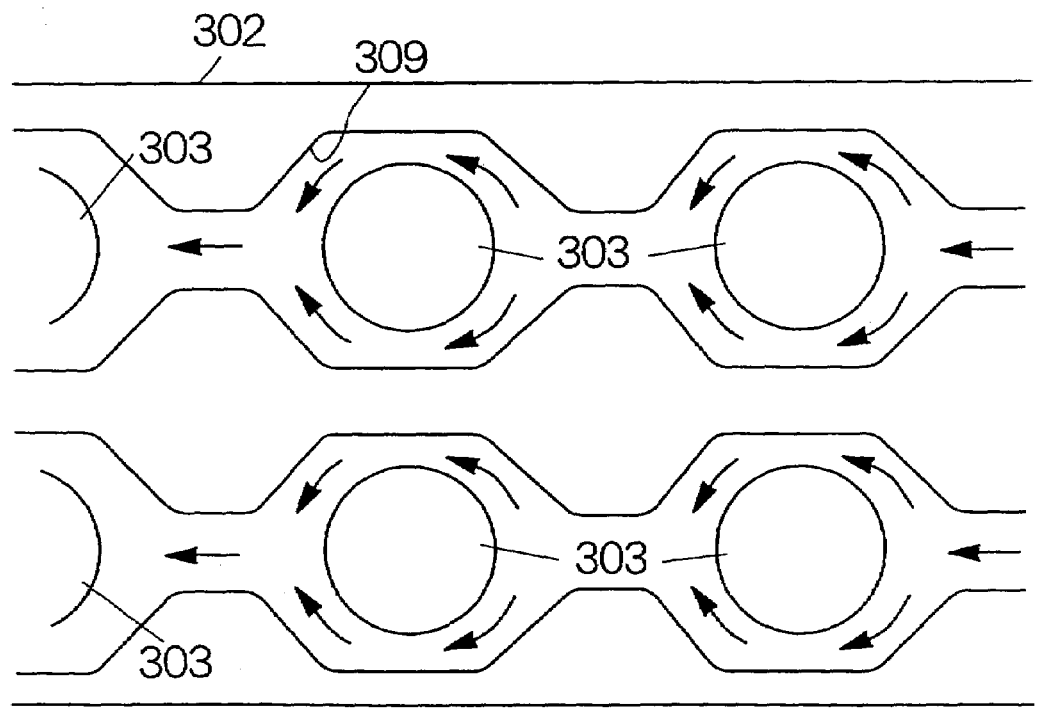
FIG. 50 is a plan view schematically illustrating the structure of a refrigerant passage according to another specific example.

As shown in FIG. 49, the refrigerant passage 309 may be defined, common to all of the pistons 303, in the casing 302, for example. Alternatively, the refrigerant passage 309 may be divided into rows corresponding to the respective rows of the pistons 303, as shown in FIG. 50.

Figure 51:
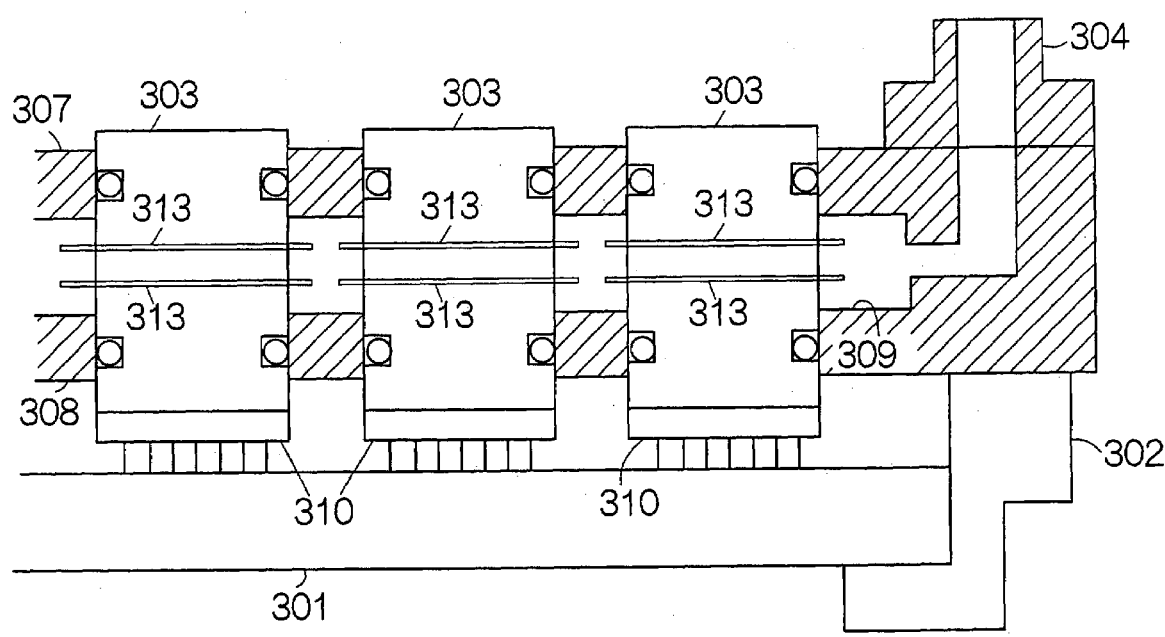
FIG. 51 is a sectional partial view of the dry evaporator for illustrating the structure of pistons according to another specific example.

As shown in FIG. 51, a single or plurality of fins 313 may be attached to the piston 303 so as to encircle the piston 303, for example. The fins 313 are designed to extend in the horizontal direction from the cylindrical periphery of the piston 303 within the refrigerant passage 309. The fins 313 serve to increase the heat transfer area between the refrigerant and the piston 303, so that heat of the semiconductor element 310 can still efficiently be transferred to the refrigerant through the piston 303 and the fins 313. The fins 313 may be integral to the piston 303.

Figure 52:
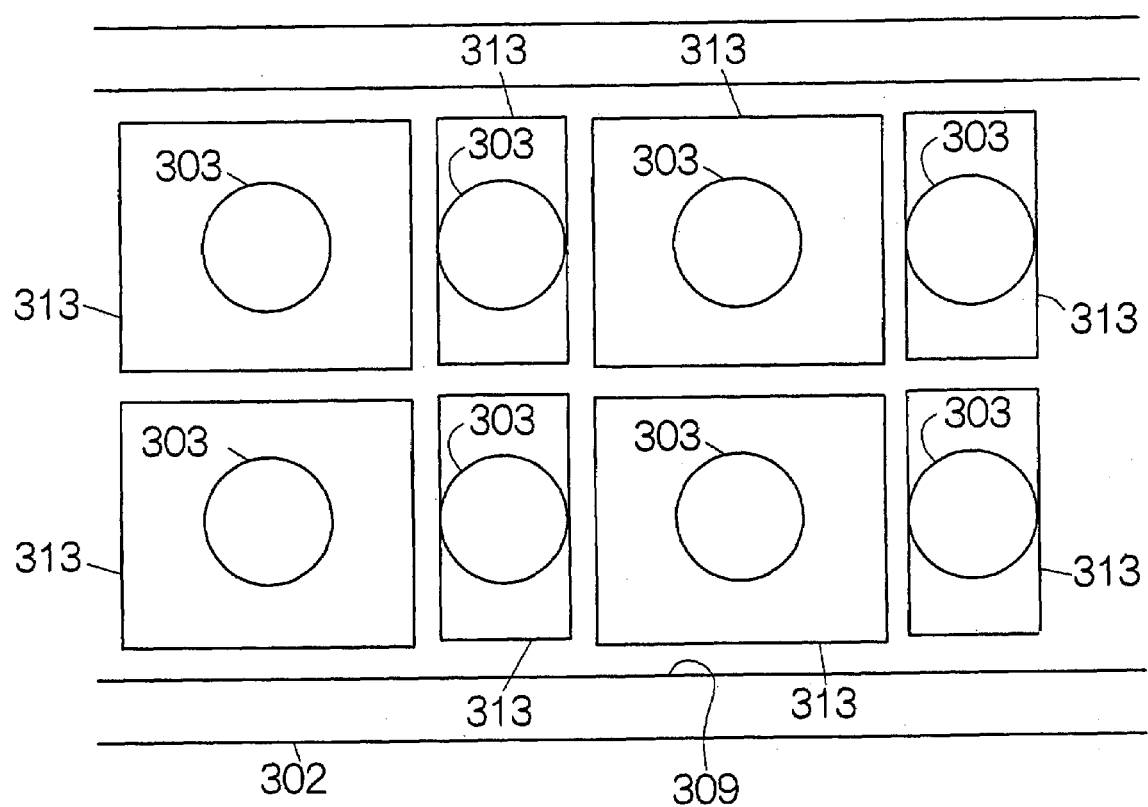
FIG. 52 is a plan view of the dry evaporator for illustrating the structure of fins attached to the pistons.

Furthermore, the size or extension of the individual fin 313 can be adjusted in the dry evaporator 22 based on the quantity of heat generated at the corresponding semiconductor element 310, as shown in FIG. 52, for example. As conventionally known, enlargement of the fin 313 realizes an increase in the heat transfer area between the piston 303 and the refrigerant, so that a larger quantity of heat can be transferred from the piston 303 to the refrigerant. The fin 313 of the size following variation in the quantity of heat contributes to uniformity in temperature of the semiconductor elements 310. In other words, even if variation is found in the quantity of heat generated at the respective semiconductor elements 310, all of the semiconductor elements 310 can efficiently be cooled down over the entire area of the single small-sized printed circuit board 301. It should be noted that the heat transfer area or surface area of the fin 313 for a single piston 303 can be controlled not only by the size of the fin 313 in this manner but also by the number of the fins 313 attached to the piston 303.

Figure 53:
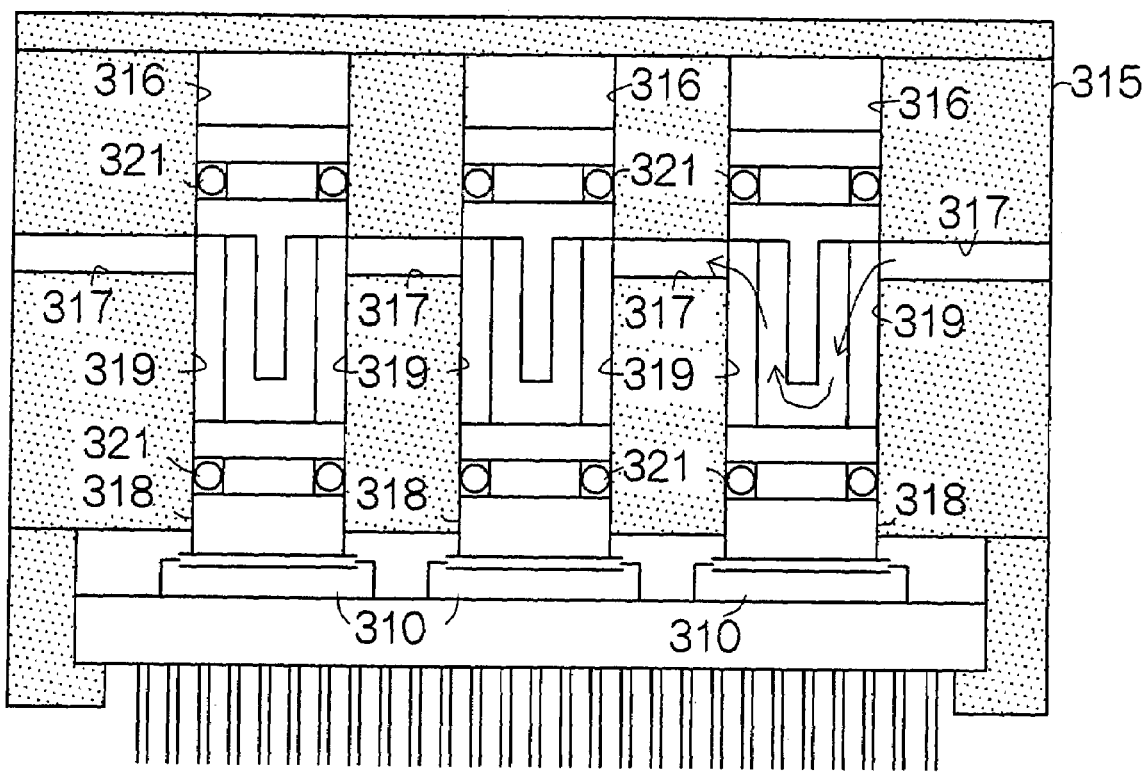
FIG. 53 is a sectional view of the dry evaporator for schematically illustrating pistons incorporated within a block member.

Furthermore, the dry evaporator 22 may comprise a block member 315 attached to the small-sized printed circuit board 301 extending in the horizontal direction, as shown in FIG. 53, for example. The block member 315 is provided with columnar through bores 316 extending in a vertical direction, and through hole path 317 extending in the horizontal direction so as to cross the columnar through bores 316. The columnar through bores 316 are formed to correspond to the respective semiconductor elements 310 on the small-sized printed circuit board 301. The columnar through bores 316 and the through hole path 317 may be machined with a drill in a facilitated manner. The block member 315 functions as a casing defining a refrigerant passage inside.

A cooling element or piston 318 is inserted into the individual columnar through bore 316. The piston 318 is designed to protrude its tip end out of the block member 315. The tip end of the piston 318 is allowed to contact the surface of the semiconductor element 310. The piston 318 may be made from a high heat conductive material such as a copper material.

A refrigerant passage 319 is defined between the outer cylindrical periphery of the piston 318 and the inner surface of the columnar through bore 316 so as to lead the refrigerant along the outer periphery of the piston 318. The refrigerant passage 319 is designed to connect a pair of the through hole paths 317, opened at opposite inner surfaces of the columnar through bore 316, to each other.

Upper and lower sealing members or O-rings 321 is fitted on the outer cylindrical periphery of the piston 318. The upper and lower O-rings 321 are designed to define boundaries of the refrigerant passage 319. The refrigerant flowing along the outer periphery of the piston 318 can be prevented from leaking out of the refrigerant passage 319.

Figure 54:
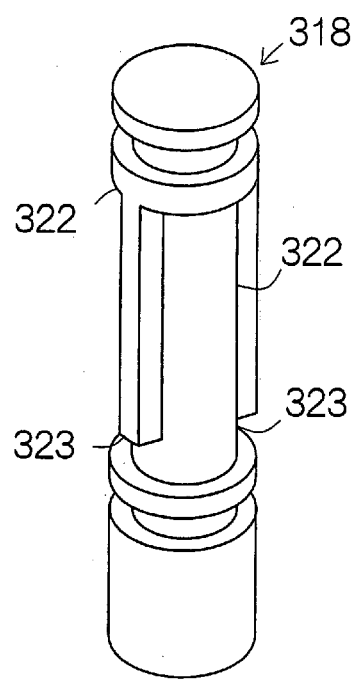
FIG. 54 is an enlarged perspective view schematically illustrating the structure of the piston.

As is apparent from FIG. 54, a pair of guide grooves 322 are defined on the outer periphery of the piston 318 so as to extend in a vertical direction along the meridian of the piston 318. Connecting grooves 323 are also defined on the outer periphery of the piston 318 so as to connect the lower ends of the guide grooves 322 to each other. When the piston 318 is received in the columnar through bore 316, the guide grooves 322 and the connecting grooves 323 serve to define the aforementioned refrigerant passage 319 in cooperation with the inner surface of the columnar through bore 316.

Figure 55:
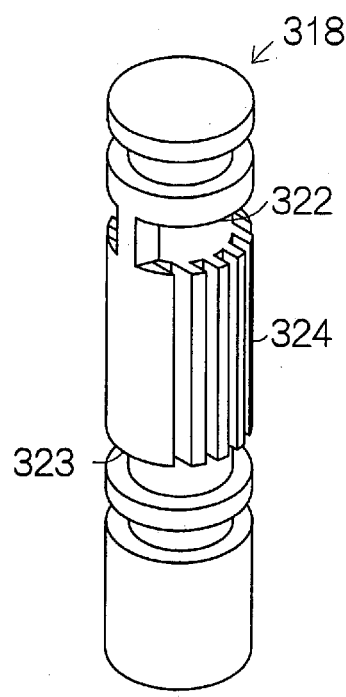
FIG. 55 is an enlarged perspective view schematically illustrating the structure of a piston according to a modification of the example shown in FIG. 54.

Referring again to FIG. 53, when the refrigerant is introduced into the through hole path 317, the refrigerant is allowed to flow into the upstream guide groove 322 and to fall along the outer periphery of the piston 318. The refrigerant then flows through the connecting groove 323 into the downstream guide groove 322. This time, the refrigerant is allowed to ascend along the outer periphery of the piston 318 in the downstream guide groove 322. Thereafter, the refrigerant is introduced into the next through hole path 317. The flow of the refrigerant along the outer periphery of the piston 318 serves to realize a higher performance of cooling the piston 318. In addition, a plurality of fins 324 may be formed within the guide groove 322 so as to extend in parallel with each other in a vertical direction along the meridian, respectively, as shown in FIG. 55, for example. The fins 324 contributes to a further enlargement of the heat transfer area between the piston 318 and the refrigerant, so that a still higher performance of cooling can be established for the piston 318.

Figure 56:
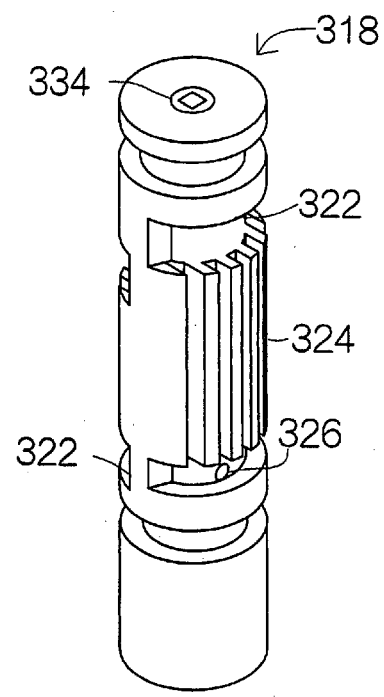
FIG. 56 is an enlarged perspective view schematically illustrating the structure of a piston according to another specific example.
Figure 57:
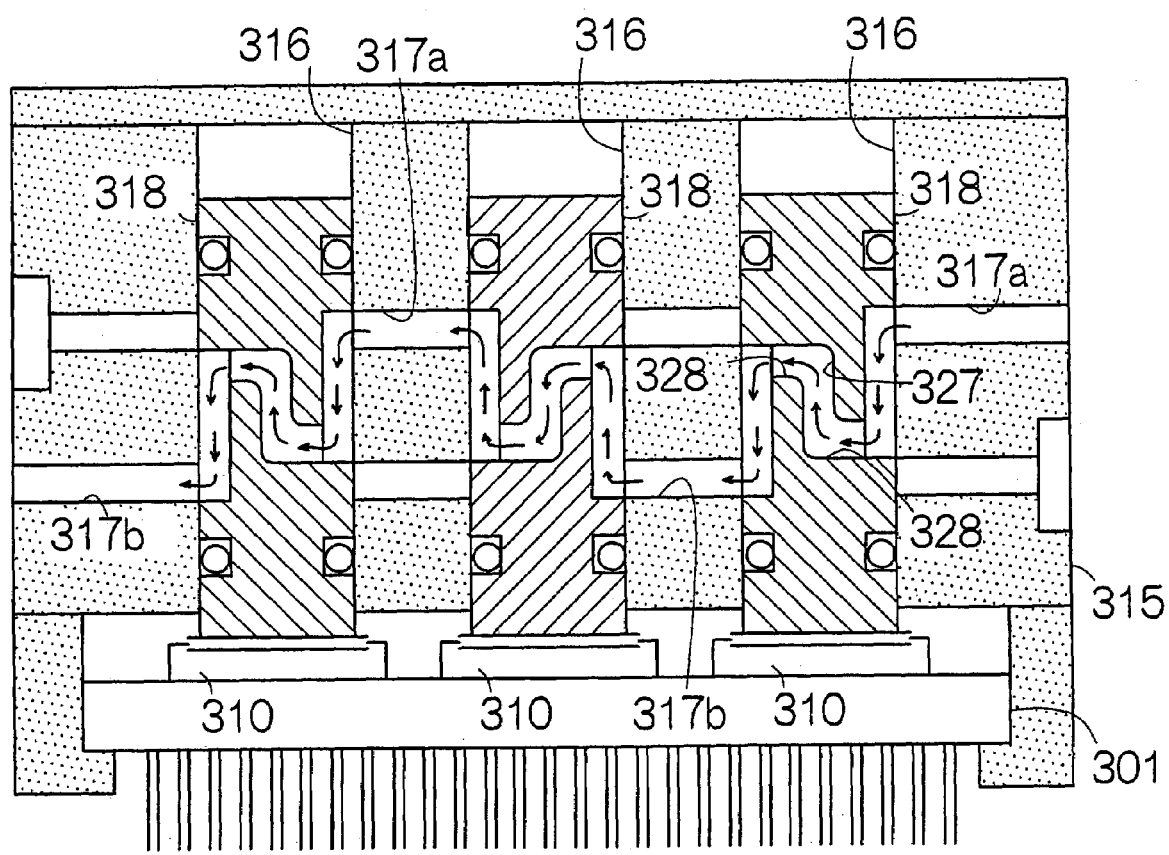
FIG. 57 is a sectional view of the dry evaporator for schematically illustrating structure of a connecting hole formed in the piston.

As shown in FIG. 56, a connecting hole 326 may be formed in the piston 318 so as to connect a pair of guide grooves 322 to each other, in place of the connecting groove 323, for example. The connecting hole 326 may include a central bore 327 extending in the axial direction of the piston 318 along the central axis of the piston 318, and a pair of radial bores 328 extending in a radial direction from the central bore 327 so as to open at the corresponding guide grooves 322, respectively, as is apparent from FIG. 57.

It is preferable that the radial bores 328 are located at a distance as much as possible on the piston 318. A larger distance between the radial bores 328 contributes to an increase in the heat transfer area between the inner surface of the central bore 327 and the refrigerant. Accordingly, a still higher performance of cooling can be achieved at the piston 318. In this case, the upper and lower through hole paths 317a, 317b may be defined in the block member 315 so as to cross the columnar through bore 316, as is apparent from FIG. 56. The refrigerant is allowed to alternately flow through the upper and lower through hole paths 317a, 317b between the adjacent pistons 318 in the entire block member 315.

Figure 58A:
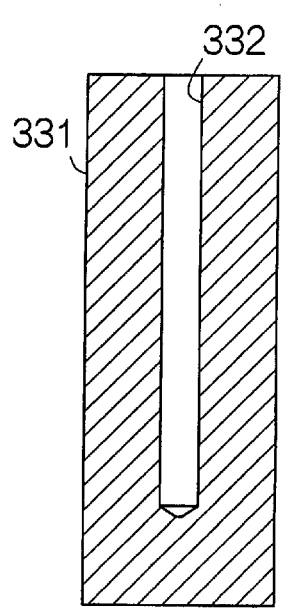
FIGS. 58A to 58C are sectional views of the piston for schematically illustrating process of forming the connecting hole.
Figure 58B:
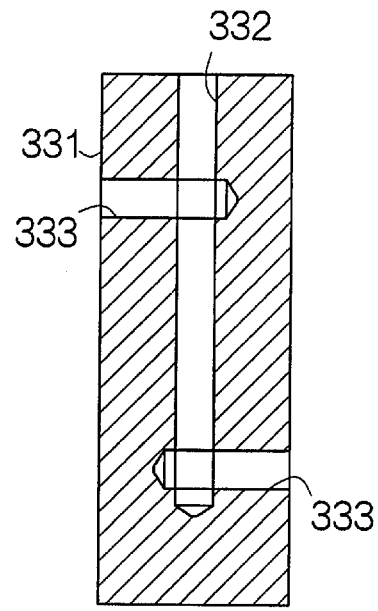
Figure 58C:
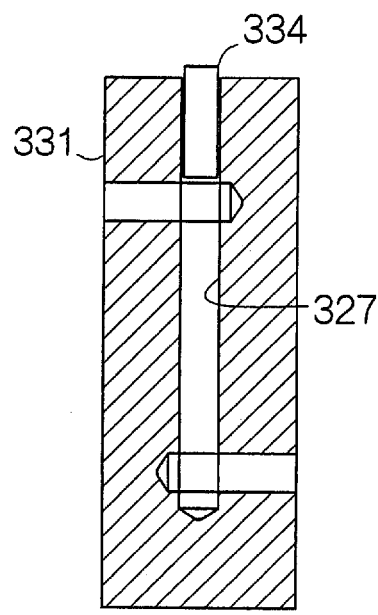

The connecting bore 326 may be formed with a simple machining utilizing a drill, for example. First of all, a first raw bore 332 is drilled in a piston material 331 from its end surface along the central axis of the piston material 331, as shown in FIG. 58A. Second raw bores 333 are then drilled in the piston material 331 from the outer cylindrical surface along the radial direction, as shown in FIG. 58B. Finally, a plug 334 is inserted into the first raw bore 332 at the end surface of the piston material 331, as shown in FIG. 58C. The central bore 327 is thus defined in the first raw bore 332.

Figure 59:
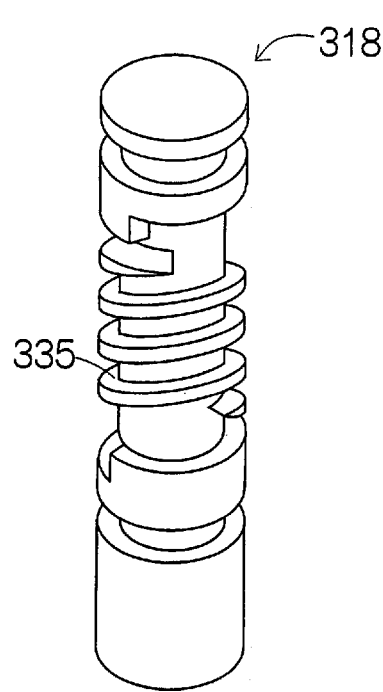
FIG. 59 is an enlarged perspective view schematically illustrating the structure of a piston according to a further specific example.
Figure 60:
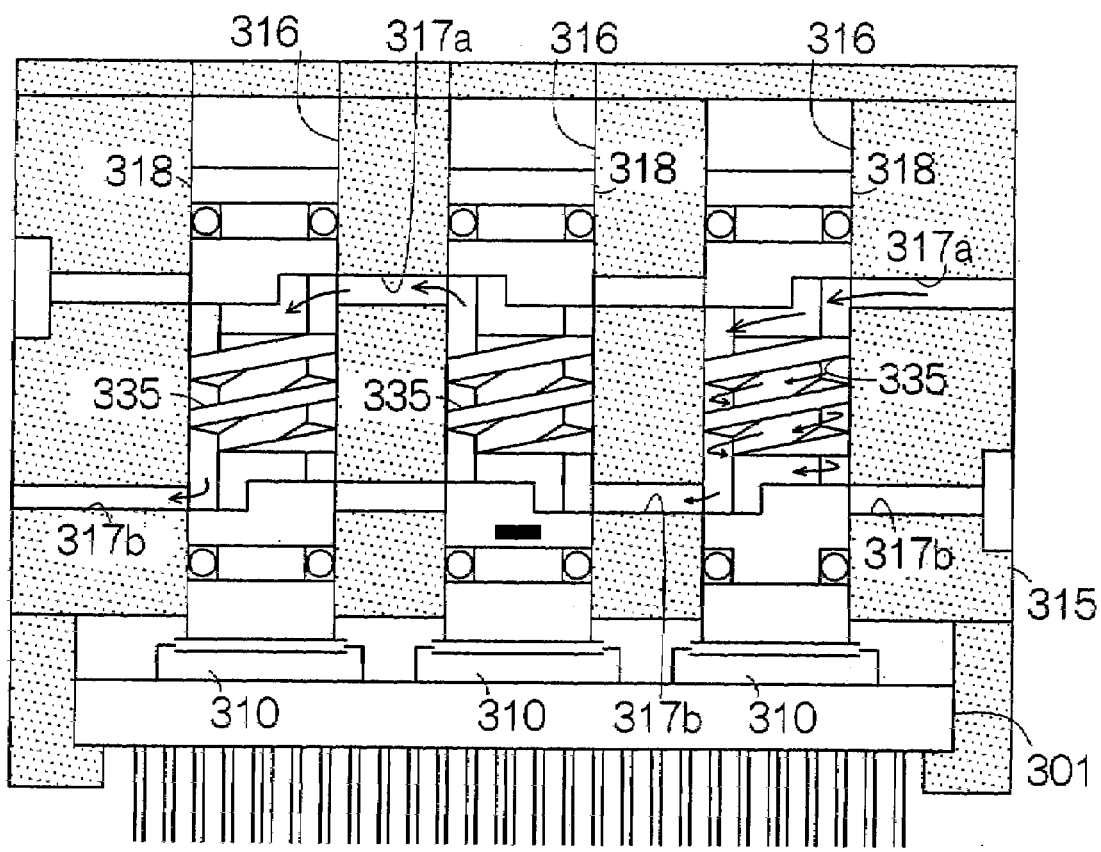
FIG. 60 is a sectional view of the dry evaporator for schematically illustrating the flow of the refrigerant.

As shown in FIG. 59, a helical guide groove 335 may be defined on the outer cylindrical surface of the piston 318, in place of the aforementioned guide groove 322, for example. When the piston 318 of this type is received in the columnar through bore 316, as shown in FIG. 60, the refrigerant passage 319 can be defined between the guide groove 335 and the inner surface of the columnar through bore 316. The refrigerant introduced into the through hole path 317a is allowed to flow downward along the guide groove 335 tracing the helical path. It is thus possible to increase the heat transfer area between the piston 318 and the refrigerant. A higher performance of cooling can be accomplished for the piston 318. The refrigerant is allowed to flow out into the through hole path 317b. The next piston 318 allows the refrigerant to flow upward along the guide groove 335 tracing the helical path. Likewise, a higher performance of cooling can also be accomplished for the next piston 318. The refrigerant is allowed to reach the through hole path 317a.

Figure 61:
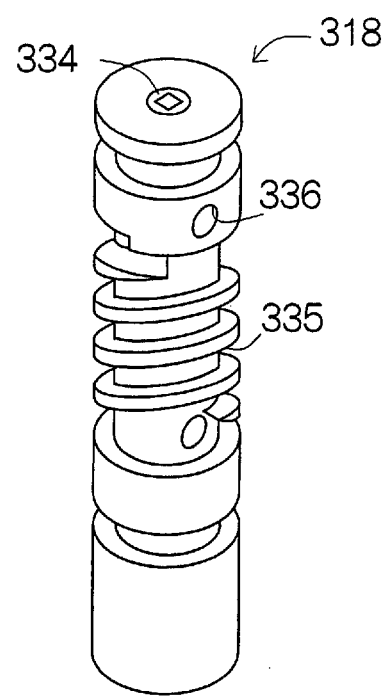
FIG. 61 is an enlarged perspective view schematically illustrating the structure of a piston according to a still further specific example.
Figure 62:
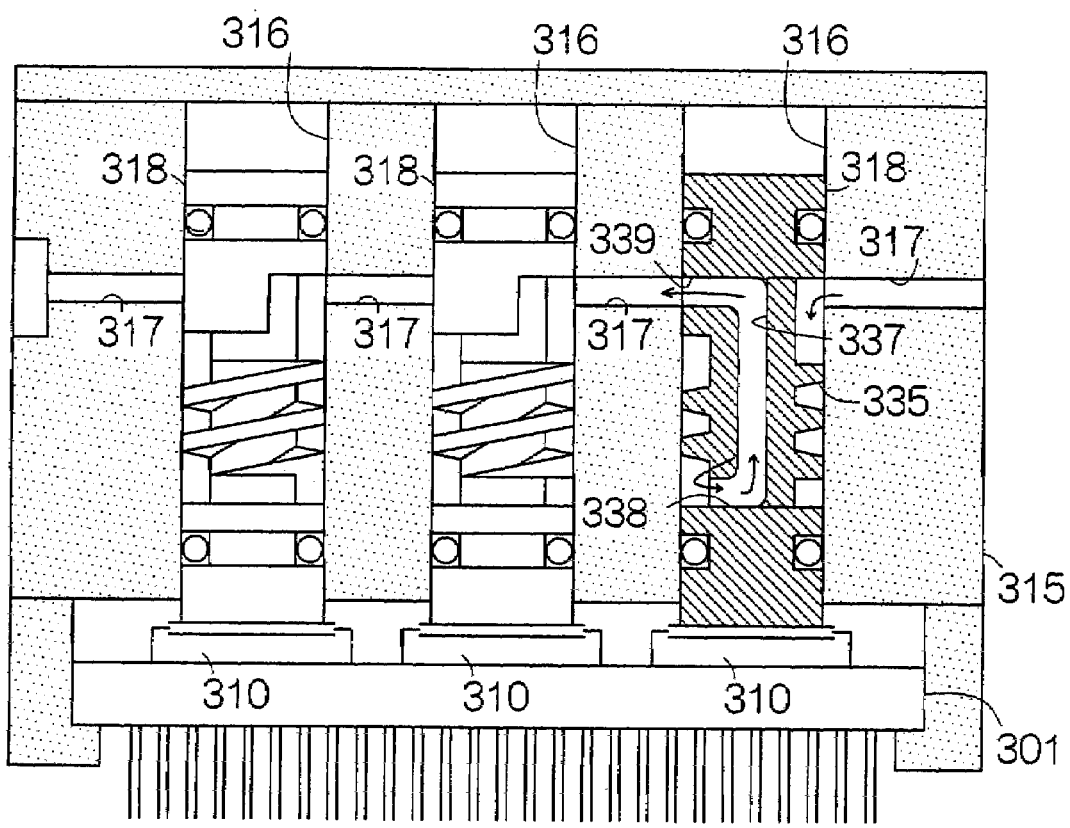
FIG. 62 is a sectional view of the dry evaporator for schematically illustrating the flow of the refrigerant.

Furthermore, a connecting hole 336 may also be formed in the piston 318, in addition to the aforementioned guide groove 335, as shown in FIG. 61. The connecting hole 336 is designed to include, as shown in FIG. 62, a central bore 337 extending in the axial direction of the piston 318 along the central axis of the piston 318, and a first radial bore 338 extending in a radial direction from the central bore 337 so as to open at the end of the guide groove 335, as well as a second radial bore 339 likewise extending in a radial direction from the central bore 337 so as to open at the outer cylindrical surface of the piston 318. The central bore 337 and the first and second radial bores 338, 339 may be formed in the same manner as the aforementioned central bore 327 and radial bores 328.

As is apparent from FIG. 62, the connecting hole 336 allows the refrigerant to flow downward along the guide groove 335 tracing the helical path so as to finally reach the through hole path 317. Accordingly, even when the guide groove 335 of the helical path is employed in the aforementioned manner, it is not necessary to form a pair of the upper and lower through hole paths 317a, 317b in the block member 315 between the adjacent pistons 318.

Figure 63:
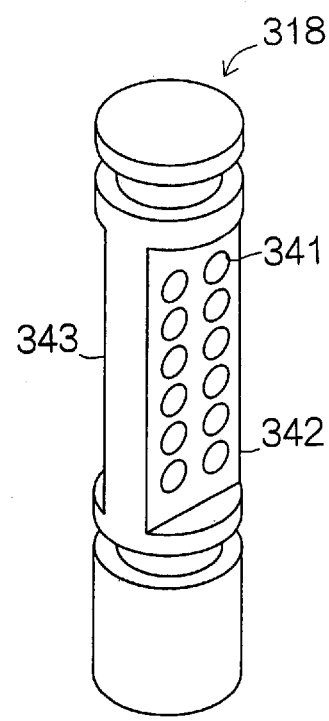
FIG. 63 is an enlarged perspective view schematically illustrating the structure of a piston according to a still further specific example.

Furthermore, a plurality of through hole paths 341 may be formed in the piston 318 so as to accept the flow of the refrigerant, as shown in FIG. 63. The through hole paths 341 serves to increase the heat transfer area between the piston 318 and the refrigerant. Heat of the piston 318 can be transferred to the refrigerant in an efficient manner.

Figure 64:
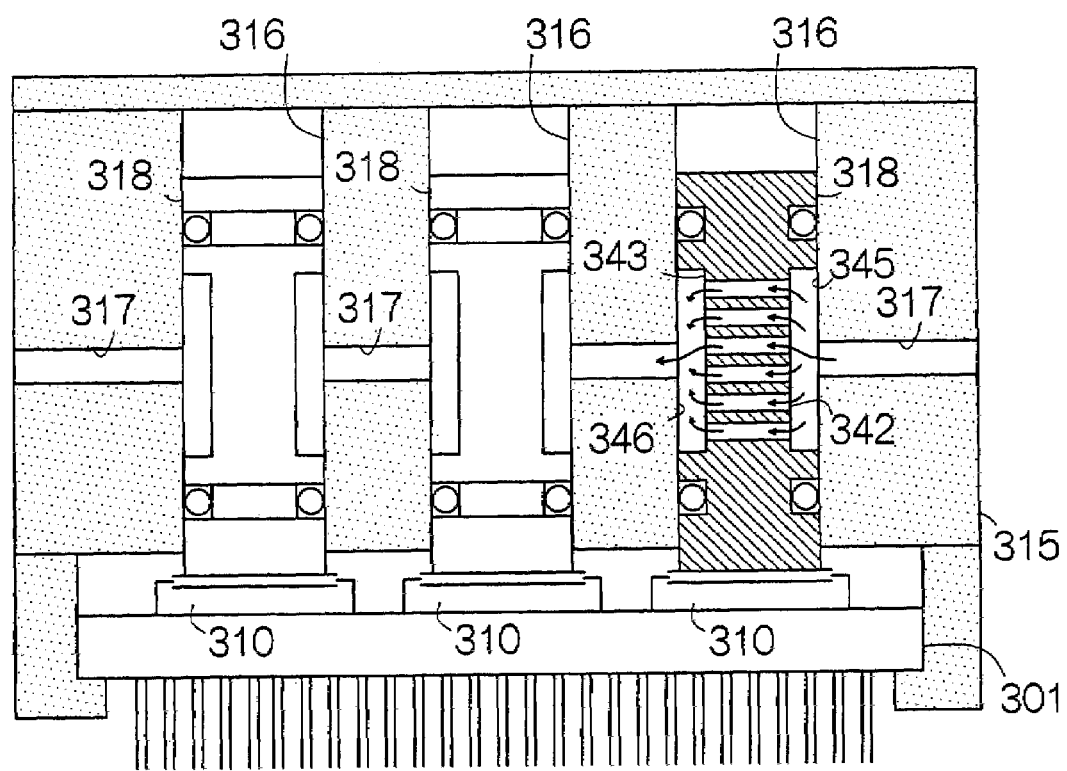
FIG. 64 is a sectional view of the dry evaporator for schematically illustrating the flow of the refrigerant.

Moreover, the opposite ends of the individual through hole path 341 is designed to open at first and second flat surfaces 342, 343 formed within a plane including a pair of meridians on the outer cylindrical surface of the piston 318. When the piston 318 is received in the columnar through bore 316, a refrigerant introduction chamber 345 can be defined between the first flat surface 342 and the inner surface of the columnar through bore 316, as shown in FIG. 64. Likewise, a refrigerant discharge chamber 346 can be defined between the second flat surface 343 and the inner surface of the columnar through bore 316. The refrigerant introduction and discharge chambers 345, 346 serve to uniformly distribute the refrigerant into the respective through hole paths 341.

Figure 65:
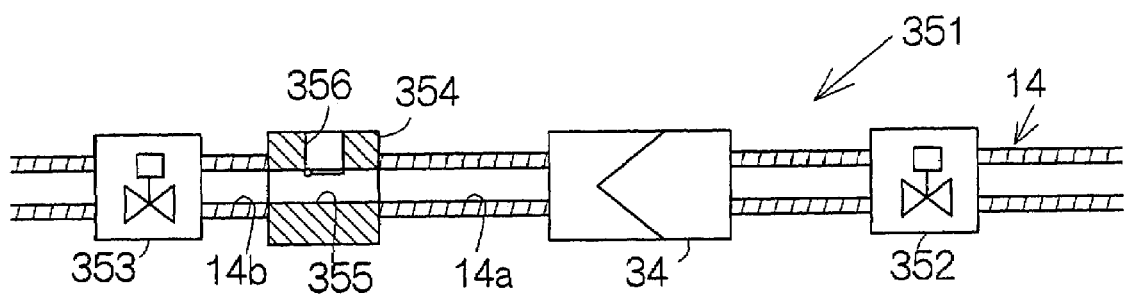
FIG. 65 is a block diagram schematically illustrating the structure of an air-purge mechanism.
Figure 66:
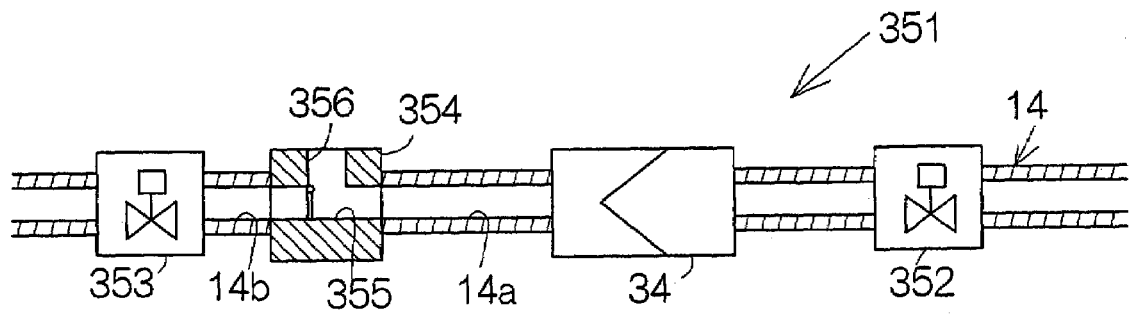
FIG. 66 is a block diagram schematically illustrating the structure of the air-purge mechanism set in the activation mode.

When the circulation channel 14 can be divided into sections with the assistance of the couplers 34 in the aforementioned manner, an air-purge mechanism 351 is preferably incorporated in the circulation channel 14, as shown in FIG. 65, for example. The air-purge mechanism 351 may include first and second shut-off valves 352, 353 incorporated in the circulation channel 14 upstream and downstream of the coupler 34, respectively, and a bidirectional switching valve 354 incorporated in the circulation channel 14 between the coupler 34 and the second shut-off valve 353. The bidirectional switching valve 354 is provided with a straight path 355 connecting the upstream circulation channel 14a and the downstream circulation channel 14b to each other, and an open path 356 bifurcated from the straight path 355. The open path 356 is designed to connect the straight path 355 to the open air. When the bidirectional switching valve 354 is set in a normal mode, the open path 356 is shut off from the straight path 355, as shown in FIG. 65. The straight path 355 connects the upstream and downstream circulation channels 14a, 14b to each other. On the other hand, when the bidirectional switching valve 354 is changed over to an activation mode, the upstream and downstream circulation channels 14a, 14b are shut off from each other, as shown in FIG. 66. The upstream circulation channel 14a is connected to the open path 356.

During the operation of the refrigeration system 13, the bidirectional switching valve 354 is set in the normal mode. Simultaneously, the first and second shut-off valves 352, 353 are kept open. The refrigerant is allowed to circulate in the overall circulation channel 14 in response to the action of the compressor 14.

When the connection of the couplers 34 are to be released, the bidirectional switching valve 354 is still kept in the normal mode. No air can be introduced into the circulation channel 14 through the open path 356. As long as the self-sealing mechanism is active for the couplers 34, no air can be introduced into the circulation channel 14. The first and second shut-off valves 352, 353 may be kept open or closed.

When the couplers 34 are to be connected, the first and second shut-off valves 352, 353 must be closed. After the couplers 34 have been connected to each other, the bidirectional switching valve 354 is changed over to the activation mode. The upstream circulation channel 14a is opened to the open air. Simultaneously, the first shut-off valve 352 is opened. In this situation, when the compressor 15 operates, air remaining in the upstream circulation channel 14a can be purged out of the open path 356 into the open air in response to the pressure applied to the refrigerant. After the air has completely been purged out, the bidirectional switching valve 354 is changed over to the normal mode. Consequently, the circulation channel 14 is shut out from the open air.

Thereafter, the second shut-off valve 353 is opened. The overall closed circulation channel 14 can thus be established. The purge of the air out of the circulation channel 14 in this manner reliably prevents introduction of air even when the connection and disconnection of the couplers 34 are repeated. No deficiency due to introduction of air is induced in the refrigeration system 13. As conventionally known, introduction of air into the circulation channel 14 causes trouble or failure in the refrigeration system 13.

It is preferable that the bidirectional switching valve 354 and the second shut-off valve 353 are combined or unified in the aforementioned air-purge mechanism 351. If a single mechanism can be established to achieve the functions of the bidirectional switching valve 354 and the second shut-off valve 353, a section of the circulation channel 14 can be omitted between the bidirectional switching valve 354 and the second shut-off valve 353, so that introduction of air into the circulation channel 14 can still reliably be prevented.

Figure 67:
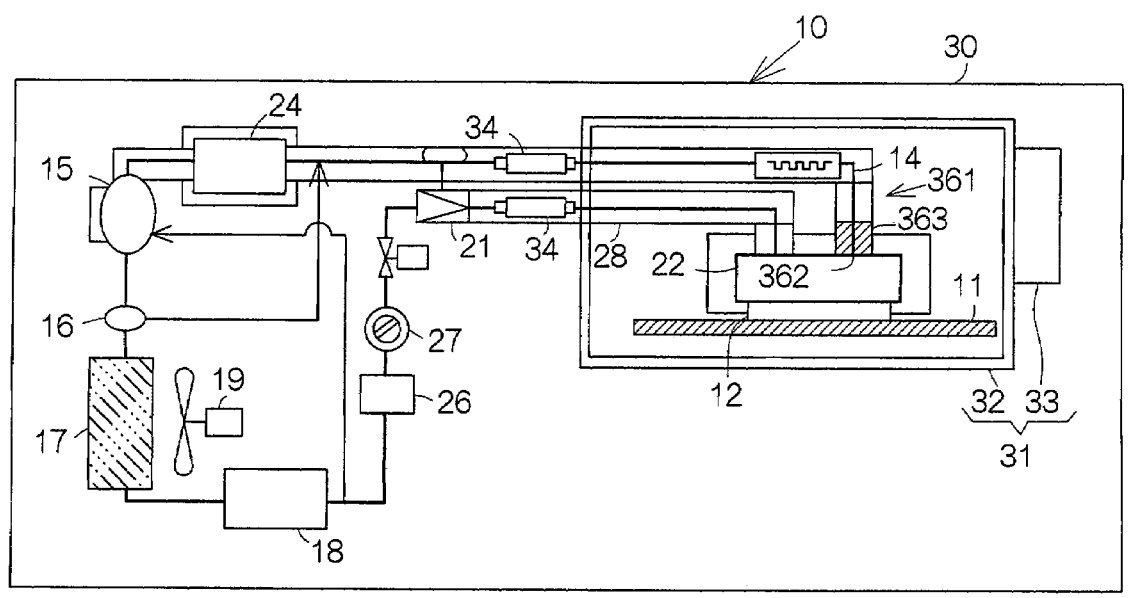
FIG. 67 schematically illustrates the structure of a refrigeration system of a closed cycle according to a fourth embodiment of the present invention.

FIG. 67 schematically illustrates the structure of a refrigeration system of a closed cycle according to a fourth embodiment of the present invention. The refrigeration system 361 further includes a gas-liquid separation filter 363 incorporated in a refrigerant outlet 362 of the dry evaporator 22 so as to maintain the quality of the refrigerant at level smaller than 1.0, specifically, approximately 0.85 within the dry evaporator 22. The gas-liquid separation filter 363 is designed to allow only the refrigerant of gas state, namely, the refrigerant gas to flow downstream. Accordingly, even when the refrigerant liquid is not completely evaporated in the dry evaporator 22, the compressor 15 can reliably be prevented from a compression of a liquid without increasing a load to a gas-liquid separator such as the accumulator 24. Moreover, the gas-liquid separation filter 363 enables omission of the aforementioned subsidiary evaporator 23. However, the gas-liquid separation filter 363 may be employed in combination with the aforementioned subsidiary evaporator 23 in the refrigeration systems. In this description of the fourth embodiment, the like reference numerals are attached to structures achieving function or effect identical to those of the aforementioned first embodiments. Duplicate description may be omitted.

What is claimed is:

1. A dry evaporator for a refrigeration system, comprising:
   a casing defining a closed space between a top plate and a bottom plate and contacting a target heating object at the bottom plate;
   an intermediate plate disposed between the top and bottom plates within the closed space;
   a vaporization chamber defined between the intermediate and bottom plates;
   a refrigerant inlet defined in the top plate;
   an introduction chamber defined between the top and intermediate plates and extending from the refrigerant inlet toward the vaporization chamber;
   a dike extending along an edge of the intermediate plate between the vaporization chamber and the introduction chamber, the dike swelling from a surface of the intermediate plate toward the top plate; and
   a discharge chamber defined between the top and intermediate plates and extending from the vaporization chamber toward the refrigerant outlet.

2. The dry evaporator for a refrigeration system according to claim 1, wherein a space between the top and intermediate plates is set smaller than a space between the bottom and intermediate plates.

3. The dry evaporator for a refrigeration system according to claim 2, further comprising:
an introduction opening defined by an edge of the intermediate plate and designed to connect the introduction and vaporization chambers to each other.

4. The dry evaporator for a refrigeration system according to claim 1 or 2, wherein the introduction chamber is designed to by degree expand as it gets closer to the vaporization chamber.

5. The dry evaporator for a refrigeration system according to claim 4, wherein the discharge chamber is designed to by degree narrow as it gets closer to the refrigerant outlet.

6. The dry evaporator for a refrigeration system according to claim 1 or 2, wherein a plurality of refrigerant passages are defined within the introduction chamber so as to respectively extend from the refrigerant inlet toward the vaporization chamber.

7. The dry evaporator for a refrigeration system according to claim 6, an expanded passage is connected to a downstream end of the refrigerant passage.

8. The dry evaporator for a refrigeration system according to claim 1, further comprising:
an introduction opening defined between the introduction chamber and the vaporization chamber:
a discharge opening defined between the discharge chamber and the vaporization chamber; and
a group of fins protruding from an inner surface of the vaporization chamber so as to define a plurality of refrigerant passages extending in parallel from the introduction opening toward the discharge opening.

* * * * *